(12) United States Patent
Song et al.

(10) Patent No.: US 12,471,332 B2
(45) Date of Patent: Nov. 11, 2025

(54) SEMICONDUCTOR DEVICE

(71) Applicant: Samsung Electronics Co., Ltd., Suwon-si (KR)

(72) Inventors: Seung Min Song, Suwon-si (KR); Nam Hyun Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 502 days.

(21) Appl. No.: 18/091,603

(22) Filed: Dec. 30, 2022

(65) Prior Publication Data

US 2023/0378264 A1 Nov. 23, 2023

(30) Foreign Application Priority Data

May 17, 2022 (KR) .................. 10-2022-0060196

(51) Int. Cl.
*H01L 29/06* (2006.01)
*H01L 29/423* (2006.01)
*H01L 29/786* (2006.01)
*H10D 30/67* (2025.01)
*H10D 62/10* (2025.01)

(52) U.S. Cl.
CPC ....... *H10D 62/121* (2025.01); *H10D 30/6735* (2025.01); *H10D 30/6757* (2025.01)

(58) Field of Classification Search
CPC ............. H10D 62/121; H10D 30/6735; H10D 30/6757; H10D 30/014; H10D 64/017; H10D 64/015; H10D 64/256; H10D 84/0128; H10D 84/0151; H10D 84/038; H10D 84/83; H10D 88/00; H10D 88/01; B82Y 10/00

USPC .......................................................... 257/288
See application file for complete search history.

(56) References Cited

U.S. PATENT DOCUMENTS

| 10,685,887 | B2 | 6/2020 | Smith et al. |
| 10,714,391 | B2 | 7/2020 | Smith et al. |
| 11,164,792 | B2 | 11/2021 | Xie et al. |
| 2020/0006340 | A1 | 1/2020 | Lilak et al. |
| 2020/0098756 | A1* | 3/2020 | Lilak ...................... H10D 62/83 |
| 2020/0219979 | A1 | 7/2020 | Rachmady et al. |
| 2020/0273757 | A1 | 8/2020 | Ng et al. |
| 2021/0125986 | A1 | 4/2021 | Vellianitis |
| 2021/0210349 | A1* | 7/2021 | Xie ...................... H10D 84/0151 |

(Continued)

*Primary Examiner* — Tong-Ho Kim
(74) *Attorney, Agent, or Firm* — Muir Patent Law, PLLC

(57) ABSTRACT

A semiconductor device includes a substrate extending a first direction and a second direction perpendicular to the first direction, an active pattern that protrudes from the substrate in a third direction perpendicular to the first direction and the second direction, a first plurality of lower nanosheets, a second plurality of lower nanosheets stacked spaced apart from the first plurality of lower nanosheets in the first direction, a first plurality of upper nanosheets spaced apart from the first plurality of lower nanosheets in the third direction, and a second plurality of upper nanosheets spaced apart from the second plurality of lower nanosheets in the third direction. A first upper gate electrode surrounding the first plurality of upper nanosheets. A second upper gate electrode surrounding the second plurality of upper nanosheets. A width of the first plurality of upper nanosheets is different from a width of the second plurality of upper nanosheets.

20 Claims, 47 Drawing Sheets

(56) References Cited

U.S. PATENT DOCUMENTS

2021/0408285 A1 12/2021 Hickey et al.
2022/0013521 A1 1/2022 Zhang et al.

\* cited by examiner

SEMICONDUCTOR DEVICE

CROSS-REFERENCE TO RELATED APPLICATION

This application claims priority under 35 USC § 119 to Korean Patent Application No. 10-2022-0060196 filed on May 17, 2022 in the Korean Intellectual Property Office, the contents of which in its entirety are herein incorporated by reference.

BACKGROUND

1. Technical Field

The present disclosure relates to a semiconductor device, and more particularly, to a semiconductor device including a multi-bridge channel field effect transistor (MBCFET™).

2. Description of the Related Art

Scaling techniques have been proposed for increasing the density of integrated circuit devices. One technique involves the use of a multi-gate transistor. Such a transistor may include a fin or nanowire-shaped silicon body on a substrate. A gate is then formed on a surface of the silicon body.

Because a multi-gate transistor uses a three-dimensional (3D) channel, scaling may be achieved. In addition, current controlling capability can be improved without increasing a gate length of the multi-gate transistor. Further, a short channel effect (SCE), in which an electric potential of a channel region is affected by a drain voltage, can be effectively suppressed.

SUMMARY

Aspects of the present disclosure provide a semiconductor device in which a plurality of upper nanosheets are stacked on a plurality of lower nanosheets and widths between the plurality of lower nanosheets adjacent in a horizontal direction or widths between the plurality of upper nanosheets adjacent in the horizontal direction are different from each other so that integration is improved.

According to some embodiments of the present disclosure, there is provided a semiconductor device, comprising a substrate extending a first direction and a second direction perpendicular to the first direction, an active pattern extending in the first direction on the substrate, the active pattern protrudes from the substrate in a third direction perpendicular to the first direction and the second direction, a first plurality of lower nanosheets stacked apart from each other in the third direction on the active pattern, a second plurality of lower nanosheets stacked apart from each other in the third direction on the active pattern, the second plurality of lower nanosheets are spaced apart from the first plurality of lower nanosheets in the first direction, a first plurality of upper nanosheets stacked apart from each other in the third direction on the first plurality of lower nanosheets, the first plurality of upper nanosheets are spaced apart from the first plurality of lower nanosheets in the third direction, a second plurality of upper nanosheets stacked apart from each other in the third direction on the second plurality of lower nanosheets, the second plurality of upper nanosheets are spaced apart from the second plurality of lower nanosheets in the third direction, a first upper gate electrode extending in the second direction on the active pattern, the first upper gate electrode surrounds the first plurality of upper nanosheets, and a second upper gate electrode extending in the second direction on the active pattern, the second upper gate electrode is spaced apart from the first upper gate electrode in the first direction, the second upper gate electrode surrounds the second plurality of upper nanosheets, wherein a width in the second direction of the first plurality of upper nanosheets is different from a width in the second direction of the second plurality of upper nanosheets.

According to some embodiments of the present disclosure, there is provided a semiconductor device, comprising a substrate extending a first direction and a second direction perpendicular to the first direction, an active pattern extending in the first direction on the substrate, the active pattern protrudes from the substrate in a third direction perpendicular to the first direction and the second direction, a first plurality of lower nanosheets stacked apart from each other in the third direction on the active pattern, a second plurality of lower nanosheets stacked apart from each other in the third direction on the active pattern, the second plurality of lower nanosheets are spaced apart from the first plurality of lower nanosheets in the first direction, a first plurality of upper nanosheets stacked apart from each other in the third direction on the first plurality of lower nanosheets, the first plurality of upper nanosheets are spaced apart from the first plurality of lower nanosheets in the third direction, and a second plurality of upper nanosheets stacked apart from each other in the third direction on the second plurality of lower nanosheets, the second plurality of upper nanosheets are spaced apart from the second plurality of lower nanosheets in the third direction, wherein a width of the first plurality of lower nanosheets in the second direction different is different from a width in the second direction of the second plurality of lower nanosheets, and a width in the second direction of the first plurality of upper nanosheets is different from a width in the second direction of the second plurality of upper nanosheets.

According to some embodiments of the present disclosure, there is provided a semiconductor device, comprising a substrate extending a first direction and a second direction perpendicular to the first direction, an active pattern extending in the first direction on the substrate, the active pattern protrudes from the substrate in a third direction perpendicular to the first direction and the second direction, a first plurality of lower nanosheets stacked apart from each other in the third direction on the active pattern, a second plurality of lower nanosheets stacked apart from each other in the third direction on the active pattern, the second plurality of lower nanosheets are spaced apart from the first plurality of lower nanosheets in the first direction, a first plurality of upper nanosheets stacked apart from each other in the third direction on the first plurality of lower nanosheets, the first plurality of upper nanosheets are spaced apart from the first plurality of lower nanosheets in the third direction, and a second plurality of upper nanosheets stacked apart from each other in the third direction on the second plurality of lower nanosheets, the second plurality of upper nanosheets are spaced apart from the second plurality of lower nanosheets in the third direction, wherein a width of the first plurality of upper nanosheets in the second direction is different from a width in the second direction of the second plurality of upper nanosheets, a first sidewall in the second direction of each of the first plurality of lower nanosheets are aligned in the third direction with a first sidewall in the second direction of each of the first plurality of upper nanosheets, and a first sidewall in the second direction of each of the second plurality of lower nanosheets are aligned in the third direction with a first sidewall in the second direction of each of the second plurality of upper nanosheets.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, a semiconductor device according to some embodiments of the present disclosure will be described with reference to FIGS. 1 to 4.

Figure 1:
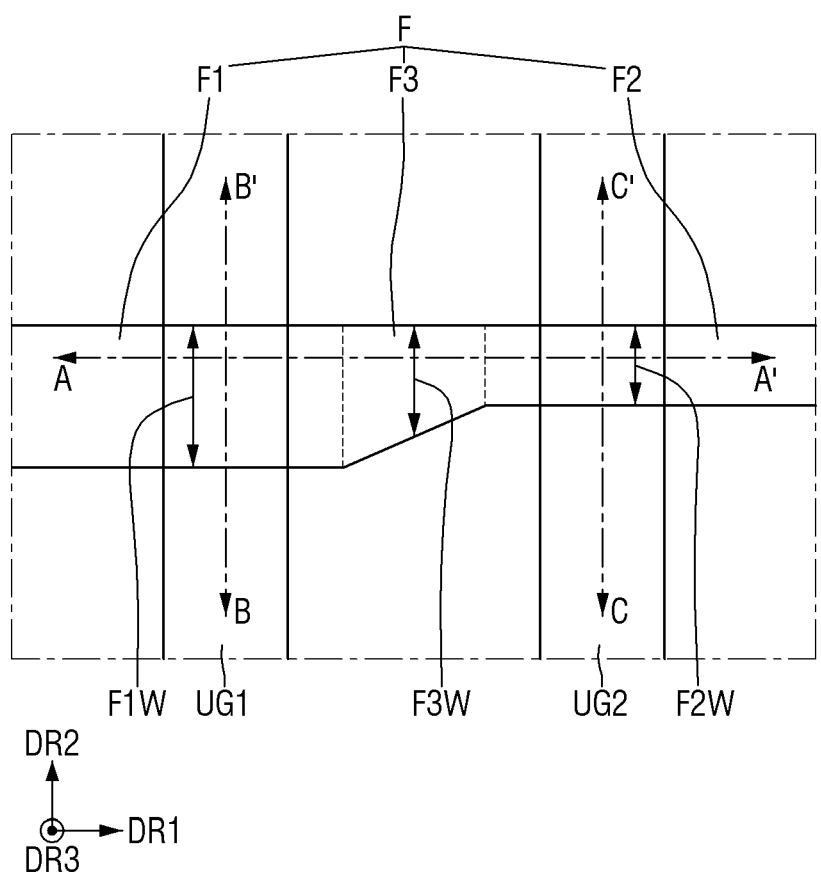
FIG. 1 is a layout view of a semiconductor device according to some embodiments of the present disclosure.
Figure 2:
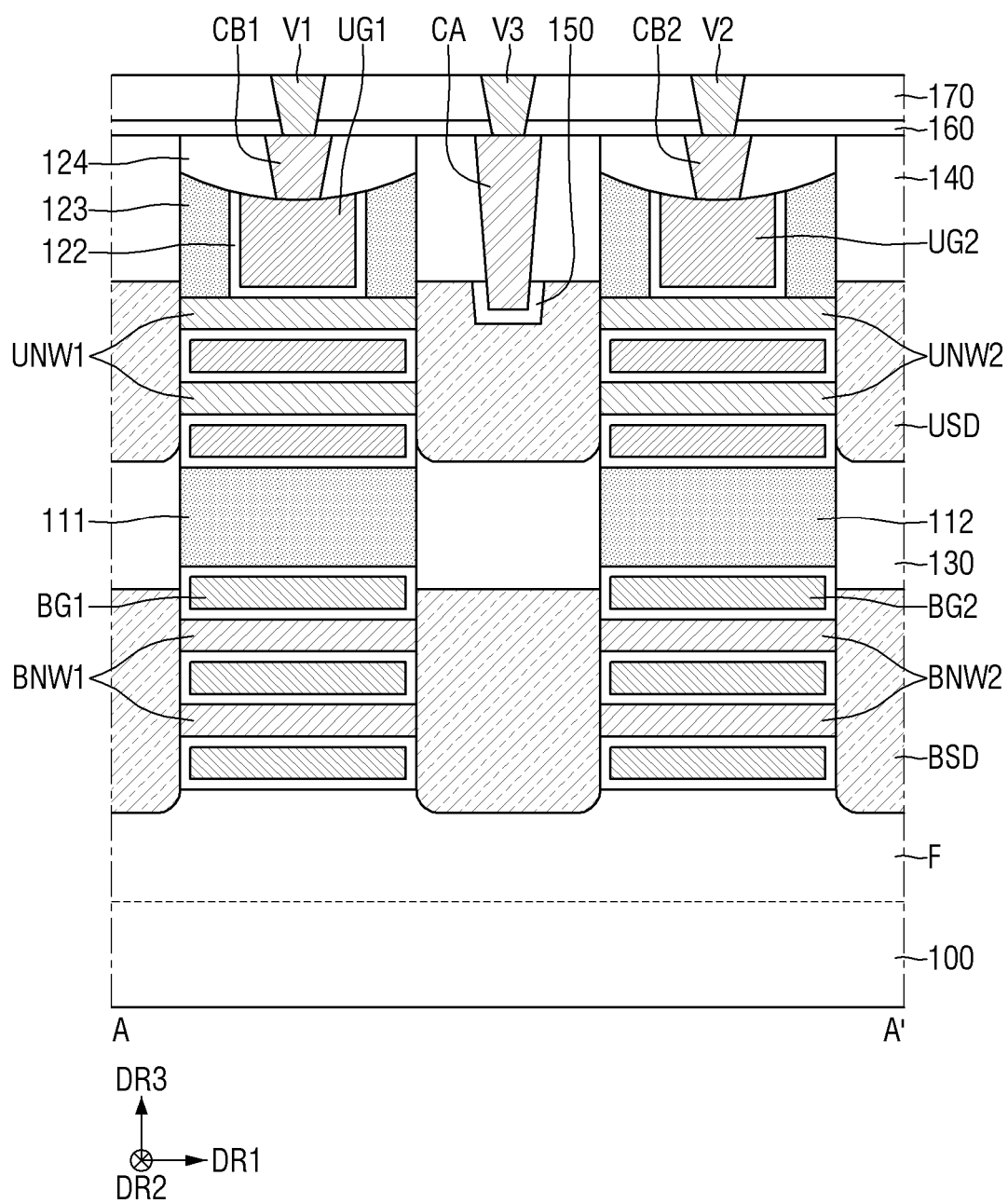
FIG. 2 is a cross-sectional view taken along line A-A' of FIG. 1.
Figure 3:
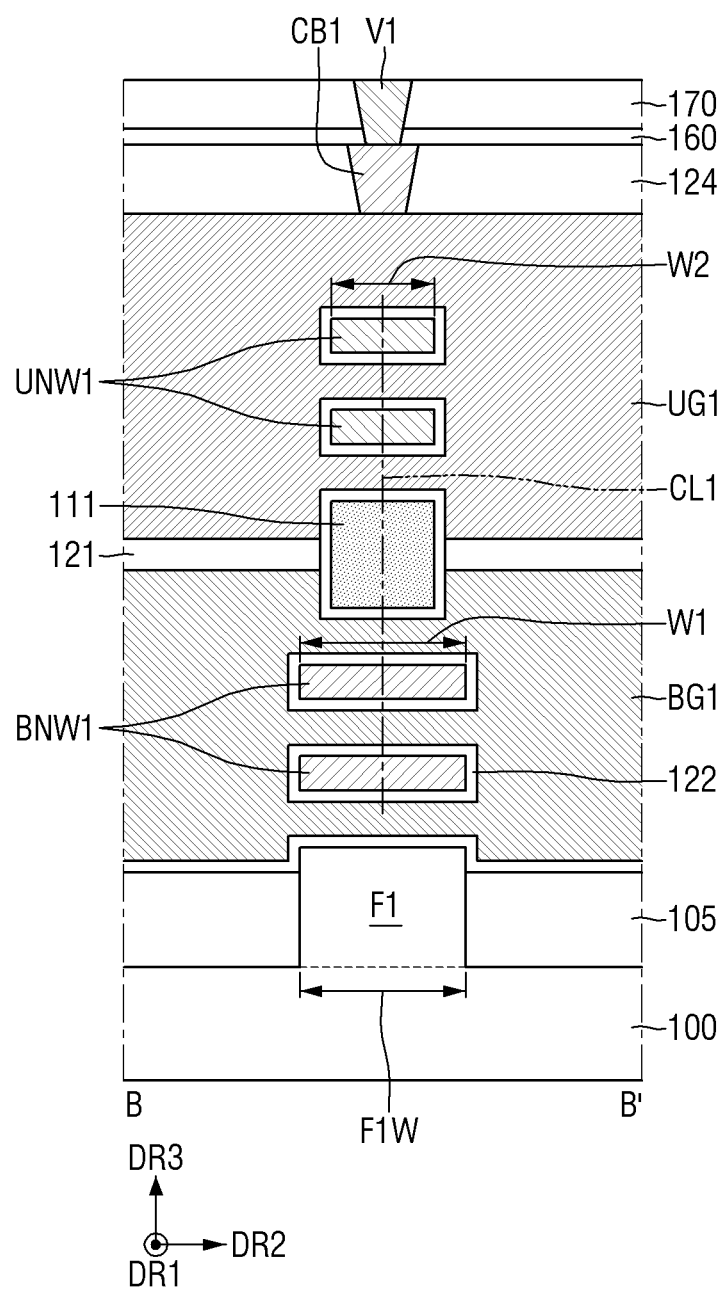
FIG. 3 is a cross-sectional view taken along line B-B' of FIG. 1.
Figure 4:
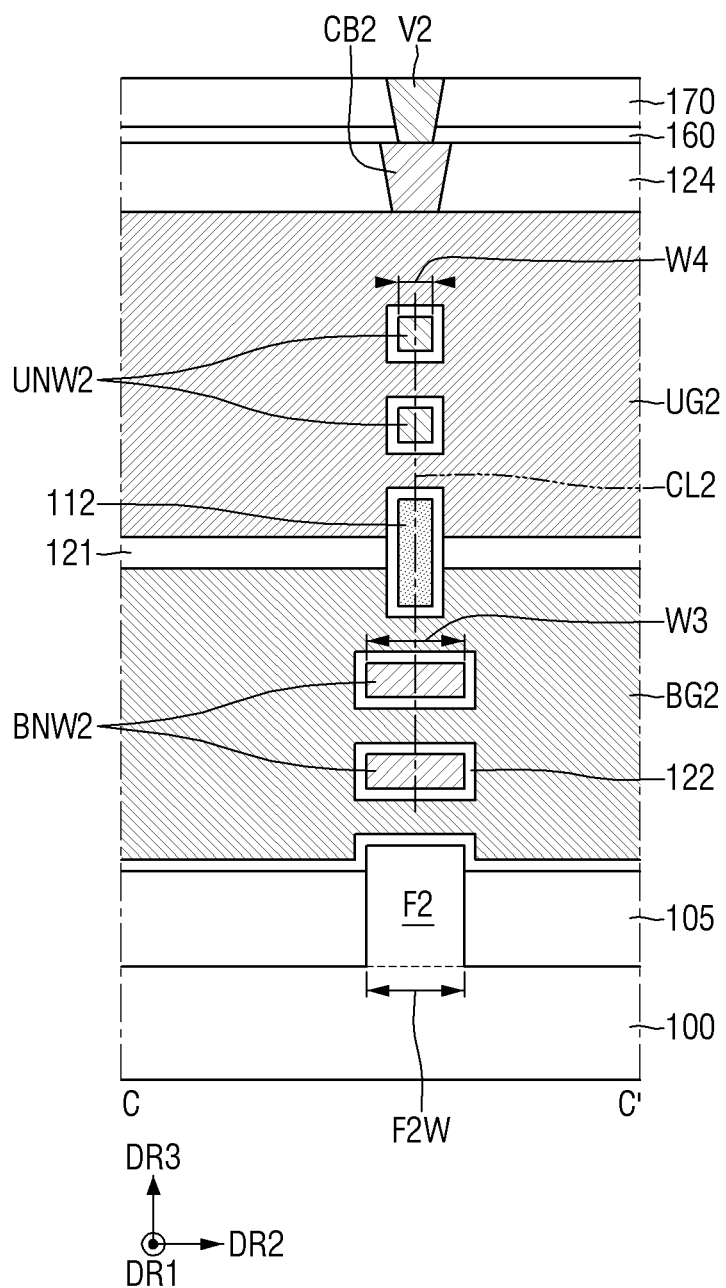
FIG. 4 is a cross-sectional view taken along line C-C' of FIG. 4.

FIG. 1 is a layout view of a semiconductor device according to some embodiments of the present disclosure. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 4.

Referring to FIGS. 1 to 4, a semiconductor device according to some embodiments of the present disclosure includes a substrate 100, an active pattern F, a field insulating layer 105, a first plurality of lower nanosheets BNW1, a second plurality of lower nanosheets BNW2, a first plurality of upper nanosheets UNW1, a second plurality of upper nanosheets UNW2, a first separation layer 111, a second separation layer 112, first and second lower gate electrodes BG1 and BG2, first and second upper gate electrodes UG1 and UG2, a gate separation layer 121, a gate insulating layer 122, gate spacers 123, a capping pattern 124, a lower source/drain region BSD, an upper source/drain region USD, a first interlayer insulating layer 130, a second interlayer insulating layer 140, first and second gate contacts CB1 and CB2, a source/drain contact CA, a silicide layer 150, an etch stop layer 160, a third interlayer insulating layer 170, and first to third vias V1, V2, and V3.

The substrate 100 may be a silicon substrate or a silicon-on-insulator (SOI). Alternatively, the substrate 100 may include or may be formed of silicon germanium, silicon germanium on insulator (SGOI), indium antimonide, lead tellurium compound, indium arsenide, indium phosphide, gallium arsenide, or gallium antimonide, but the present disclosure is not limited thereto.

The active pattern F may protrude from the substrate 100 in a vertical direction (third direction) DR3. Here, the vertical direction DR3 may be defined as a direction that is perpendicular to each of a first horizontal direction (first direction) DR1 and a second horizontal direction (second direction) DR2 different from the first horizontal direction DR1. The active pattern F may be a part of the substrate 100, and may include an epitaxial layer grown from the substrate 100. The active pattern F may extend in the first horizontal direction DR1.

The active pattern F may include first to third portions F1, F2, and F3. The second portion F2 of the active pattern F may be spaced apart from the first portion F1 of the active pattern F in the first horizontal direction DR1. The third portion F3 of the active pattern F may be disposed between the first portion F1 of the active pattern F and the second portion F2 of the active pattern F. The third portion F3 of the active pattern F may connect between the first portion F1 of the active pattern F and the second portion F2 of the active pattern F.

A width F1W in the second horizontal direction DR2 of the first portion F1 of the active pattern F may differ from a width F2W in the second horizontal direction DR2 of the second portion F2 of the active pattern F. For example, the width F1W in the second horizontal direction DR2 of the first portion F1 of the active pattern F may be greater than the width F2W in the second horizontal direction DR2 of the second portion F2 of the active pattern F. In this case, a width F3W in the second horizontal direction DR2 of the third portion F3 of the active pattern F may become smaller toward the second portion F2 of the active pattern F.

The field insulating layer 105 may be disposed on the substrate 100. The field insulating layer 105 may surround sidewalls of the active pattern F. For example, a top surface of the active pattern F may protrude further in the vertical direction DR3 than a top surface of the field insulating layer 105. However, the present disclosure is not limited thereto.

In some other embodiments, the top surface of the active pattern F may be formed to be coplanar with the top surface of the field insulating layer 105.

The first plurality of lower nanosheets BNW1 may be disposed on the first portion F1 of the active pattern F. The first plurality of lower nanosheets BNW1 may include a plurality of nanosheets stacked apart from each other on the first portion F1 of the active pattern F in the vertical direction DR3. The second plurality of lower nanosheets BNW2 may be disposed on the second portion F2 of the active pattern F. The second plurality of lower nanosheets BNW2 may be spaced apart from the first plurality of lower nanosheets BNW1 in the first horizontal direction DR1. The second plurality of lower nanosheets BNW2 may include a plurality of nanosheets that are stacked apart from each other on the second portion F2 of the active pattern F in the vertical direction DR3.

FIGS. 2 to 4 illustrate that each of the first plurality of lower nanosheets BNW1 and the second plurality of lower nanosheets BNW2 includes two nanosheets stacked in the vertical direction DR3, but this is merely for convenience of description. In some other embodiments, the first plurality of lower nanosheets BNW1 and the second plurality of lower nanosheets BNW2 may each include three or more nanosheets stacked in the vertical direction DR3. Each of the first plurality of lower nanosheets BNW1 and the second plurality of lower nanosheets BNW2 may include, for example, silicon (Si).

For example, a width W1 in the second horizontal direction DR2 of the first plurality of lower nanosheets BNW1 may differ from a width W3 in the second horizontal direction DR2 of the second plurality of lower nanosheets BNW2. For example, the width W1 in the second horizontal direction DR2 of the first plurality of lower nanosheets BNW1 may be greater than the width W3 in the second horizontal direction DR2 of the second plurality of lower nanosheets BNW2.

For example, the width W1 in the second horizontal direction DR2 of the first plurality of lower nanosheets BNW1 may be equal to the width F1W in the second horizontal direction DR2 of the first portion F1 of the active pattern F. Also, the width W3 in the second horizontal direction DR2 of the second plurality of lower nanosheets BNW2 may be equal to the width F2W in the second horizontal direction DR2 of the second portion F2 of the active pattern F. However, the present disclosure is not limited thereto.

The first plurality of upper nanosheets UNW1 may be disposed on the first plurality of lower nanosheets BNW1. The first plurality of upper nanosheets UNW1 may be spaced apart from the first plurality of lower nanosheets BNW1 in the vertical direction DR3. The first plurality of upper nanosheets UNW1 may include a plurality of nanosheets that are stacked apart from each other on the first plurality of lower nanosheets BNW1 in the vertical direction DR3.

The second plurality of upper nanosheets UNW2 may be disposed on the second plurality of lower nanosheets BNW2. The second plurality of upper nanosheets UNW2 may be spaced apart from the second plurality of lower nanosheets BNW2 in the vertical direction DR3. The second plurality of upper nanosheets UNW2 may be spaced apart from the first plurality of upper nanosheets UNW1 in the first horizontal direction DR1. The second plurality of upper nanosheets UNW2 may include a plurality of nanosheets stacked apart from each other in the vertical direction DR3 on the second plurality of lower nanosheets BNW2.

FIGS. 2 to 4 illustrate that each of the first plurality of upper nanosheets UNW1 and the second plurality of upper nanosheets UNW2 includes two nanosheets stacked in the vertical direction DR3, but this is merely for convenience of description. In some other embodiments, the first plurality of upper nanosheets UNW1 and the second plurality of upper nanosheets UNW2 may each include three or more nanosheets stacked in the vertical direction DR3. Each of the first plurality of upper nanosheets UNW1 and the second plurality of upper nanosheets UNW2 may include, for example, silicon (Si).

For example, a width W2 in the second horizontal direction DR2 of the first plurality of upper nanosheets UNW1 may differ from a width W4 in the second horizontal direction DR2 of the second plurality of upper nanosheets UNW2. For example, the width W2 in the second horizontal direction DR2 of the first plurality of upper nanosheets UNW1 may be greater than the width W4 in the second horizontal direction DR2 of the second plurality of upper nanosheets UNW2.

For example, the width W2 in the second horizontal direction DR2 of the first plurality of upper nanosheets UNW1 may differ from the width W1 in the second horizontal direction DR2 of the first plurality of lower nanosheets BNW1. For example, the width W2 in the second horizontal direction DR2 of the first plurality of upper nanosheets UNW1 may be smaller than the width W1 in the second horizontal direction DR2 of the first plurality of lower nanosheets BNW1.

For example, the width W4 in the second horizontal direction DR2 of the second plurality of upper nanosheets UNW2 may differ from the width W3 in the second horizontal direction DR2 of the second plurality of lower nanosheets BNW2. For example, the width W4 in the second horizontal direction DR2 of the second plurality of upper nanosheets UNW2 may be smaller than the width W3 in the second horizontal direction DR2 of the second plurality of lower nanosheets BNW2.

The first separation layer 111 may be disposed between the first plurality of lower nanosheets BNW1 and the first plurality of upper nanosheets UNW1. The first separation layer 111 may be spaced apart from each of the first plurality of lower nanosheets BNW1 and the first plurality of upper nanosheets UNW1 in the vertical direction DR3.

For example, a width in the second horizontal direction DR2 of the first separation layer 111 may be smaller than the width W1 in the second horizontal direction DR2 of the first plurality of lower nanosheets BNW1. For example, the width in the second horizontal direction DR2 of the first separation layer 111 may be equal to the width W2 in the second horizontal direction DR2 of the first plurality of upper nanosheets UNW1. However, the present disclosure is not limited thereto. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The second separation layer 112 may be disposed between the second plurality of lower nanosheets BNW2 and the second plurality of upper nanosheets UNW2. The second separation layer 112 may be spaced apart from each of the second plurality of lower nanosheets BNW2 and the second plurality of upper nanosheets UNW2 in the vertical direction DR3. The second separation layer 112 may be spaced apart from the first separation layer 111 in the first horizontal direction DR1.

For example, a width in the second horizontal direction DR2 of the second separation layer 112 may be smaller than the width W2 in the second horizontal direction DR2 of the second plurality of lower nanosheets BNW2. For example, the width in the second horizontal direction DR2 of the second separation layer 112 may differ from the width in the second horizontal direction DR2 of the first separation layer 111. For example, the width in the second horizontal direction DR2 of the second separation layer 112 may be smaller than the width in the second horizontal direction DR2 of the first separation layer 111. For example, the width in the second horizontal direction DR2 of the second separation layer 112 may be equal to the width W4 in the second horizontal direction DR2 of the second plurality of upper nanosheets UNW2. However, the present disclosure is not limited thereto.

Each of the first separation layer 111 and the second separation layer 112 may include or may be formed of, for example, at least one of silicon nitride (SiN), silicon oxycarbonitride (SiOCN), silicon boron carbonitride (SiBCN), silicon carbonitride (SiCN), silicon oxynitride (SiON), or combinations thereof.

For example, a central line which divides the first plurality of lower nanosheets BNW1 in the second horizontal direction DR2, a central line which divides the first separation layer 111 in the second horizontal direction DR2, and a central line which divides the first plurality of upper nanosheets UNW1 in the second horizontal direction DR2 may each be aligned in the vertical direction DR3. For example, the first plurality of lower nanosheets BNW1, the first separation layer 111, and the first plurality of upper nanosheets UNW1 may each be divided in the second horizontal direction DR2 by a first central line CL1 extending in the vertical direction DR3. Here, being divided in the second horizontal direction DR2 means that divided portions have the same width in the second horizontal direction DR2 with respect to the first central line CL1.

For example, a central line which divides the second plurality of lower nanosheets BNW2 in the second horizontal direction DR2, a central line which divides the second separation layer 112 in the second horizontal direction DR2, and a central line which divides the second plurality of upper nanosheets UNW2 in the second horizontal direction DR2 may each be aligned in the vertical direction DR3. For example, the second plurality of lower nanosheets BNW2, the second separation layer 112, and the second plurality of upper nanosheets UNW2 may each be divided in the second horizontal direction DR2 by a second central line CL2 extending in the vertical direction DR3. Here, being divided in the second horizontal direction DR2 means that divided portions have the same width in the second horizontal direction DR2 with respect to the second central line CL2. For example, the first central line CL1 and the second central line CL2 may not be aligned with each other in the first horizontal direction DR1.

In some other embodiments, one or all of the central line which divides the first plurality of lower nanosheets BNW1 in the second horizontal direction DR2, the central line which divides the first separation layer 111 in the second horizontal direction DR2, and the central line which divides the first plurality of upper nanosheets UNW1 in the second horizontal direction DR2 may not be aligned with the other central lines. In some other embodiments, one or all of the central line which divides the second plurality of lower nanosheets BNW2 in the second horizontal direction DR2, the central line which divides the second separation layer 112 in the second horizontal direction DR2, and the central line which divides the second plurality of upper nanosheets UNW2 in the second horizontal direction DR2 may not be aligned with the other central lines.

The first lower gate electrode BG1 may extend in the second horizontal direction DR2 on the first portion F1 of the active pattern F and the field insulating layer 105. The first lower gate electrode BG1 may surround the first plurality of lower nanosheets BNW1. For example, the first lower gate electrode BG1 may surround a portion of the first separation layer 111.

The second lower gate electrode BG2 may extend in the second horizontal direction DR2 on the second portion F2 of the active pattern F and the field insulating layer 105. The second lower gate electrode BG2 may be spaced apart from the first lower gate electrode BG1 in the first horizontal direction DR1. The second lower gate electrode BG2 may surround the second plurality of lower nanosheets BNW2. For example, the second lower gate electrode BG2 may surround a portion of the second separation layer 112.

The first upper gate electrode UG1 may extend in the second horizontal direction DR2 on the first lower gate electrode BG1. For example, the first upper gate electrode UG1 may be spaced apart from the first lower gate electrode BG1 in the vertical direction DR3. The first upper gate electrode UG1 may surround the first plurality of upper nanosheets UNW1. For example, the first upper gate electrode UG1 may surround a portion of the first separation layer 111.

The second upper gate electrode UG2 may extend in the second horizontal direction DR2 on the second lower gate electrode BG2. For example, the second upper gate electrode UG2 may be spaced apart from the second lower gate electrode BG2 in the vertical direction DR3. The second upper gate electrode UG2 may be spaced apart from the first upper gate electrode UG1 in the first horizontal direction DR1. The second upper gate electrode UG2 may surround the second plurality of upper nanosheets UNW2. For example, the second upper gate electrode UG2 may surround a portion of the second separation layer 112.

Each of the first and second lower gate electrodes BG1 and BG2 and the first and second upper gate electrodes UG1 and UG2 may include or may be formed of, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof. Each of the first and second lower gate electrodes BG1 and BG2 and the first and second upper gate electrodes UG1 and UG2 may include a conductive metal oxide, a conductive metal oxynitride, and the like, and may also include an oxidized form of the aforementioned material.

In some embodiments, the first and second lower gate electrodes BG1 and BG2 may include a material different from that of the first and second upper gate electrodes UG1 and UG2. However, the present disclosure is not limited thereto. In some other embodiments, the first and second lower gate electrodes BG1 and BG2 and the first and second upper gate electrodes UG1 and UG2 may include the same material.

The gate separation layer 121 may be disposed between the first lower gate electrode BG1 and the first upper gate electrode UG1. For example, the gate separation layer 121 may be disposed on a sidewall of the first separation layer 111. The gate separation layer 121 may be disposed between the second lower gate electrode BG2 and the second upper gate electrode UG2. For example, the gate separation layer 121 may be disposed on a sidewall of the second separation layer 112.

The gate separation layer 121 may include, for example, a conductive material, but the present disclosure is not limited thereto. In some other embodiments, the gate separation layer 121 may include an insulating material.

Although FIGS. 3 and 4 illustrate that the first lower gate electrode BG1 and the first upper gate electrode UG1 are separated by the gate separation layer 121 and the second lower gate electrode BG2 and the second upper gate electrode UG2 are separated by the gate separation layer 121, the present disclosure is not limited thereto. In some other embodiments, the first plurality of lower nanosheets BNW1 and the first plurality of upper nanosheets UNW1 may each be surrounded by one gate electrode. In addition, the second plurality of lower nanosheets BNW2 and the second plurality of upper nanosheets UNW2 may each be surrounded by one gate electrode.

The lower source/drain region BSD may be disposed on at least one side of each of the first and second lower gate electrodes BG1 and BG2 on the active pattern F. For example, the lower source/drain region BSD may be disposed on both sides of each of the first and second lower gate electrodes BG1 and BG2 on the active pattern F. The lower source/drain region BSD may be disposed on sidewalls of each of the first and second plurality of lower nanosheets BNW1 and BNW2. The lower source/drain region BSD may be in contact with the sidewalls of each of the first and second plurality of lower nanosheets BNW1 and BNW2.

A top surface of the lower source/drain region BSD may be formed higher than a top surface of the topmost nanosheet among the first plurality of lower nanosheets BNW1. The top surface of the lower source/drain region BSD may be formed higher than a top surface of the topmost nanosheet among the second plurality of lower nanosheets BNW2. For example, the top surface of the lower source/drain region BSD may be formed lower than a bottom surface of each of the first separation layer 111 and the second separation layer 112. For example, the lower source/drain region BSD may not be in contact with each of the first separation layer 111 and the second separation layer 112. However, the present disclosure is not limited thereto. In some other embodiments, the top surface of the lower source/drain region BSD may be formed higher than the bottom surface of each of the first separation layer 111 and the second separation layer 112. For example, the lower source/drain region BSD may be in contact with at least a portion of each of the first separation layer 111 and the second separation layer 112. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

The first interlayer insulating layer 130 may cover the lower source/drain region BSD on the field insulating layer 105. Although not shown, the first interlayer insulating layer 130 may surround a portion of sidewalls of each of the first and second lower gate electrodes BG1 and BG2 on the field insulating layer 105. In addition, although not shown, the first interlayer insulating layer 130 may surround a portion of sidewalls of each of the first and second upper gate electrodes UG1 and UG2 on the field insulating layer 105. The first interlayer insulating layer 130 may be in contact with both sidewalls in the first horizontal direction DR1 of each of the first separation layer 111 and the second separation layer 112 on the lower source/drain region BSD.

The first interlayer insulating layer 130 may include or may be formed of, for example, at least one of silicon oxide, silicon nitride, silicon oxynitride, or a low-k material. The low-k material may include, for example, fluorinated tetra-ethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or combinations thereof. However, the present disclosure is not limited thereto.

The upper source/drain region USD may be disposed on at least one side of each of the first and second upper gate electrodes UG1 and UG2 on the first interlayer insulating layer 130. The upper source/drain region USD may be disposed on both sides of each of the first and second upper gate electrodes UG1 and UG2 on the first interlayer insulating layer 130. The upper source/drain region USD may be disposed on sidewalls of each of the first and second plurality of upper nanosheets UNW1 and UNW2. The upper source/drain region USD may be in contact with the sidewalls of each of the first and second plurality of upper nanosheets UNW1 and UNW2. The upper source/drain region USD may overlap the lower source/drain region BSD in the vertical direction DR3.

A top surface of the upper source/drain region USD may be formed higher than the top surface of the topmost nanosheet among the first plurality of upper nanosheets UNW1. The top surface of the upper source/drain region USD may be formed higher than the top surface of the topmost nanosheet among the second plurality of upper nanosheets UNW2. However, the present disclosure is not limited thereto.

The upper source/drain region USD may not be in contact with each of the first separation layer 111 and the second separation layer 112. However, the present disclosure is not limited thereto. In some other embodiments, the upper source/drain region USD may be in contact with at least a portion of each of the first separation layer 111 and the second separation layer 112.

The gate spacers 123 may extend in the second horizontal direction DR2 on both sidewalls of each of the first and second upper gate electrodes UG1 and UG2 on the active pattern F. The gate spacers 123 may be disposed on both sidewalls of the first upper gate electrode UG1 on the topmost nanosheet among the first plurality of upper nanosheets UNW1. Also, the gate spacers 123 may be disposed on both sidewalls of the second upper gate electrode UG2 on the topmost nanosheet among the second plurality of upper nanosheets UNW2. Although not shown, the gate spacers 123 may extend in the second horizontal direction DR2 on both sidewalls of each of the first and second lower gate electrodes BG1 and BG2 and the first and second upper gate electrodes UG1 and UG2 on the field insulating layer 105.

The gate spacers 123 may include or may be formed of, for example, at least one of silicon nitride (SiN), silicon oxynitride (SiON), silicon carbonitride (SiCN), silicon oxycarbonitride (SiOCN), silicon boron nitride (SiBN), or silicon oxyboron nitride (SiOBN), silicon oxycarbide (SiOC), or combinations thereof.

Although not shown, the gate insulating layer 122 may be disposed between each of the first and second lower gate electrodes BG1 and BG2 and the gate spacers 123 on the field insulating layer 105. The gate insulating layer 122 may be disposed between each of the first and second upper gate electrodes UG1 and UG2 and the gate spacers 123. The gate insulating layer 122 may be disposed between each of the first and second lower gate electrodes BG1 and BG2 and the lower source/drain region BSD. The gate insulating layer 122 may be disposed between each of the first and second upper gate electrodes UG1 and UG2 and the upper source/drain region USD. The gate insulating layer 122 may be disposed between each of the first and second lower gate electrodes BG1 and BG2 and the active pattern F. The gate insulating layer 122 may be disposed between each of the first and second lower gate electrodes BG1 and BG2 and the field insulating layer 105.

Also, the gate insulating layer 122 may be disposed between the first lower gate electrode BG1 and the first plurality of lower nanosheets BNW1. The gate insulating layer 122 may be disposed between the second lower gate electrode BG2 and the second plurality of lower nanosheets BNW2. The gate insulating layer 122 may be disposed between the first upper gate electrode UG1 and the first plurality of upper nanosheets UNW1. The gate insulating layer 122 may be disposed between the second upper gate electrode UG2 and the first plurality of upper nanosheets UNW1. The gate insulating layer 122 may be disposed between each of the first and second lower gate electrodes BG1 and BG2 and the first separation layer 111. The gate insulating layer 122 may be disposed between each of the first and second upper gate electrodes UG1 and UG2 and the second separation layer 112.

The gate insulating layer 122 may include or may be formed of at least one of silicon oxide, silicon oxynitride, silicon nitride, or a high-k material having a higher dielectric constant than a silicon oxide. The high-k material may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

A semiconductor device according to some other embodiments may include a negative capacitance FET using a negative capacitor. For example, the gate insulating layer 122 may include a ferroelectric material film having ferroelectric properties and a paraelectric material film having paraelectric properties.

The ferroelectric material film may have negative capacitance, and the paraelectric material film may have positive capacitance. For example, when two or more capacitors are connected in series and have positive capacitance, the overall capacitance of the two or more capacitors may be less than the individual capacitance of each of the two or more capacitors. On the contrary, if at least one of the two or more capacitors has negative capacitance, the overall capacitance of the two or more capacitors may have a positive value greater than the absolute value of the individual capacitance of each of the two or more capacitors.

In a case where the ferroelectric material film having negative capacitance and the paraelectric material film having positive capacitance are connected in series, the overall capacitance of the ferroelectric material film and the paraelectric material film connected in series may increase. By utilizing an increase in the overall capacitance value, the transistor including the ferroelectric material film may have a subthreshold swing SS of less than 60 mV/decade at room temperature.

The ferroelectric material film may have ferroelectric properties. The ferroelectric material films may include, for example, at least one of hafnium oxide, hafnium zirconium oxide, barium strontium titanium oxide, barium titanium oxide, or lead zirconium titanium oxide. Here, the hafnium zirconium oxide may be a material obtained by doping hafnium oxide with zirconium (Zr). Alternatively, the hafnium zirconium oxide may be a compound of hafnium (Hf), Zr, and oxygen (O).

The ferroelectric material film may further include a dopant. For example, the dopant may include, for example, at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of the dopant may vary depending on the material of the ferroelectric material film.

When the ferroelectric material film include hafnium oxide, the dopant may include, for example, at least one of gadolinium (Gd), silicon (Si), zirconium (Zr), aluminum (Al), or yttrium (Y).

When the dopant is aluminum (Al), the ferroelectric material film may include approximately 3 to 8 atomic percent (at. %) of aluminum. Here, the percentage of the dopant may be the ratio of aluminum to the sum of hafnium and aluminum.

When the dopant is silicon (Si), the ferroelectric material film may include approximately 2 to 10 atomic percent (at. %) of silicon. When the dopant is yttrium (Y), the ferroelectric material film may include approximately 2 to 10 atomic percent (at. %) of yttrium. When the dopant is gadolinium (Gd), the ferroelectric material film may include approximately 1 to 7 atomic percent (at. %) of gadolinium. When the dopant is zirconium (Zr), the ferroelectric material film may include approximately 50 to 80 atomic percent (at. %) of zirconium.

The paraelectric material film may have paraelectric properties. The paraelectric material film may include, for example, at least one of silicon oxide or a high-k metal oxide. The high-k metal oxide included in the paraelectric material film may include, for example, at least one of hafnium oxide, zirconium oxide, or aluminum oxide, but the present disclosure is not limited thereto.

The ferroelectric material film and the paraelectric material film may include the same material. The ferroelectric material film may have ferroelectric properties, and the paraelectric material film may not have ferroelectric properties. For example, in a case where the ferroelectric material film and the paraelectric material film both include hafnium oxide, the hafnium oxide of the ferroelectric material film and the hafnium oxide of the paraelectric material film may have different crystalline structures.

The ferroelectric material film may have a sufficient thickness to have ferroelectric properties. The ferroelectric material film may have a thickness of, for example, about 0.5 nm to 10 nm, but the present disclosure is not limited thereto. As the critical thickness for ferroelectricity may vary depending on the type of ferroelectric material, the thickness of the ferroelectric material film may vary depending on the material of the ferroelectric material film.

For example, the gate insulating layer 122 may include one ferroelectric material film. In another example, the gate insulating layer 122 may include a plurality of ferroelectric material films that are spaced apart from one another. The gate insulating layer 122 may have a structure in which a plurality of ferroelectric material films and a plurality of paraelectric material films are alternately stacked.

The capping pattern 124 may extend in the second horizontal direction DR2 on the first upper gate electrode UG1, the second upper gate electrode UG2, the gate insulating layer 122, and the gate spacers 123. For example, the capping pattern 124 may be in contact with the top surface of the gate spacer 123. However, the present disclosure is not limited thereto. In some other embodiments, the capping pattern 124 may be interposed between the gate spacers 123. In this case, the top surface of the capping pattern 124 may be formed to be coplanar with the top surface of the gate spacers 123. The capping patterns 124 may include or may be formed of, for example, at least one of silicon nitride (SiN), silicon oxynitride (SiON), silicon carbonitride (SiCN), silicon oxycarbonitride (SiOCN), or combinations thereof.

The second interlayer insulating layer 140 may cover the upper source/drain region USD on the first interlayer insulating layer 130. Although not shown, the second interlayer insulating layer 140 may partially surround the sidewalls of each of the first and second upper gate electrodes UG1 and UG2, on the field insulating layer 105.

For example, the top surface of the second interlayer insulating layer 140 may be coplanar with the top surface of the capping pattern 124. However, the present disclosure is not limited thereto. In some other embodiments, the second interlayer insulating layer 140 may cover the top surface of the capping pattern 124. For example, the second interlayer insulating layer 140 may include the same material as the first interlayer insulating layer 130. The second interlayer insulating layer 140 may include, for example, at least one of silicon oxide, silicon nitride, silicon oxynitride, or a low-k material.

The source/drain contact CA may penetrate the second interlayer insulating layer 140 in the vertical direction DR3 and be connected to the upper source/drain region USD. At least a portion of the source/drain contact CA may extend into the upper source/drain region USD. For example, a top surface of the source/drain contact CA may be coplanar with the top surface of the second interlayer insulating layer 140. However, the present disclosure is not limited thereto. Although FIG. 2 illustrates that the source/drain contact CA is formed of a single layer, this is merely for convenience of description, and the present disclosure is not limited thereto. For example, the source/drain contact CA may be formed of multiple layers. The source/drain contact CA may include a conductive material.

The silicide layer 150 may be disposed between the upper source/drain region USD and the source/drain contact CA. The silicide layer 150 may include, for example, a metal silicide material.

The first gate contact CB1 may be disposed on the first upper gate electrode UG1. The first gate contact CB1 may penetrate the capping pattern 124 in the vertical direction DR3 and be electrically connected to the first upper gate electrode UG1. The second gate contact CB2 may be disposed on the second upper gate electrode UG2. The second gate contact CB2 may penetrate the capping pattern 124 in the vertical direction DR3 and be electrically connected to the second upper gate electrode UG2.

For example, a top surface of each of the first and second gate contacts CB1 and CB2 may be coplanar with the top surface of the second interlayer insulating layer 140. However, the present disclosure is not limited thereto. Although FIG. 2 illustrates that each of the first and second gate contacts CB1 and CB2 is formed of a single layer, this is merely for convenience of description, and the present disclosure is not limited thereto. For example, each of the first and second gate contacts CB1 and CB2 may be formed of multiple layers. The first and second gate contacts CB1 and CB2 may each include a conductive material.

The etch stop layer 160 may be disposed on the top surface of each of the second interlayer insulating layer 140 and the capping pattern 124. The etch stop layer 160 may be, for example, conformally formed. Although FIGS. 2 to 4 illustrate that the etch stop layer 160 is formed of a single layer, the present disclosure is not limited thereto. In some other embodiments, the etch stop layer 160 may be formed of multiple layers. The etch stop layer 160 may include or may be formed of, for example, at least one of aluminum oxide, aluminum nitride, hafnium oxide, zirconium oxide, silicon oxide, silicon nitride, silicon oxynitride, or a low-k material.

The third interlayer insulating layer 170 may disposed on the etch stop layer 160. The third interlayer insulating layer 170 may include or may be formed of, for example, at least one of silicon oxide, silicon nitride, silicon oxynitride, or a low-k material.

The first via V1 may penetrate the third interlayer insulating layer 170 and the etch stop layer 160 in the vertical direction DR3 and be electrically connected to the first gate contact CB1. The second via V2 may penetrate the third interlayer insulating layer 170 and the etch stop layer 160 in the vertical direction DR3 and be electrically connected to the second gate contact CB2. The third via V3 may penetrate the third interlayer insulating layer 170 and the etch stop layer 160 in the vertical direction DR3 and be electrically connected to the source/drain contact CA. Although FIG. 2 illustrates that each of the first to third vias V1, V2, and V3 is formed of a single layer, this is merely for convenience of description, and the present disclosure is not limited thereto. For example, each of the first to third vias V1, V2, and V3 may be formed of multiple layers. The first to third vias V1, V2, and V3 may each include a conductive material.

In the semiconductor device according to some embodiments of the present disclosure, the plurality of upper nanosheets UNW1 and UNW2 are stacked on the plurality of lower nanosheets BNW1 and BNW2 and the widths between the plurality of lower nanosheets BNW1 and BNW2 adjacent in the horizontal direction or the widths between the plurality of upper nanosheets UNW1 and UNW2 adjacent in the horizontal direction are different from each other, so that the integration of the semiconductor device can be improved.

Hereinafter, a method of manufacturing a semiconductor device according to some embodiments of the present disclosure will be described with reference to FIGS. 2 to 29.

FIGS. 5 to 29 are views for describing a method of manufacturing a semiconductor device according to some embodiments of the present disclosure.

Figure 5:
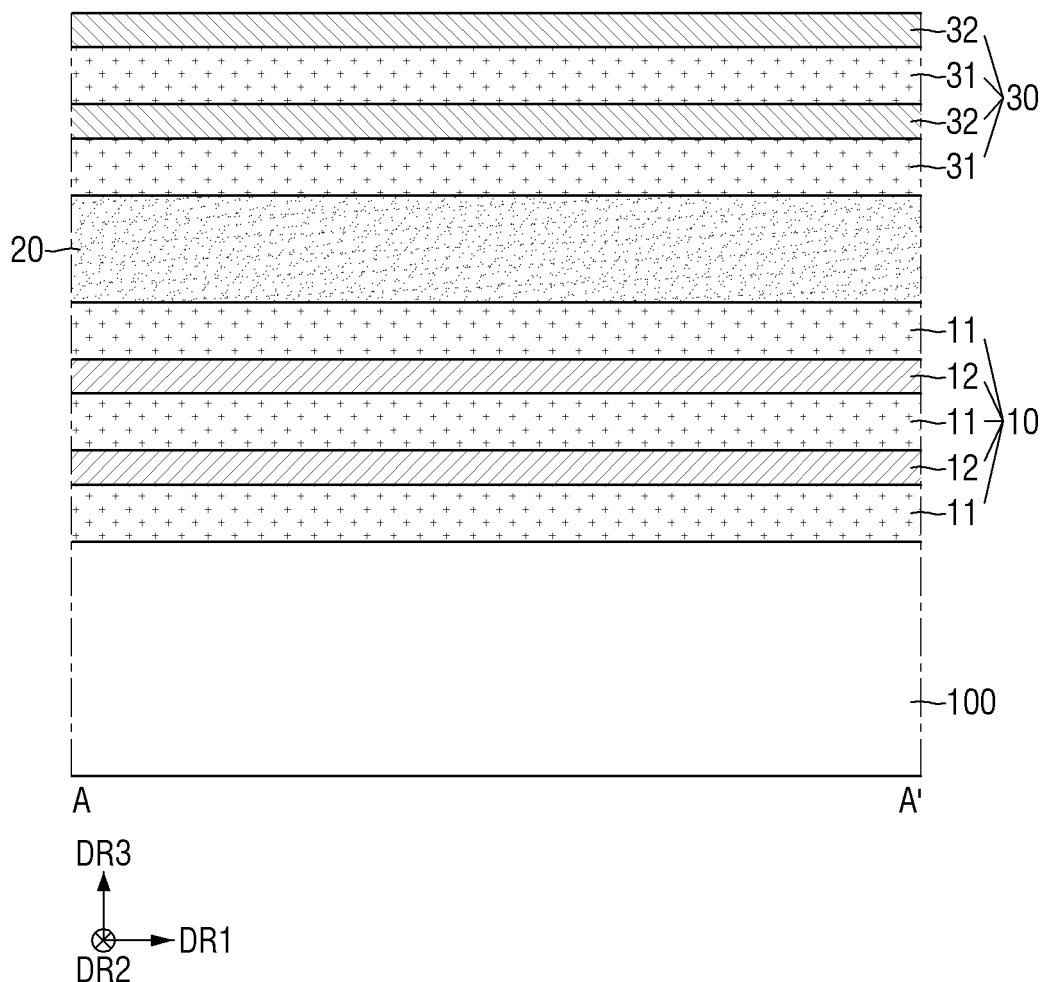
FIGS. 5 to 29 are views for describing a method of manufacturing a semiconductor device according to some embodiments of the present disclosure.
Figure 6:
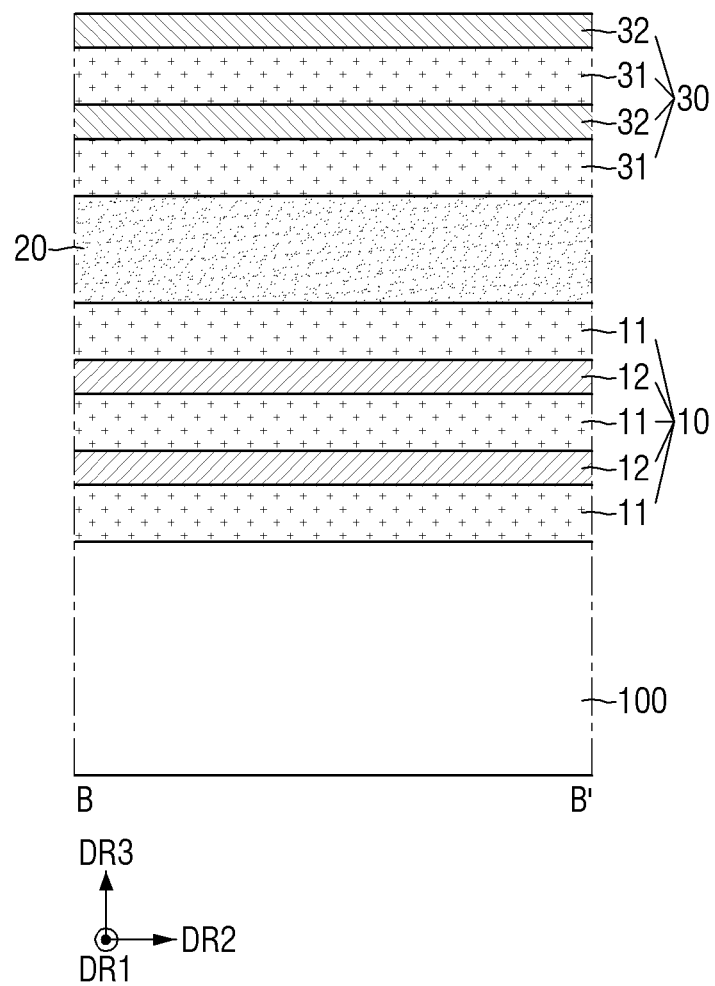

Referring to FIGS. 5 and 6, a first stack structure 10, a second sacrificial layer 20, and a third stack structure 30 may be sequentially stacked on the substrate 100. The first stack structure 10 may include first sacrificial layers 11 and first semiconductor layers 12 alternately stacked on the substrate 100. For example, the first sacrificial layer 11 may be formed on the lowermost portion of the first stack structure 10, and the first semiconductor layer 12 may be formed on the uppermost portion of the first stack structure 10. However, the present disclosure is not limited thereto. In some other embodiments, the first sacrificial layer 11 may be formed on the uppermost portion of the first stack structure 10. The first sacrificial layer 11 may include, for example, silicon germanium (SiGe). The first semiconductor layer 12 may include, for example, silicon Si.

Then, the second sacrificial layer 20 may be formed on the first stack structure 10. The thickness in the vertical direction DR3 of the second sacrificial layer 20 may be greater than the thickness in the vertical direction DR3 of the first sacrificial layer 11. The second sacrificial layer 20 may include, for example, silicon germanium (SiGe). For example, a concentration of germanium (Ge) contained in the second sacrificial layer 20 may be greater than a concentration of germanium (Ge) contained in the first sacrificial layer 11.

The third stack structure 30 may include third sacrificial layers 31 and second semiconductor layers 32 alternately stacked on the second sacrificial layer 20. For example, the third sacrificial layer 31 may be formed on the lowermost portion of the third stack structure 30, and the second semiconductor layer 32 may be formed on the uppermost portion of the third stack structure 30. However, the present disclosure is not limited thereto. In some other embodiments, the third sacrificial layer 31 may be formed on the uppermost portion of the third stack structure 30.

The third sacrificial layer 31 may include, for example, silicon germanium (SiGe). For example, a concentration of germanium (Ge) contained in the third sacrificial layer 31 may be less than a concentration of germanium (Ge) contained in the second sacrificial layer 20. The second semiconductor layer 32 may include, for example, silicon Si.

Figure 7:
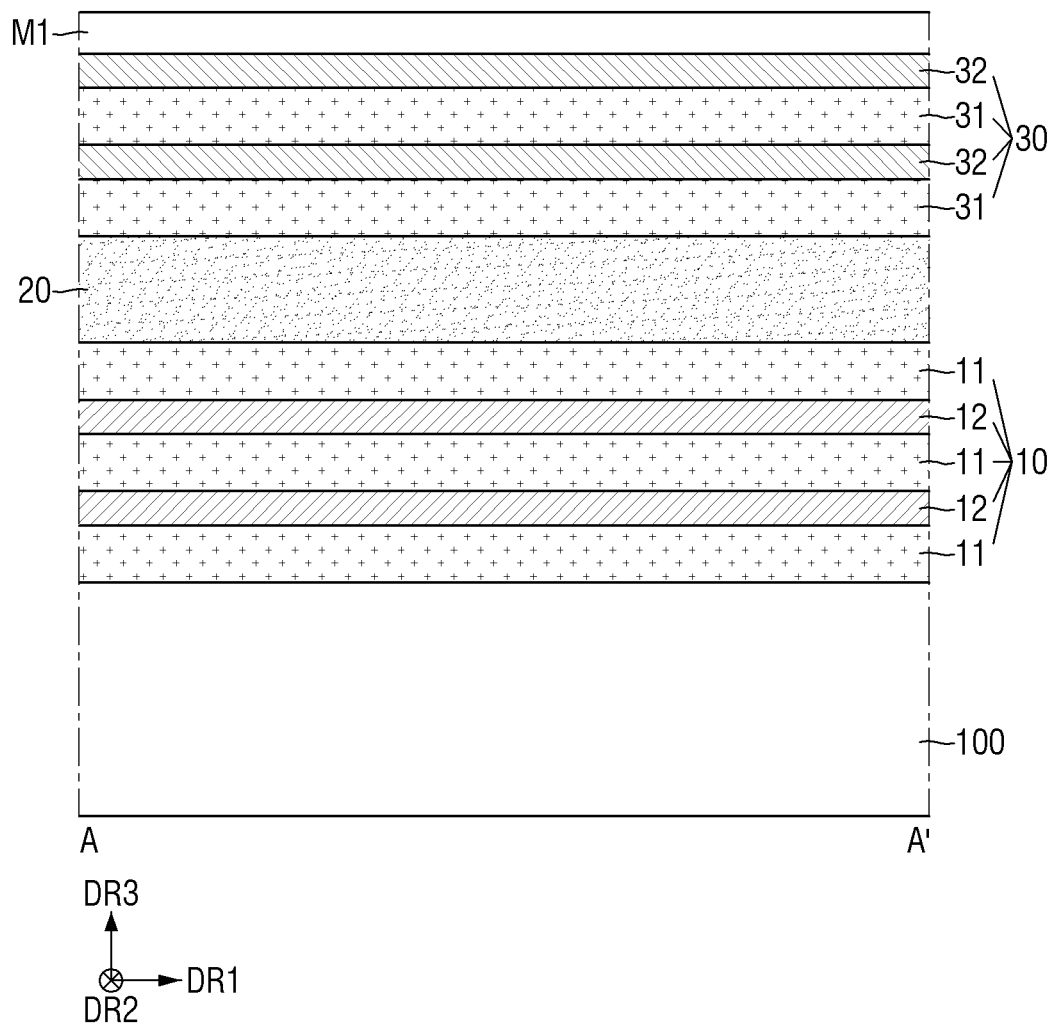
Figure 8:
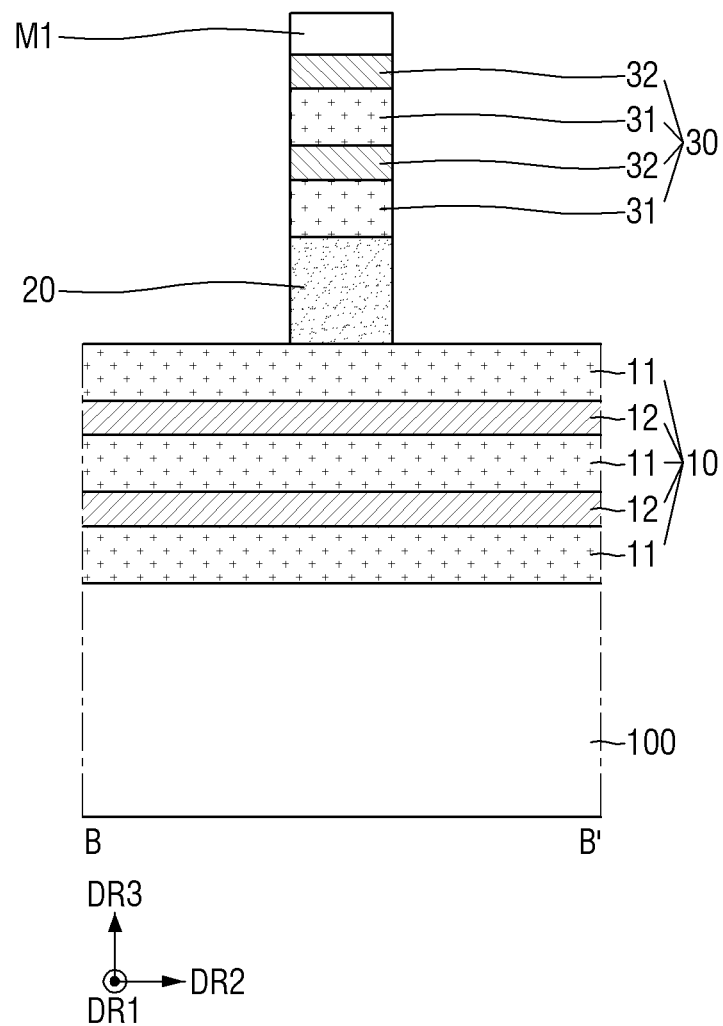
Figure 9:
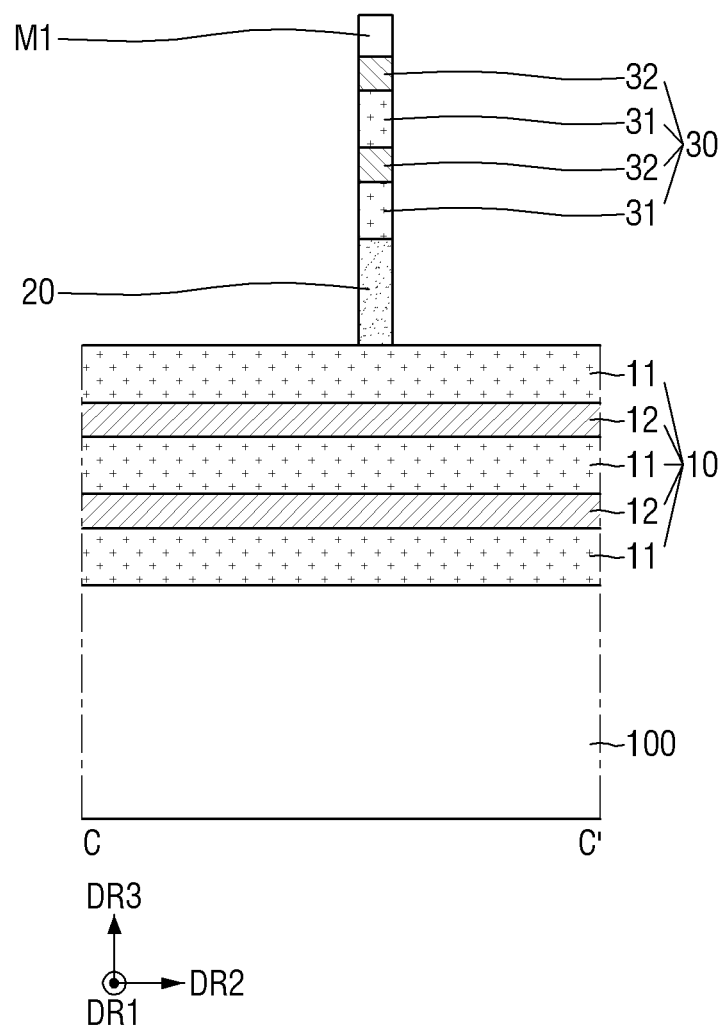

Referring to FIGS. 7 to 9, a first mask pattern M1 may be formed on the third stack structure 30. For example, a width in the second horizontal direction DR2 of the first make pattern M1 shown in FIG. 8 may be greater than a width in the second horizontal direction DR2 of the first mask pattern M1 shown in FIG. 9.

Then, the third stack structure 30 and the second sacrificial layer 20 may be etched using the first mask pattern M1 as a mask. After the etching process is complete, the widths in the second horizontal direction DR2 of the remaining third stack structure 30 and the remaining second sacrificial layer 20 shown in FIG. 8 may be, respectively, greater than the widths in the second horizontal direction DR2 of the remaining third stack structure 30 and the remaining second sacrificial layer 20 shown in FIG. 9.

Figure 10:
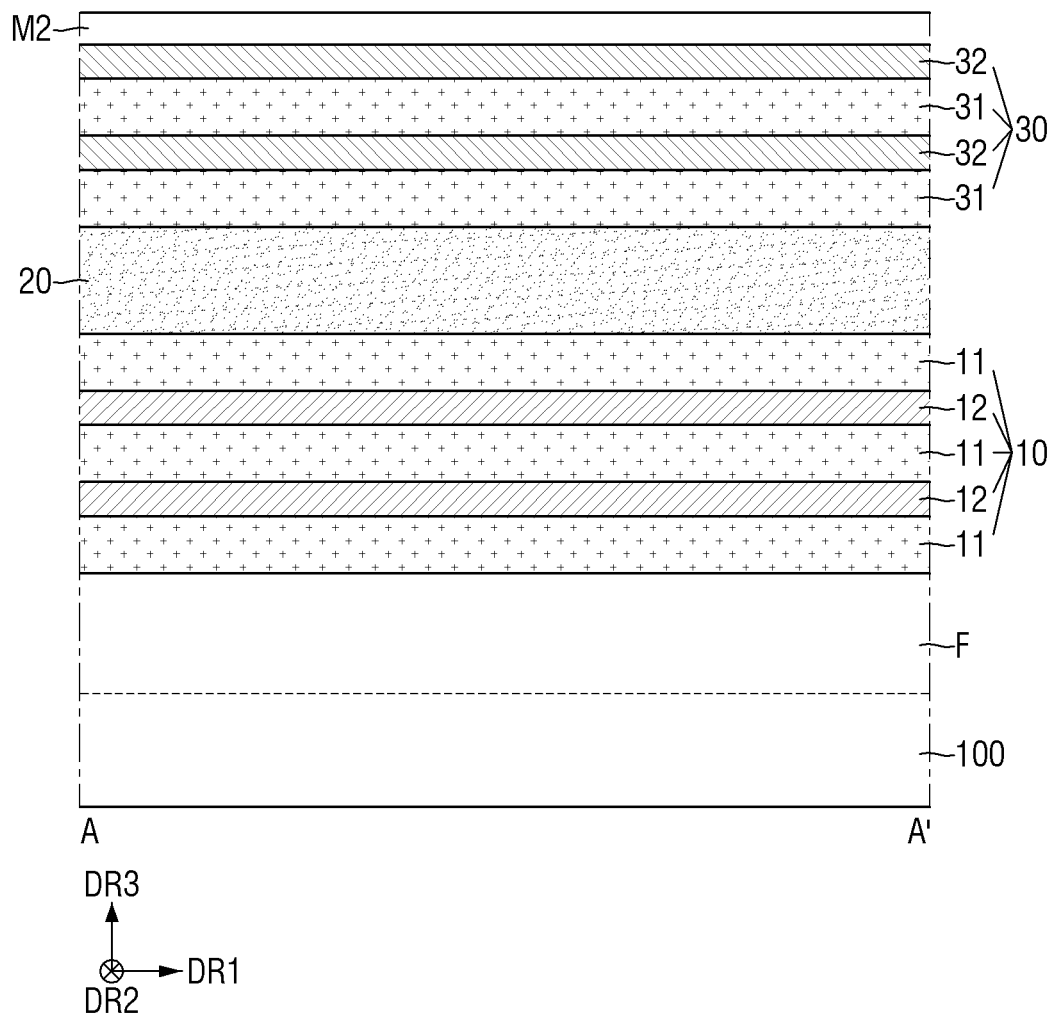
Figure 11:
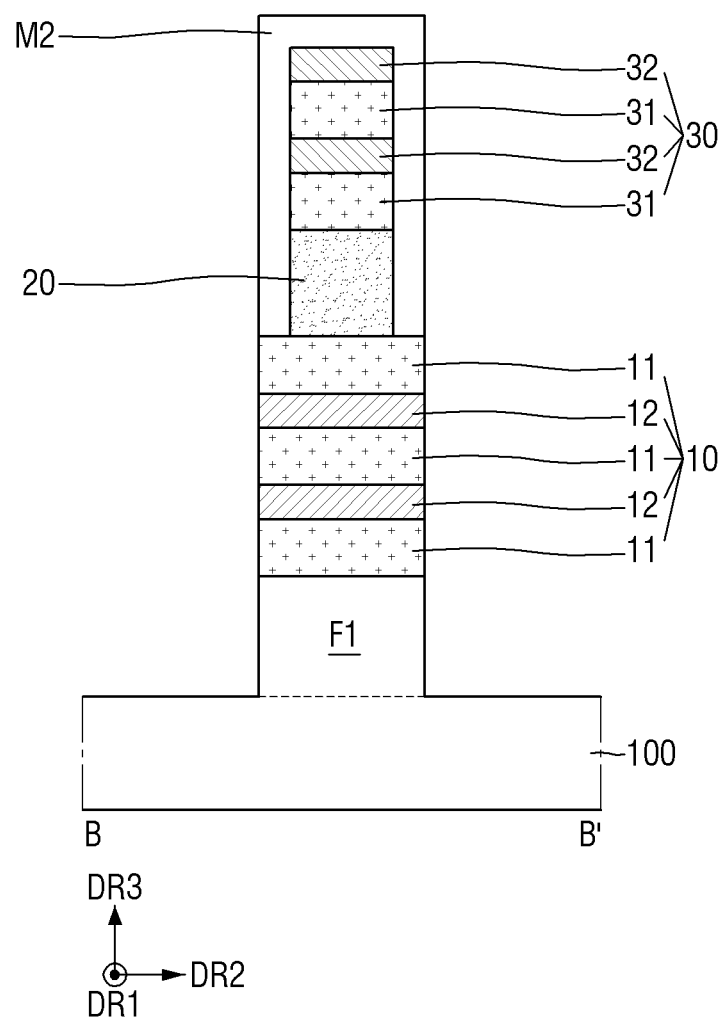
Figure 12:
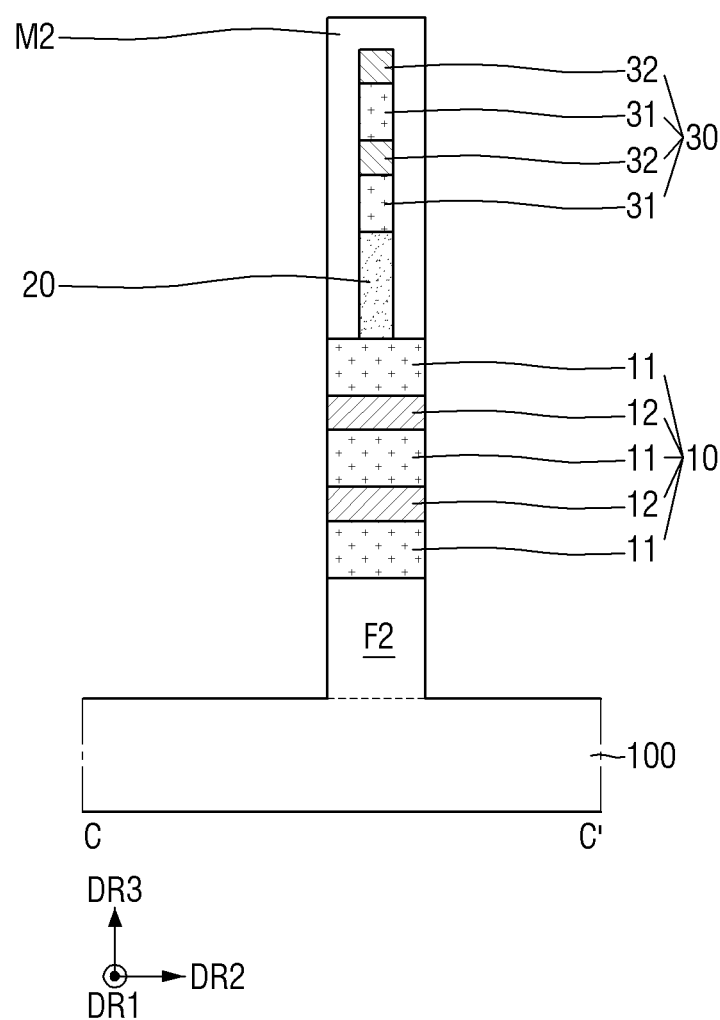

Referring to FIGS. 10 to 12, the first mask pattern M1 may be removed. Then, a second mask pattern M2 may be formed to cover sidewalls and a top surface of each of the third stack structure 30 and the second sacrificial layer 20 on the first stack structure 10. For example, a width in the second horizontal direction DR2 of the second mask pattern M2 shown in FIG. 11 may be greater than a width in the second horizontal direction DR2 of the second mask pattern M2 shown in FIG. 12.

Then, the first stack structure 10 and the substrate 100 may be partially etched using the second mask pattern M2 as a mask. After the etching process is complete, the width in the second horizontal direction DR2 of the remaining first stack structure 10 shown in FIG. 11 may be greater than the width in the second horizontal direction DR2 of the remaining first stack structure 10 shown in FIG. 12.

As a portion of the substrate 100 is etched through the etching process, an active pattern F may be defined on the substrate 100. For example, a width in the second horizontal direction DR2 of a first portion F1 of the active pattern F shown in FIG. 11 may be greater than a width in the second horizontal direction DR2 of a second portion F2 of the active pattern F shown in FIG. 12.

Figure 13:
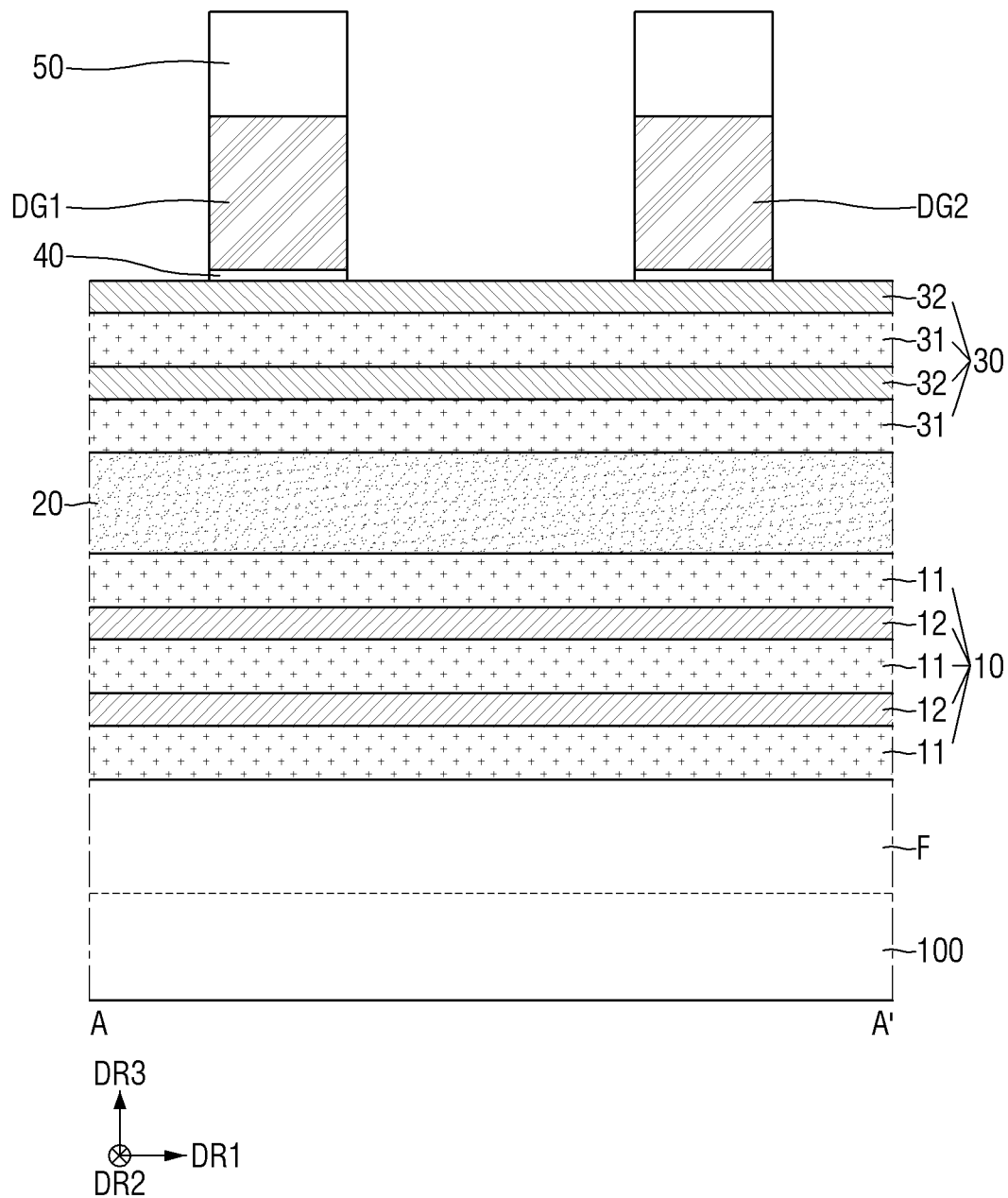
Figure 14:
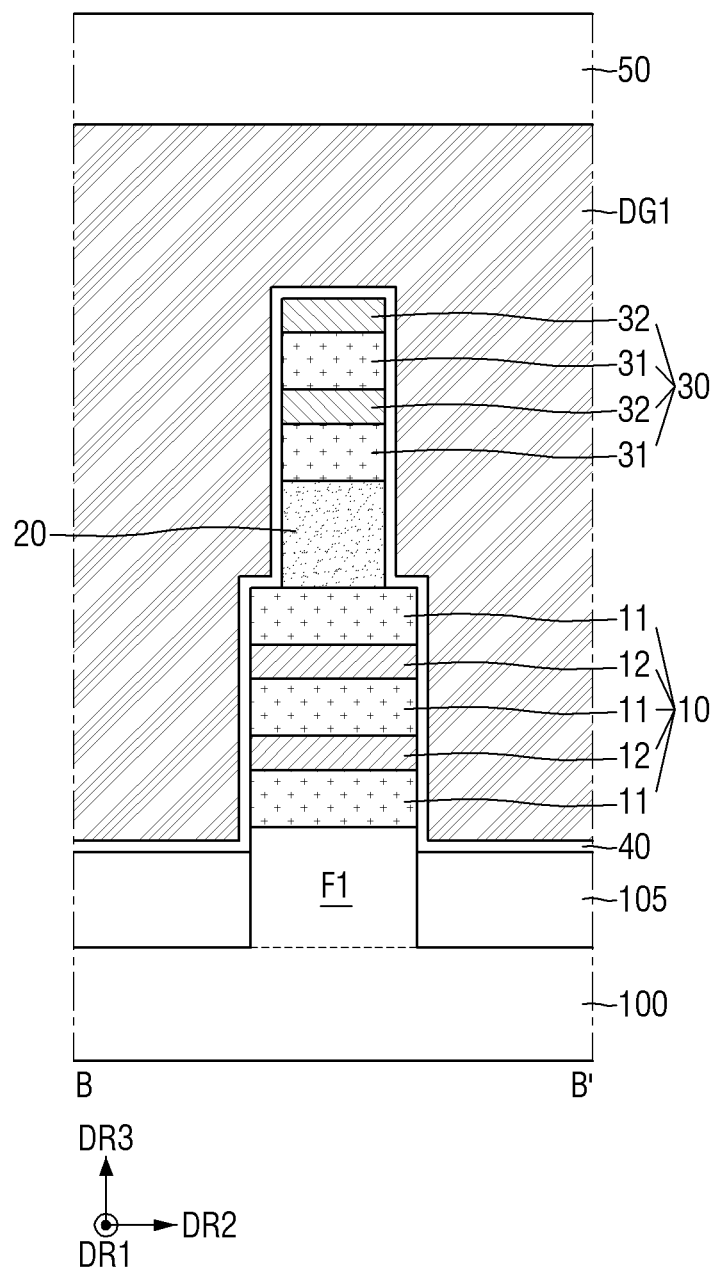
Figure 15:
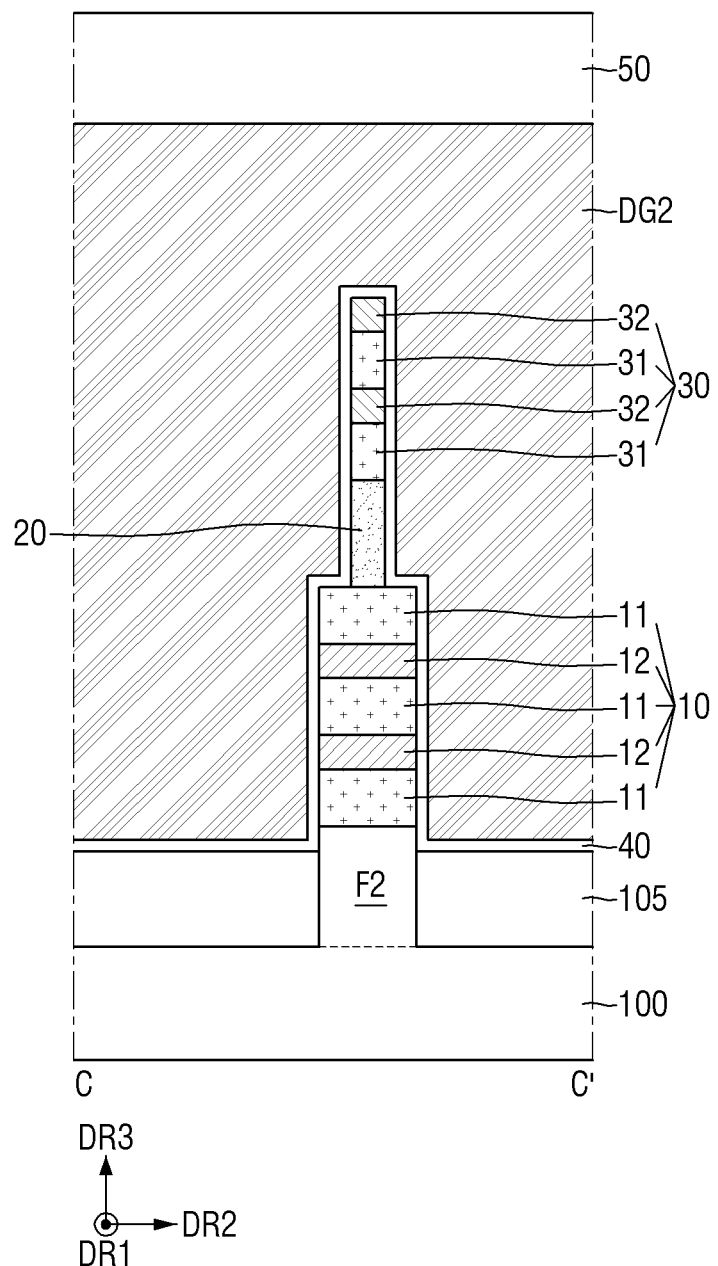

Referring to FIGS. 13 to 15, a pad oxide layer 40 may be formed to cover each of a field insulating layer 105, the first stack structure 10, the second sacrificial layer 20, and the third stack structure 30. For example, the pad oxide layer 40 may be conformally formed. The pad oxide layer 40 may include, for example, silicon oxide ($SiO_2$).

First and second dummy gates DG1 and DG2 may be formed on the pad oxide layer 40 on the field insulating layer 105, the first stack structure 10, the second sacrificial layer 20, and the third stack structure 30. The first and second dummy gates DG1 and DG2 may each extend in the second horizontal direction DR2. The second dummy gate DG2 may be spaced apart from the first dummy gate DG1 in the first horizontal direction DR1. In addition, a dummy capping pattern 50 may be formed on each of the first and second dummy gate DG1 and DG2.

For example, the pad oxide layer 40 may be removed except for a portion overlapping each of the first and second dummy gates DG1 and DG2 in the vertical direction DR3.

Figure 16:
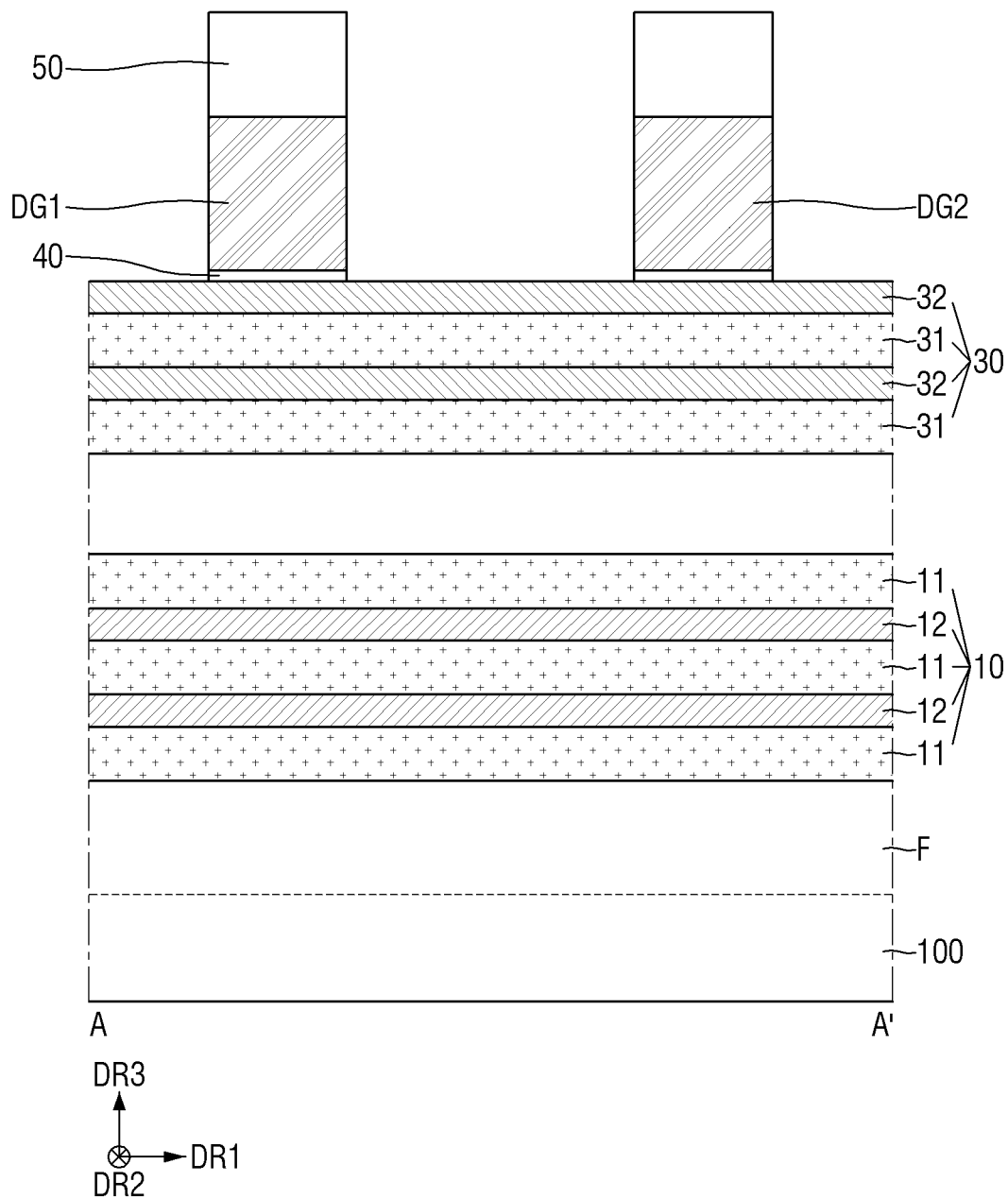
Figure 17:
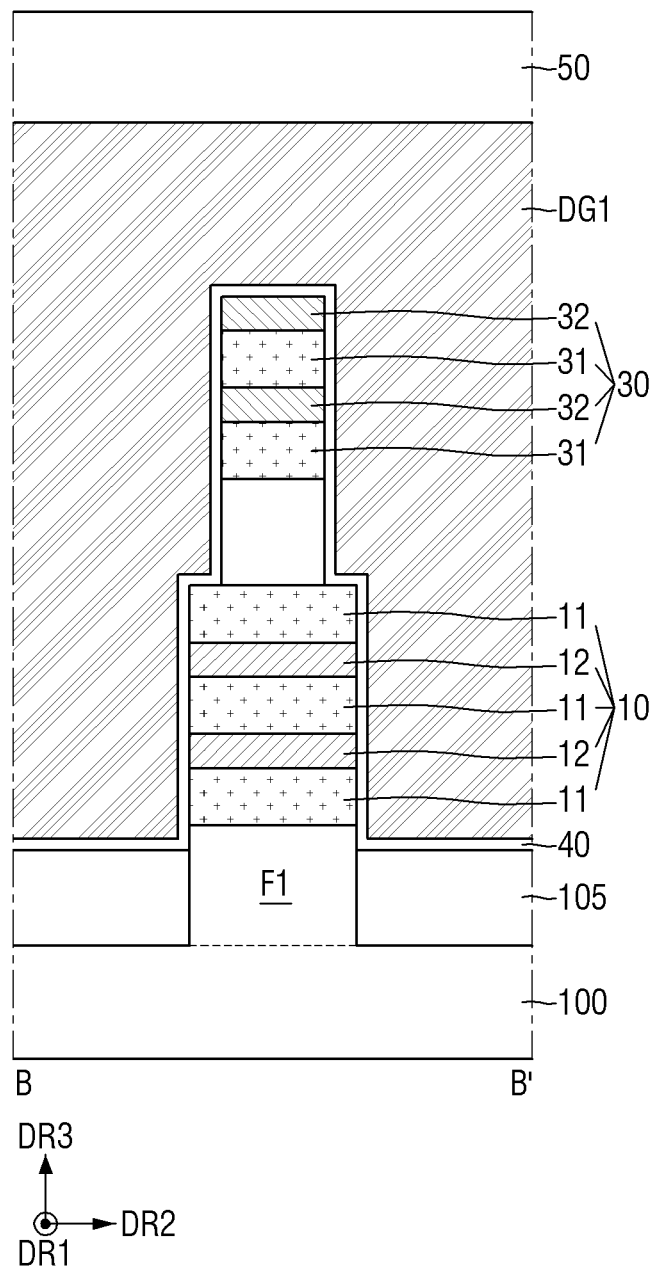
Figure 18:
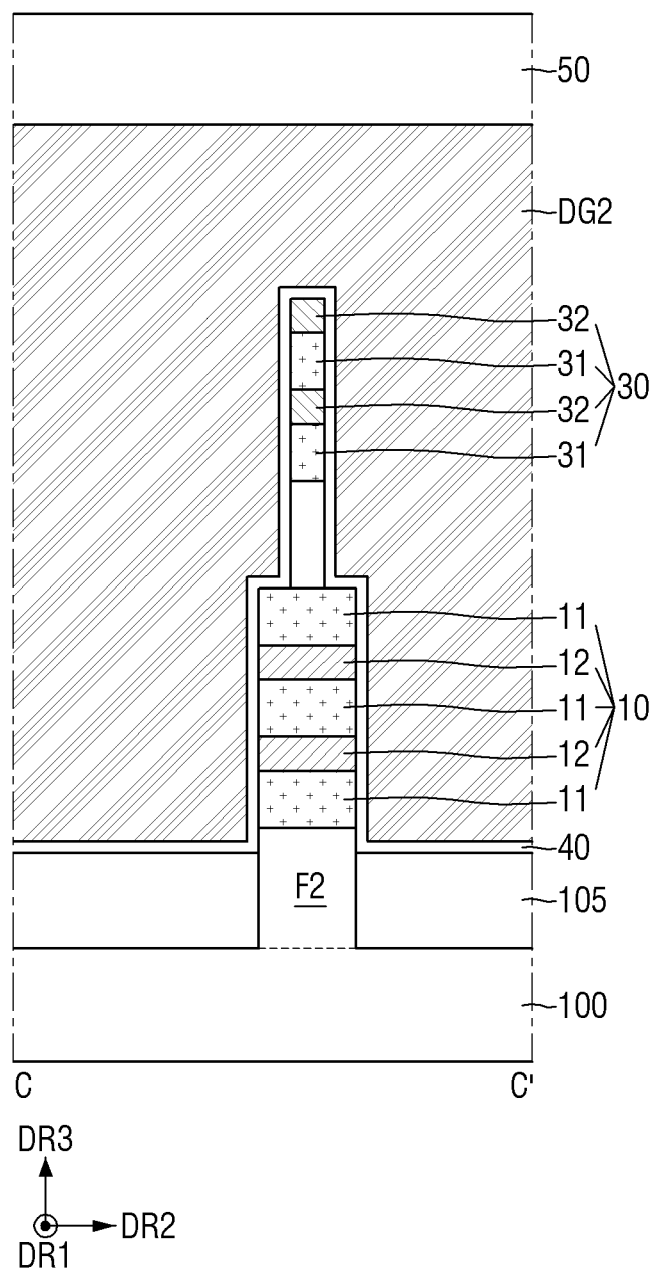

Referring to FIGS. 16 to 18, the second sacrificial layer 20 may be removed. The second sacrificial layer 20 may be removed through a wet etching process.

Figure 19:
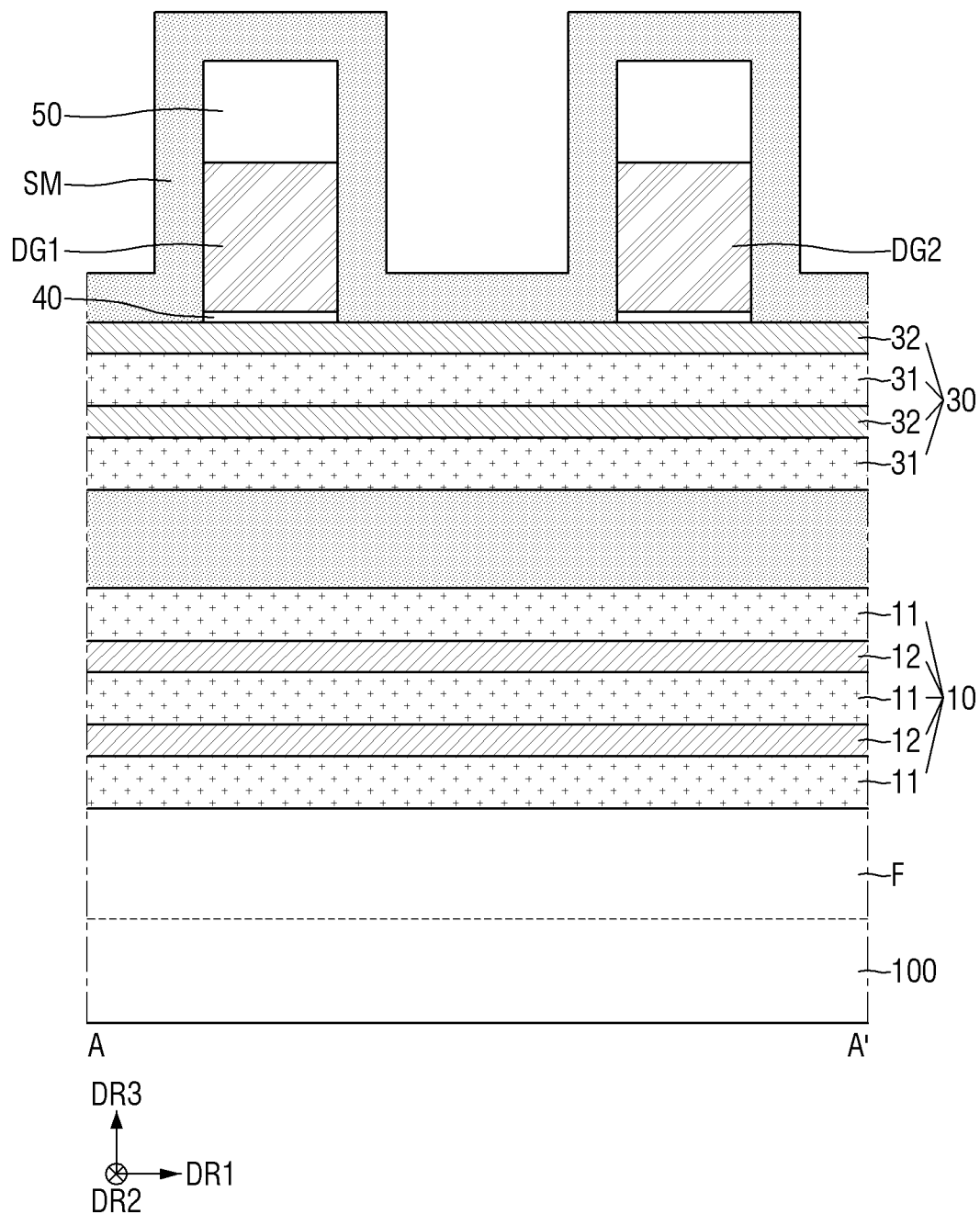
Figure 20:
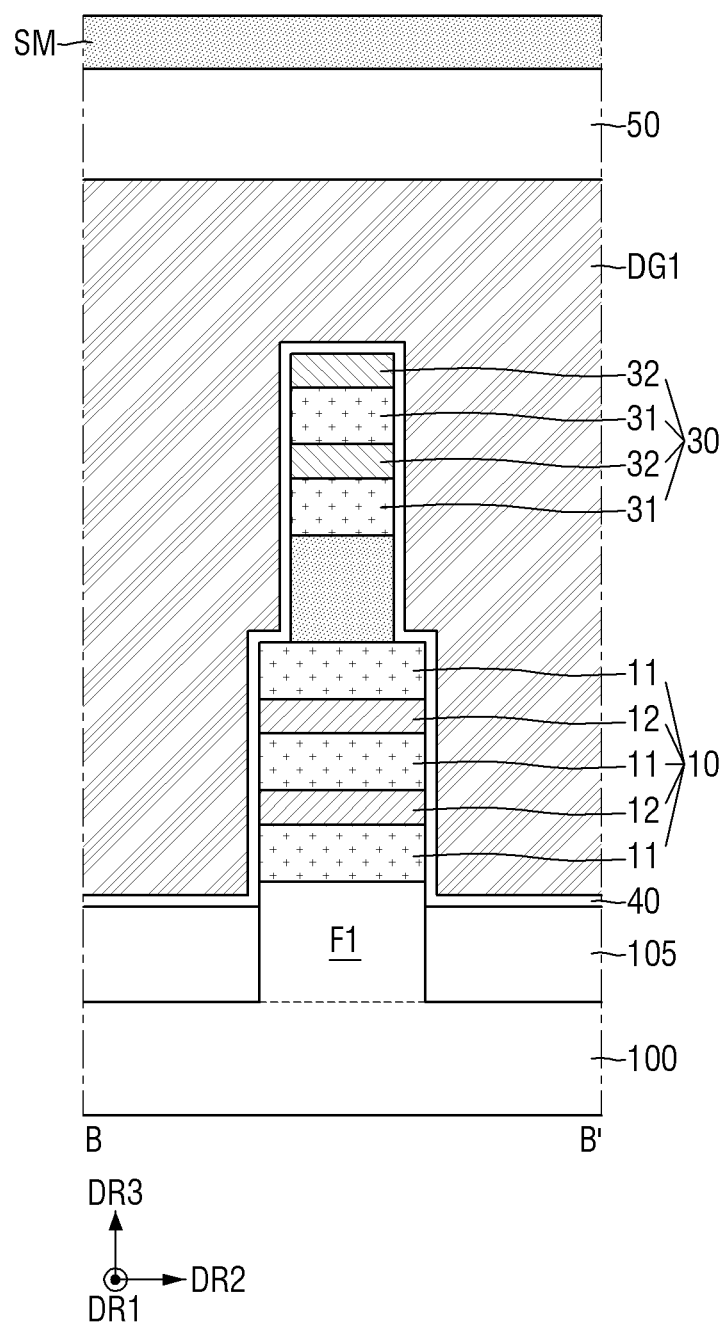
Figure 21:
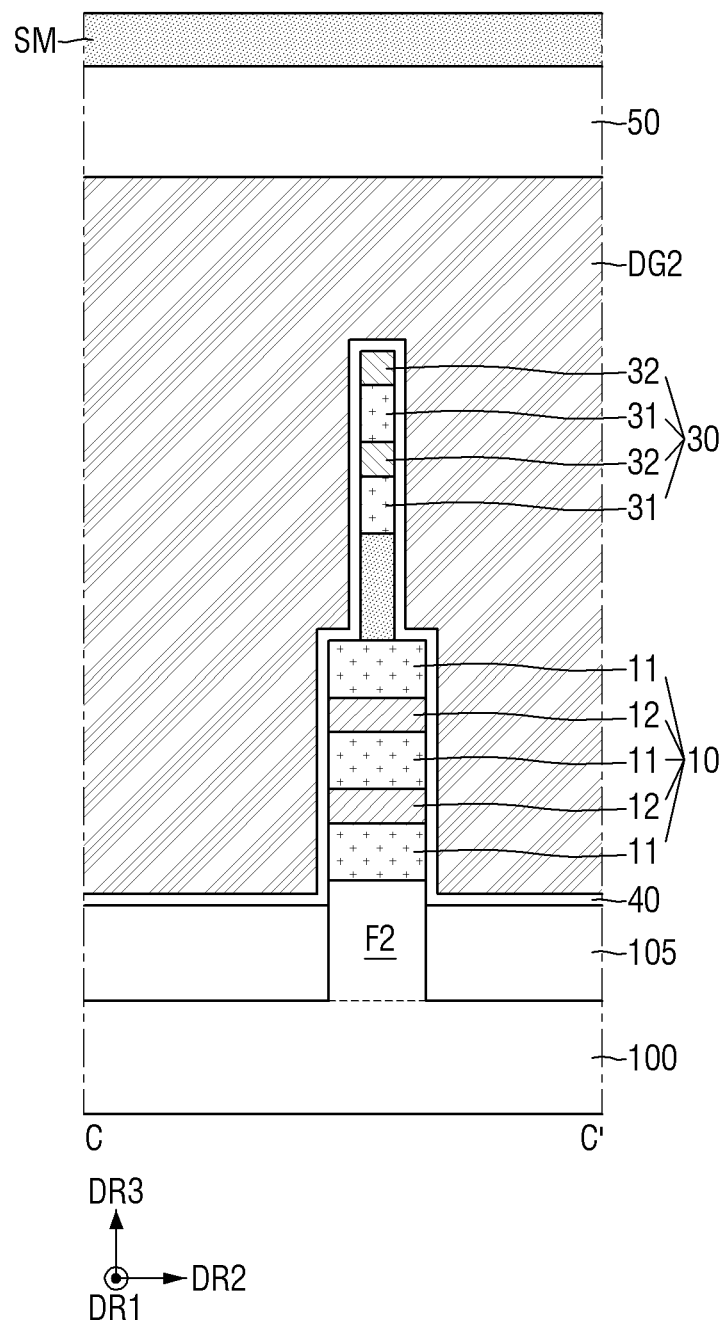

Referring to FIGS. 19 to 21, a spacer material layer SM may be formed to cover sidewalls of each of the first and second dummy gates DG1 and DG2 and sidewalls and the top surface of the dummy capping pattern 50. Although not shown, the spacer material layer SM may also be formed on an exposed top surface of the field insulating layer 105, exposed sidewalls of the first stack structure 10, and exposed sidewalls and top surface of the third stack structure 30. In addition, the spacer material layer SM may fill the portion where the second sacrificial layer 20 (FIGS. 13 to 15) is removed. For example, the spacer material layer SM may be conformally formed. The spacer material layer SM may include or may be formed of, for example, at least one of silicon nitride (SiN), silicon oxycarbonitride (SiOCN), silicon boron carbonitride (SiBCN), silicon carbonitride (SiCN), silicon oxynitride (SiON), or combinations thereof.

Figure 22:
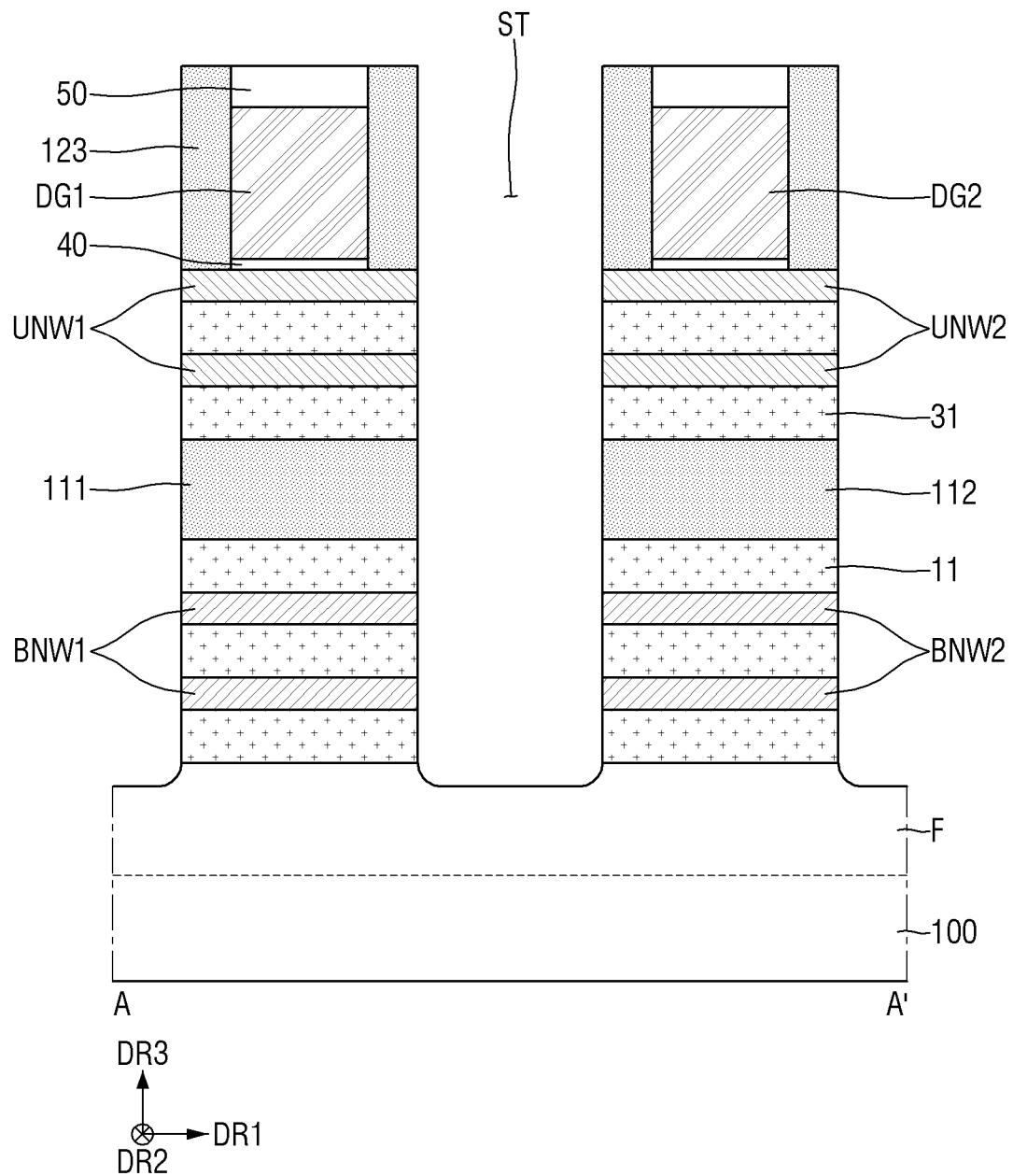

Referring to FIG. 22, the first stack structure 10 (FIGS. 19 to 21), the third stack structure 30 (FIGS. 19 to 21), and the spacer material layer SM (FIGS. 19 to 21) between the first stack structure 10 and the third stack structure 30 may be etched using the dummy capping patterns 50 and the first and second dummy gates DG1 and DG2 as a mask, so that a source/drain trench ST may be formed. For example, the source/drain trench ST may extend into the active pattern F. That is, the source/drain trench ST may be formed between the first dummy gate DG1 and the second dummy gate DG2 on the active pattern F.

The spacer material layer SM (FIGS. 19 to 21) formed on the dummy capping pattern 50 and the dummy capping pattern 50 may be partially removed while the source/drain trench ST is being formed. The first and second dummy gates DG1 and DG2 and the spacer material layer SM (FIGS. 19 to 21) remaining on the sidewalls of each of the dummy capping patterns 50 may be defined as gate spacers 123.

After the source/drain trench ST is formed, the first semiconductor layers 12 (FIGS. 19 to 21) and the second semiconductor layers 32 (FIGS. 19 to 21) remaining under the first dummy gate DG1 may be defined as a first plurality of lower nanosheets BNW1 and a first plurality of upper nanosheets UNW1, respectively. In addition, the first semiconductor layers 12 (FIGS. 19 to 21) and the second semiconductor layers 32 (FIGS. 19 to 21) remaining under the second dummy gate DG2 may be defined as a second plurality of lower nanosheets BNW2 and a second plurality of upper nanosheets UNW2, respectively.

Also, after the source/drain trench ST is formed, the spacer material layer SM (FIGS. 19 to 21) remaining under the first dummy gate DG1 may be defined as a first separation layer 111, and the spacer material layer SM remaining under the second dummy gate DG2 may be defined as a second separation layer 112. That is, the first separation layer 111 may be formed between the first plurality of lower nanosheets BNW1 and the first plurality of upper nanosheets UNW1, and the second separation layer 112 may be formed between the second plurality of lower nanosheets BNW2 and the second plurality of upper nanosheets UNW2.

Figure 23:
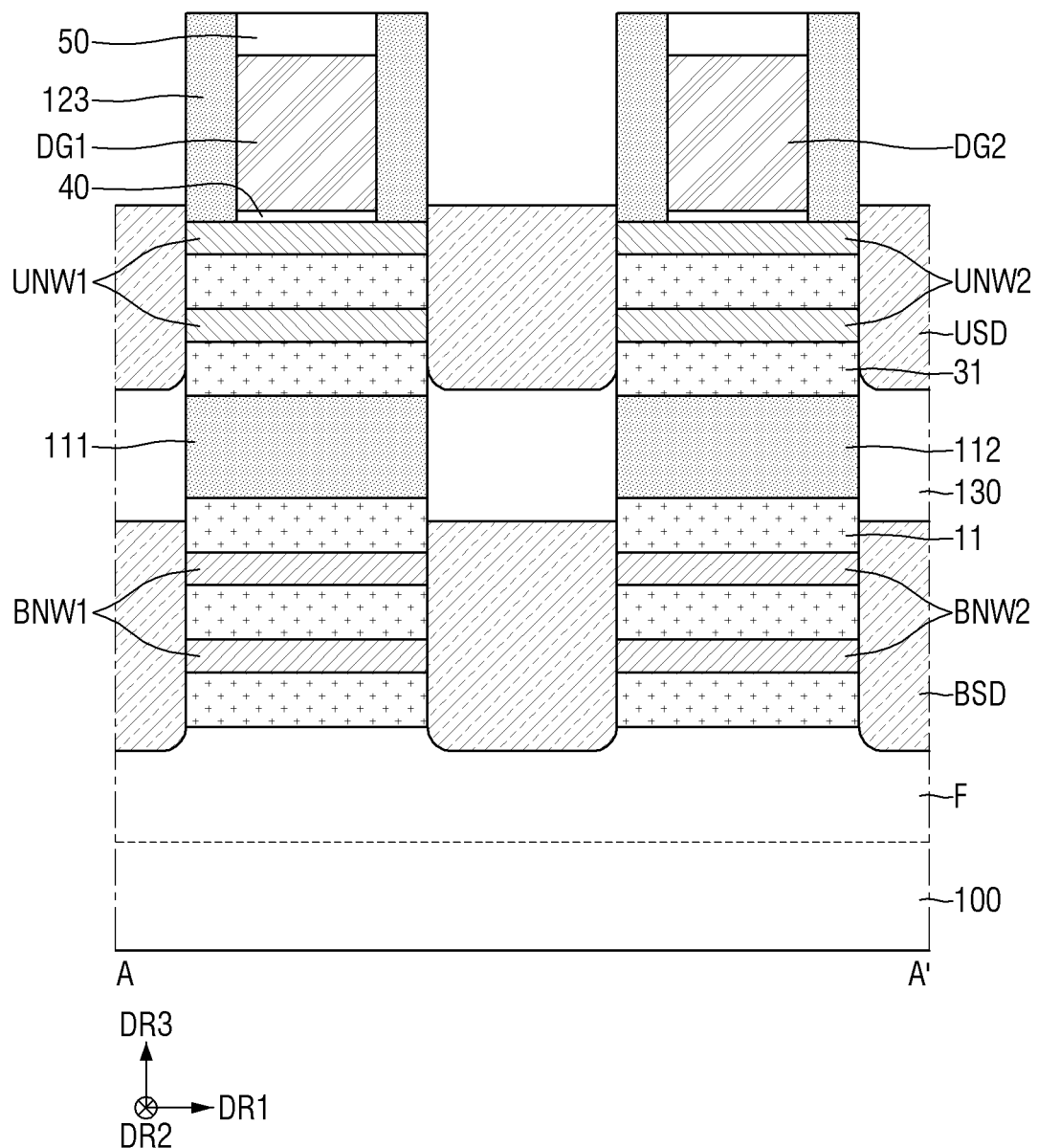

Referring to FIG. 23, a lower source/drain region BSD, a first interlayer insulating layer 130, and an upper source/drain region USD may be sequentially formed in the source/drain trench ST (FIG. 22).

For example, the lower source/drain region BSD may be formed on sidewalls of each of the first and second plurality of lower nanosheets BNW1 and BNW2 inside the source/drain trench ST (FIG. 22). For example, the top surface of the lower source/drain region BSD may be formed lower than a bottom surface of each of the first separation layer 111 and the second separation layer 112.

Then, the first interlayer insulating layer 130 may be formed to cover the lower source/drain region BSD. Then, the first interlayer insulating layer 130 may be partially etched to expose the sidewalls of each of the first and second plurality of upper nanosheets UNW1 and UNW2. Thereafter, the upper source/drain region USD may be formed on the sidewalls of each of the first and second plurality of upper nanosheets UNW1 and UNW2 inside the source/drain trench ST (FIG. 22).

Figure 24:
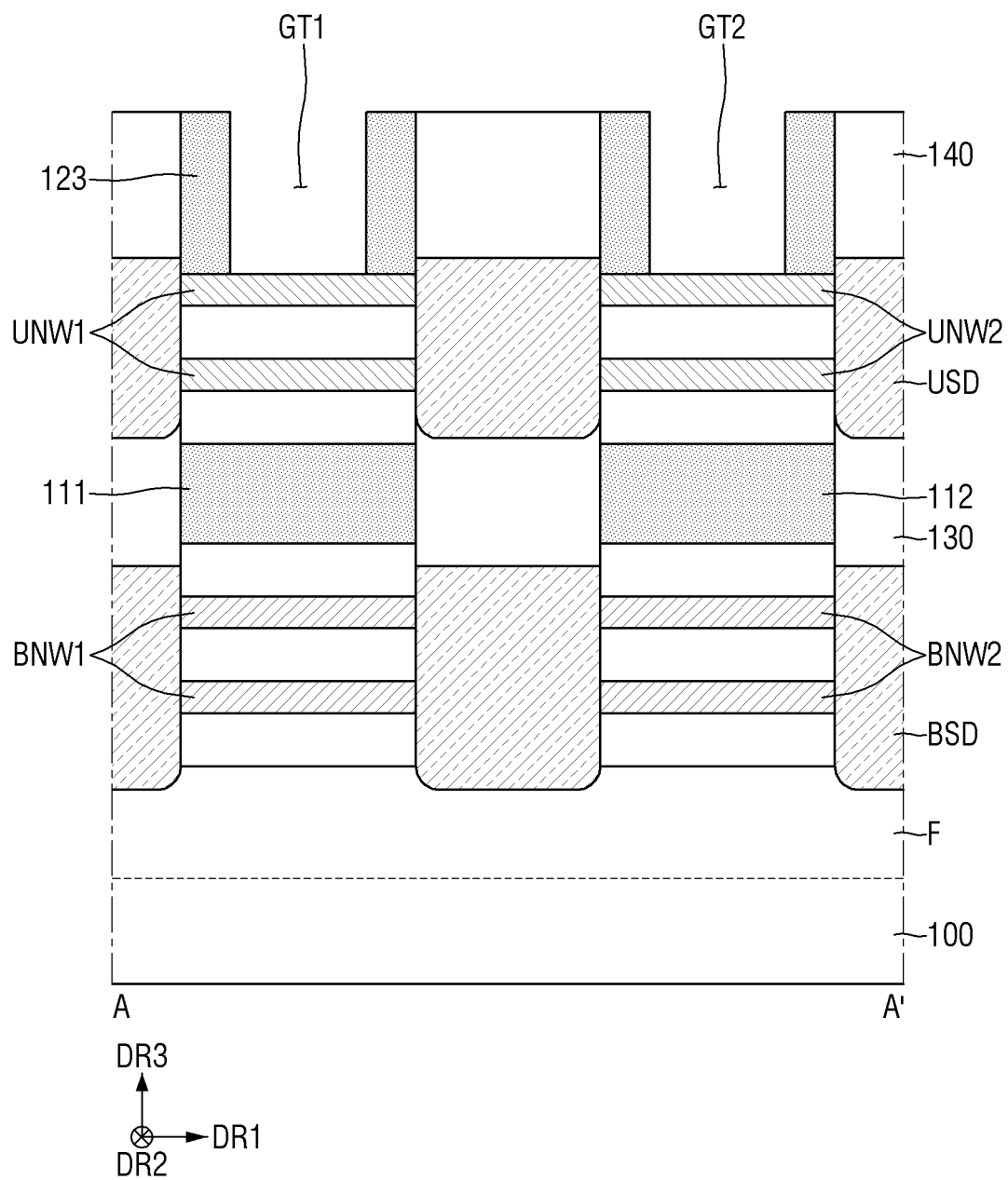
Figure 25:
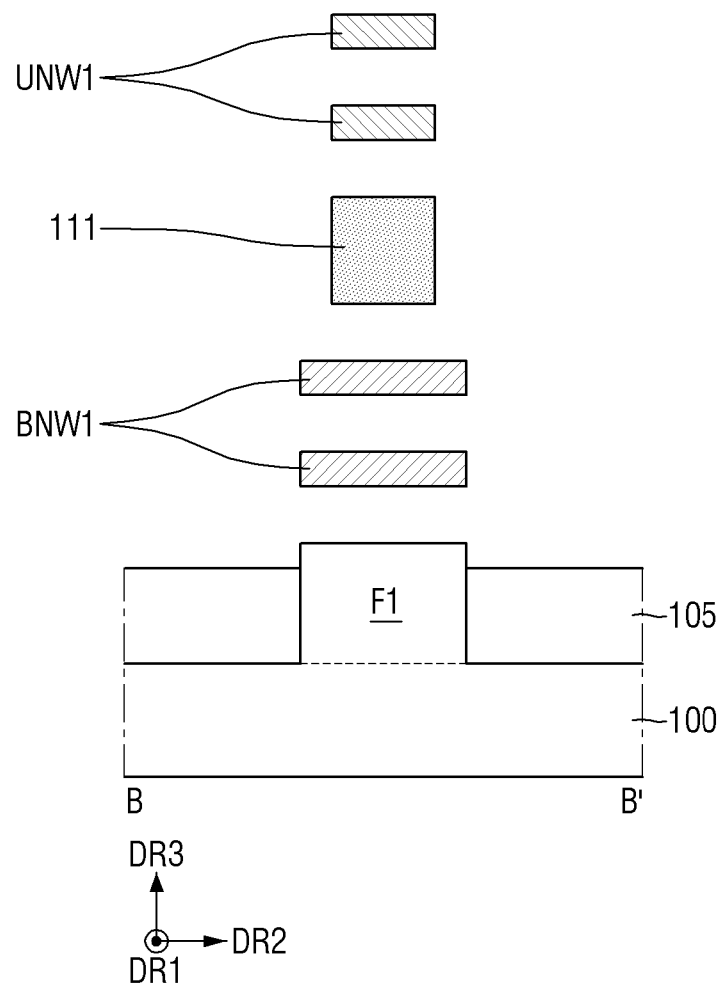
Figure 26:
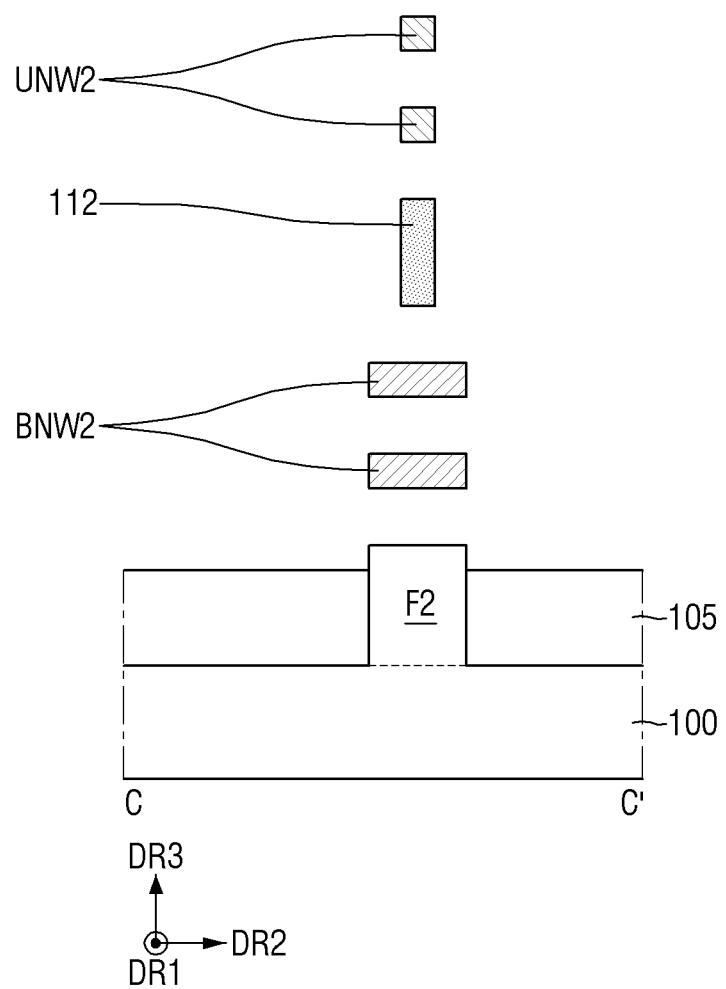

Referring to FIGS. 24 to 26, a second interlayer insulating layer 140 may be formed to cover each of the upper source/drain region USD, the gate spacers 123 and the dummy capping patterns 50 (FIG. 23). Then, the top surface of each of the first and second dummy gates DG1 and DG2 (FIG. 23) may be exposed through a planarization process. Then, the first and second dummy gates DG1 and DG2 (FIG. 23), the pad oxide layer 40 (FIG. 23), the first sacrificial layer 11 (FIG. 23), and the third sacrificial layer 31 (FIG. 23) may each be removed. A portion where the first dummy gate DG1 (FIG. 23) is removed may be defined as a first gate trench GT1 and a portion where the second dummy gate DG2 (FIG. 23) is removed may be defined as a second gate trench GT2.

Figure 27:
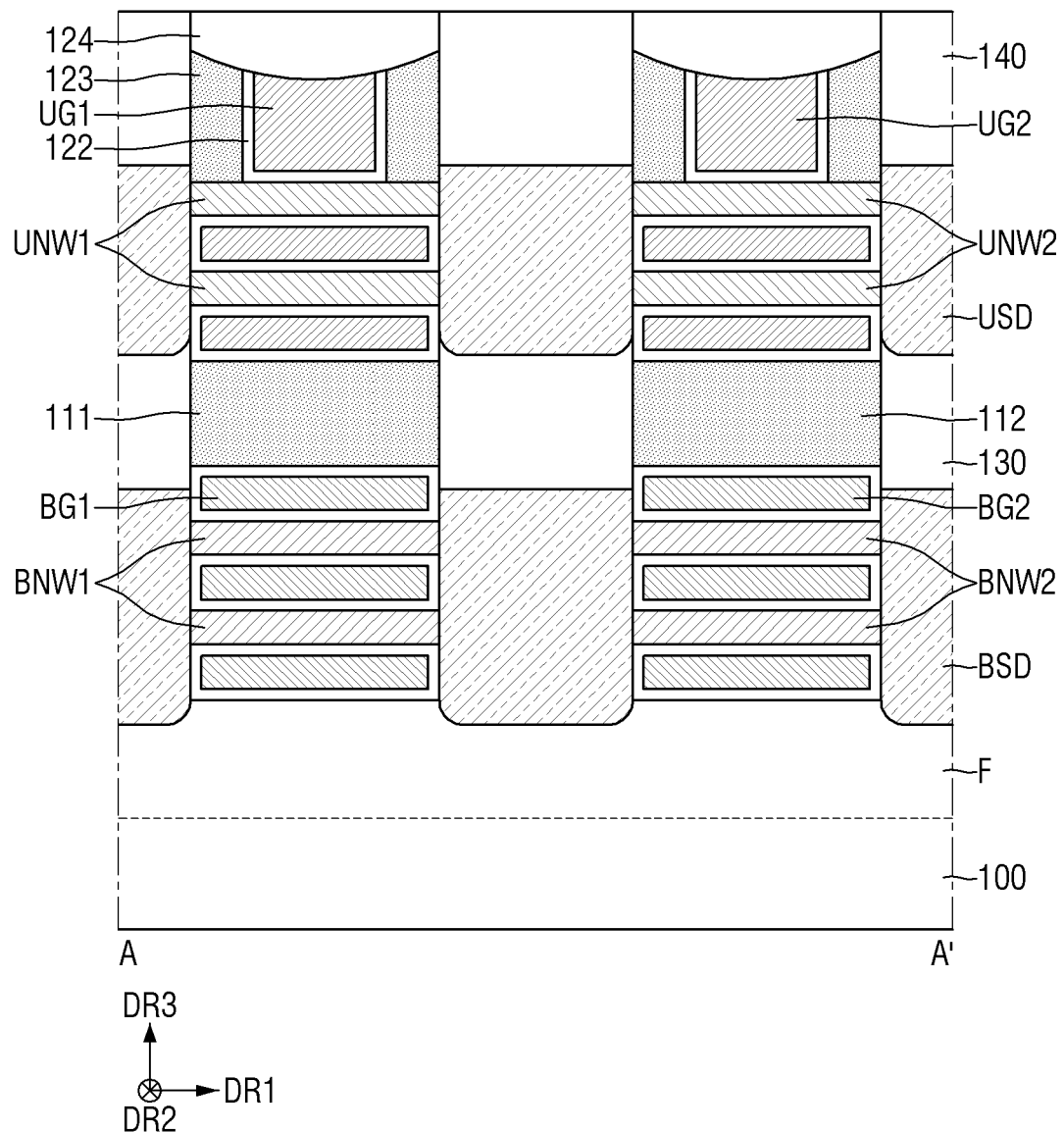
Figure 28:
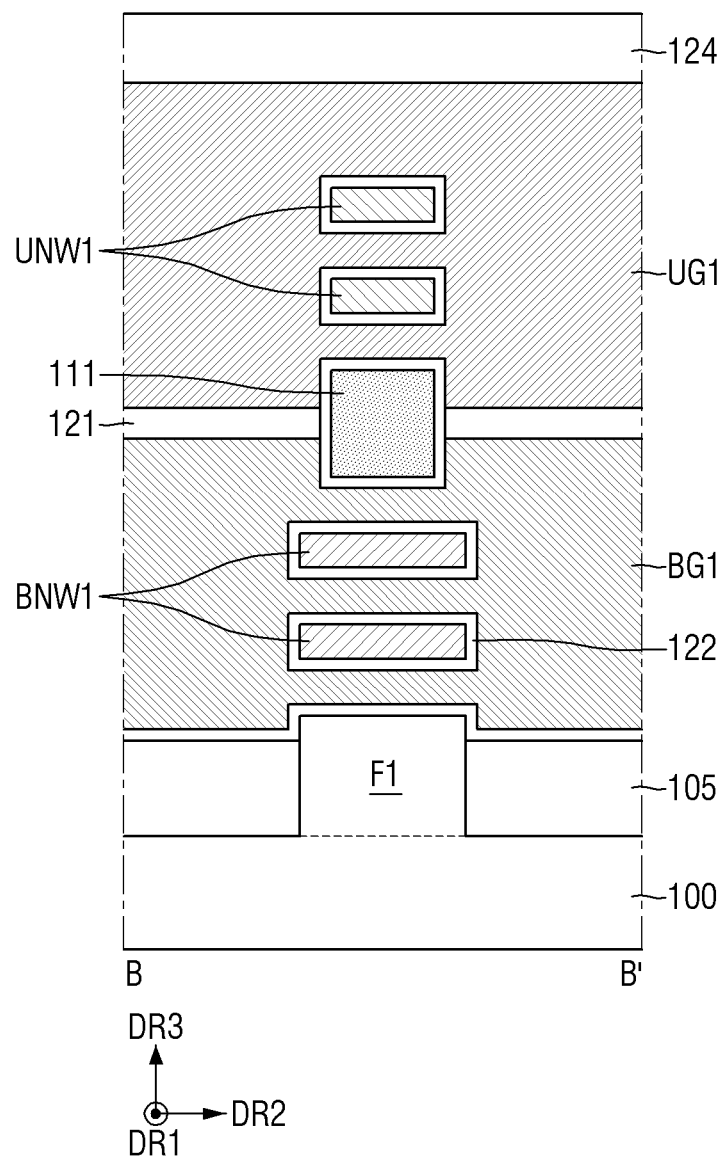
Figure 29:
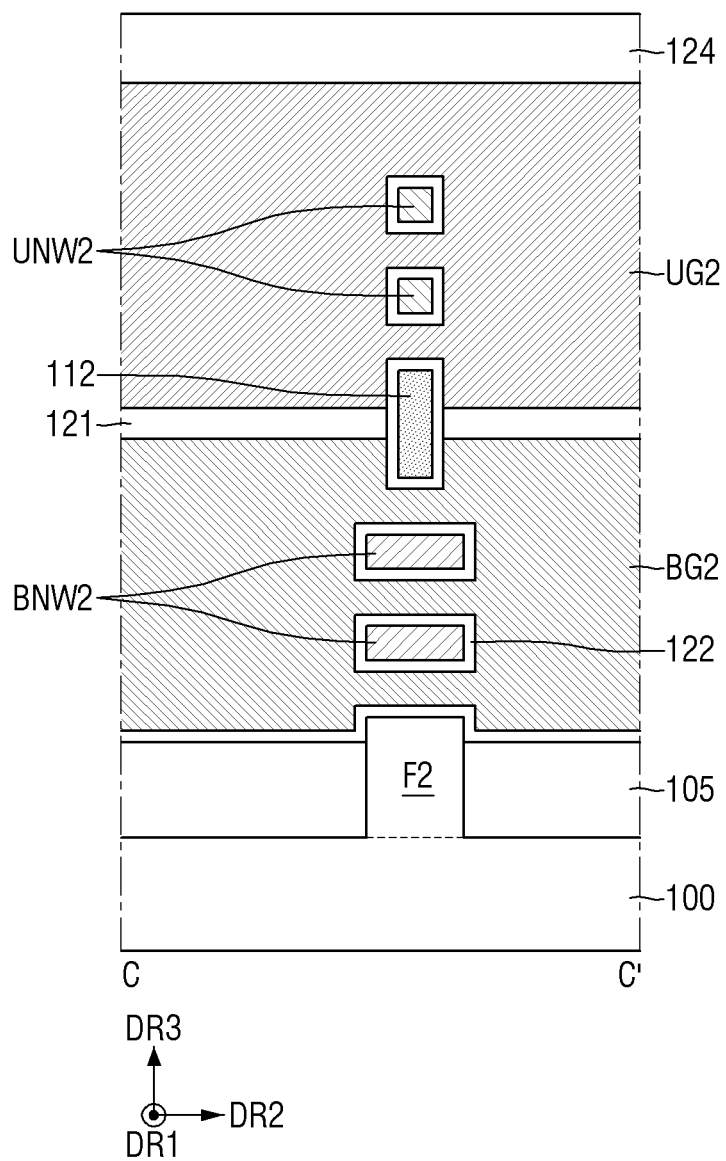

Referring to FIGS. 27 to 29, gate insulating layers 122 may be formed at portions from which each of the first and second dummy gates DG1 and DG2 (FIG. 23), the first sacrificial layer 11 (FIG. 23), and the third sacrificial layer 31 (FIG. 23) is removed. For example, the gate insulating layer 122 may be conformally formed.

Then, a first lower gate electrode BG1 surrounding the first plurality of lower nanosheets BNW1 and a second lower gate electrode BG2 surrounding the second plurality of lower nanosheets BNW2 may be formed at a region overlapping the first gate trench GT1 (FIG. 24) in the vertical direction DR3. Here, a gate separation layer 121 may be formed on each of the first lower gate electrode BG1 and the second lower gate electrode BG2.

Then, first and second upper gate electrodes UG1 and UG2 may be formed on each gate separation layer 121. For example, a first upper gate electrode UG1 surrounding the first plurality of upper nanosheets UNW1 and a second upper gate electrode UG2 surrounding the second plurality of upper nanosheets UNW2 may be formed in the first gate trench GT1 (FIG. 24) and at a region overlapping the first gate trench GT1 in the vertical direction DR3. Then, a capping pattern 124 may be formed on each of the first and second upper gate electrodes UG1 and UG2.

Referring to FIGS. 2 to 4, the source/drain contact CA which penetrates the second interlayer insulating layer 140 in the vertical direction DR3 and is connected to the upper source/drain region USD may be formed. A silicide layer 150 may be formed between the upper source/drain region USD and the source/drain contact CA. Also, a first gate contact CB1 which penetrates the capping pattern 124 in the vertical direction DR3 and is electrically connected to the first upper gate electrode UG1 may be formed, and a second gate contact CB2 which penetrates the capping pattern 124 in the vertical direction DR3 and is electrically connected to the second upper gate electrode UG2 may be formed.

Then, an etch stop layer 160 and a third interlayer insulating layer 170 may be sequentially formed on each of the second interlayer insulating layer 140, the capping pattern 124, the source/drain contact CA, and the first and second gate contacts CB1 and CB2. Then, a first via V1, a second via V2, and a third via V3 that penetrate the third interlayer insulating layer 170 and the etch stop layer 160 in the vertical direction DR3 and are electrically connected to first gate contact CB1, the second gate contact CB2, and the source/drain contact CA, respectively, may be formed. Through the above manufacturing process, the semiconductor device shown in FIGS. 2 to 4 may be manufactured.

Hereinafter, a semiconductor device according to some other embodiments of the present disclosure will be described with reference to FIGS. 30 and 31. A description will be given focusing on differences from the semiconductor device shown in FIGS. 1 to 4.

Figure 30:
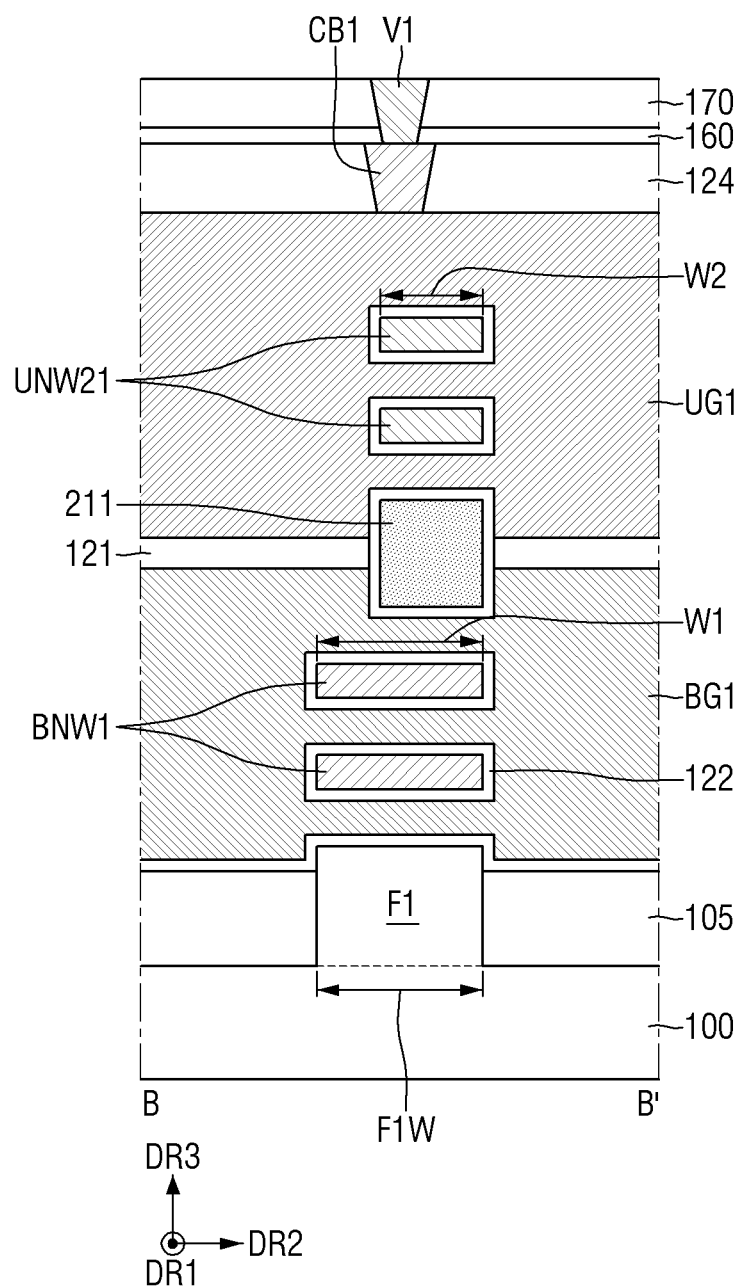
FIGS. 30 and 31 are views for describing a method of a semiconductor device according to some other embodiments of the present disclosure.
Figure 31:
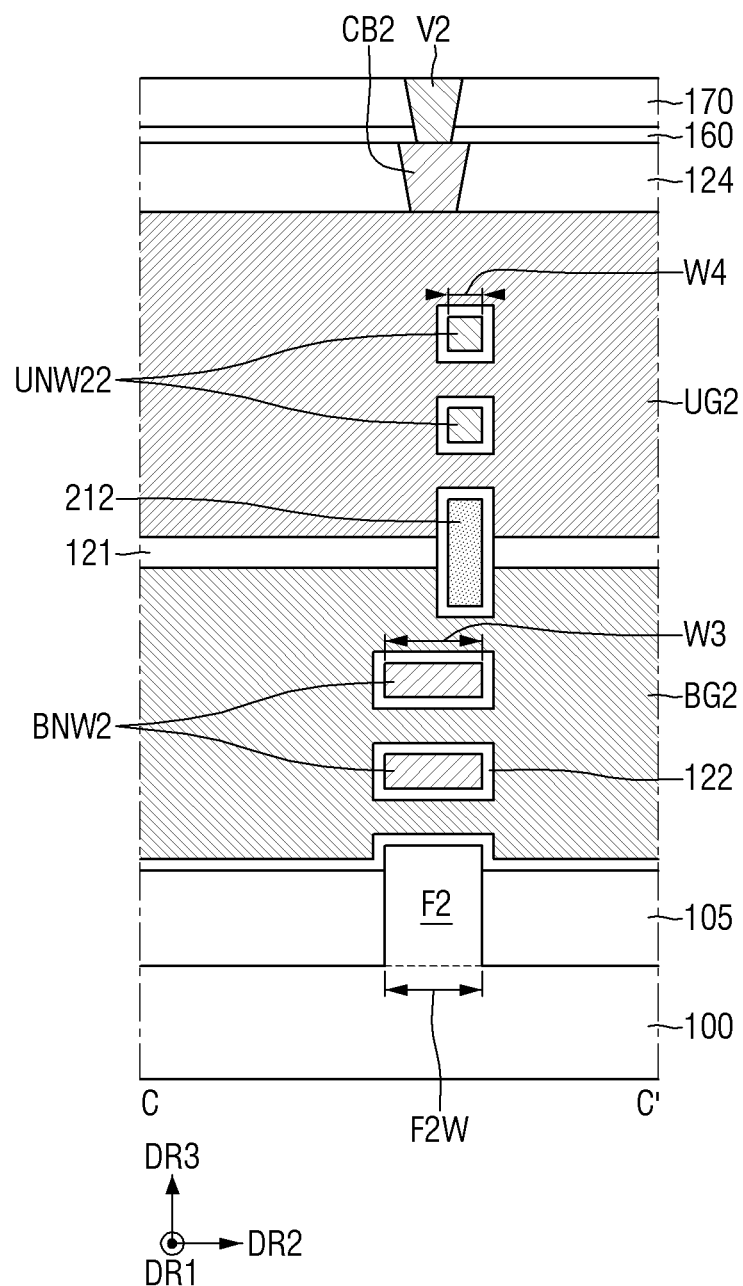

FIGS. 30 and 31 are views for describing a method of a semiconductor device according to some other embodiments of the present disclosure.

Referring to FIGS. 30 and 31, in a semiconductor device according to some other embodiments of the present disclosure, a first sidewall in the second horizontal direction DR2 of each of a first plurality of lower nanosheets BNW1 and a first sidewall in the second horizontal direction DR2 of each of a first plurality of upper nanosheets UNW21 may be aligned in the vertical direction DR3. Also, a first sidewall in the second horizontal direction DR2 of each of a second plurality of lower nanosheets BNW2 and a first sidewall in the second horizontal direction DR2 of each of a second plurality of upper nanosheets UNW22 may be aligned in the vertical direction DR3.

A first sidewall in the second horizontal direction DR2 of a first separation layer 211 may be aligned in the vertical direction DR3 with a first sidewall in the second direction DR2 of each of the first plurality of lower nanosheets BNW1 and a first sidewall in the second horizontal direction DR2 of each of the first plurality of upper nanosheets UNW21. A first sidewall in the second horizontal direction DR2 of a second separation layer 212 may be aligned in the vertical direction DR3 with a first sidewall in the second direction DR2 of each of the second plurality of lower nanosheets BNW2 and a first sidewall in the second horizontal direction DR2 of each of the second plurality of upper nanosheets UNW22.

A first sidewall in the second horizontal direction DR2 of each of the first plurality of upper nanosheets UNW21 and a first sidewall in the second horizontal direction DR2 of each of the second plurality of upper nanosheets UNW22 may be aligned in the first horizontal direction DR1. A second sidewall in the second horizontal direction DR2 of each of the first plurality of upper nanosheets UNW21 and a second sidewall in the second horizontal direction DR2 of each of the second plurality of upper nanosheets UNW22 may not be aligned in the first horizontal direction DR1. Here, each of second sidewalls may be defined as a sidewall facing a corresponding first sidewall in the second horizontal direction DR2. Hereinafter, the same definition of the second sidewall is applied.

A semiconductor device according to some other embodiments of the present disclosure will be described hereinafter with reference to FIGS. 32 and 33. A description will be given focusing on differences from the semiconductor device shown in FIGS. 1 to 4.

Figure 32:
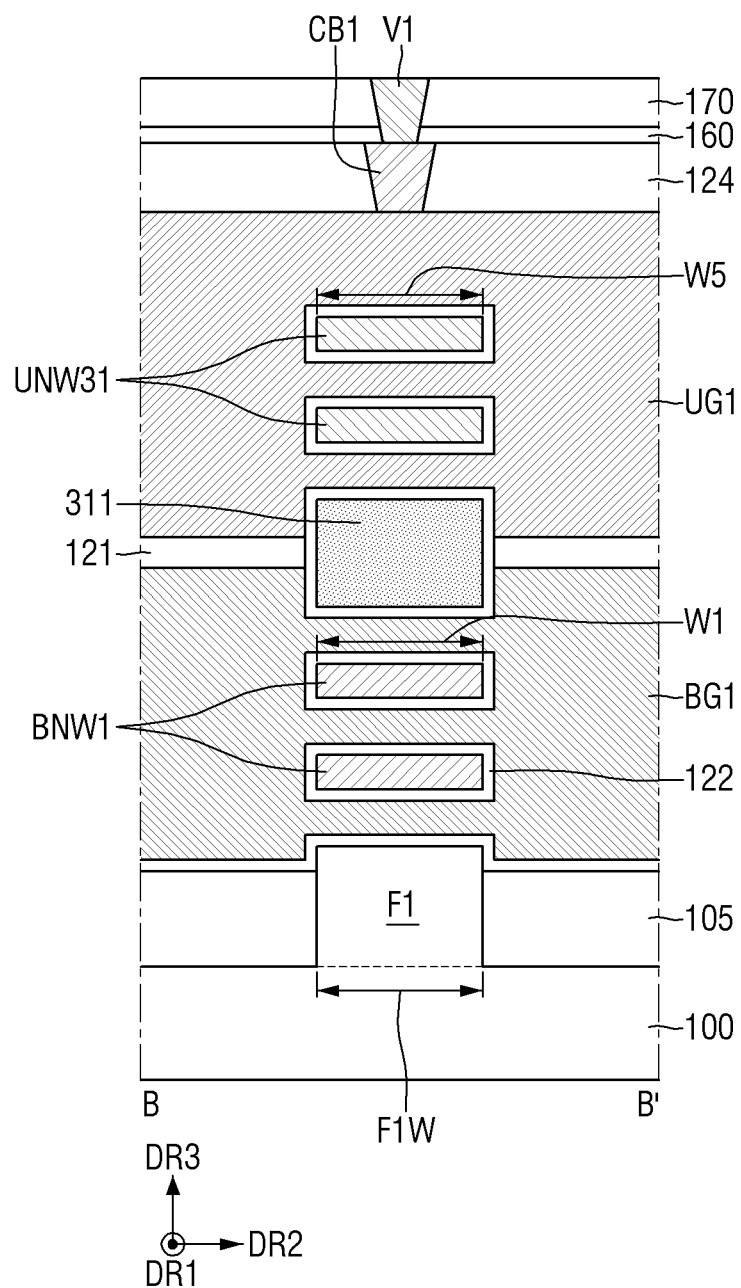
FIGS. 32 and 33 are views for describing a method of manufacturing a semiconductor device according to some other embodiments of the present disclosure.
Figure 33:
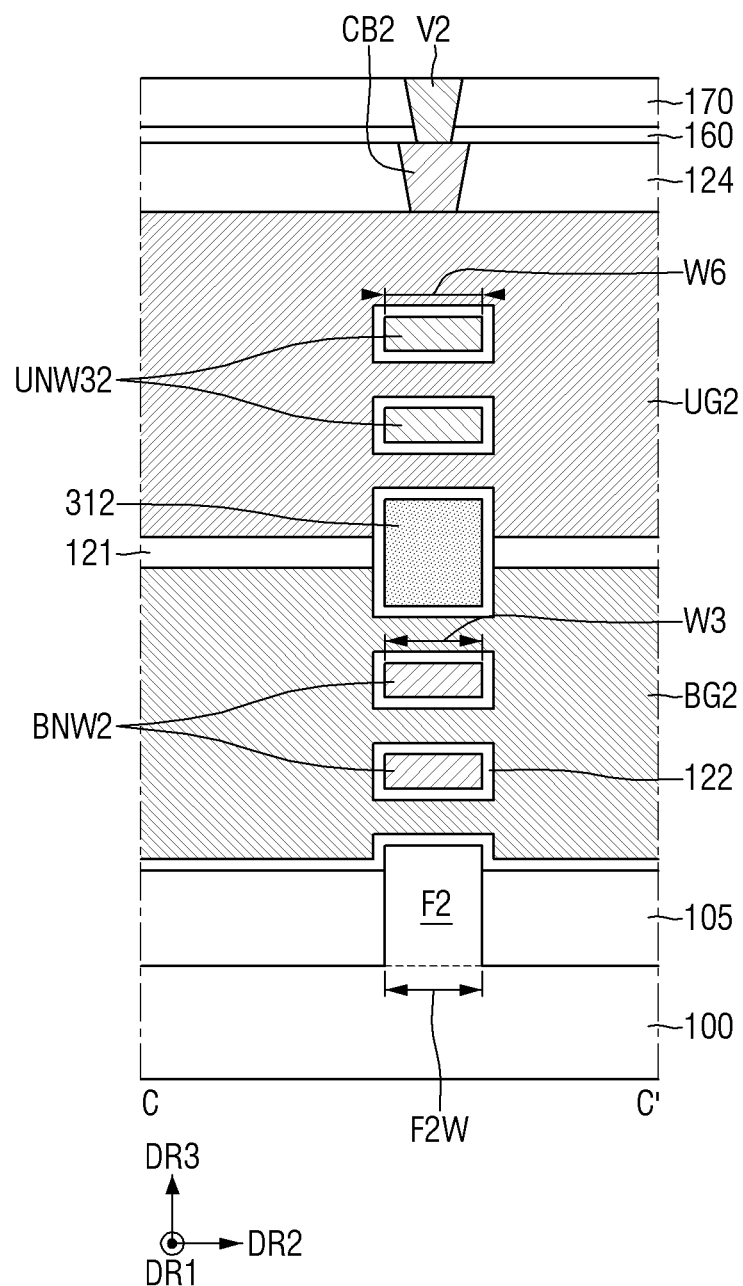

FIGS. 32 and 33 are views for describing a method of manufacturing a semiconductor device according to some other embodiments of the present disclosure.

Referring to FIGS. 32 and 33, in a semiconductor device according to some other embodiments of the present disclosure, a width W5 in the second horizontal direction DR2 of a first plurality of upper nanosheets UNW31 may be equal to a width W1 in the second horizontal direction DR2 of a first plurality of lower nanosheets BNW1. In addition, a width W6 in the second horizontal direction DR2 of a second plurality of upper nanosheets UNW32 may be equal to a width W3 in the second horizontal direction DR2 of a second plurality of lower nanosheets BNW2. The width W5 in the second horizontal direction DR2 of the first plurality of upper nanosheets UNW31 may be greater than a width W6 in the second horizontal direction DR2 of the second plurality of upper nanosheets UNW32.

A width in the second horizontal direction DR2 of a first separation layer 311 may be equal to each of the width W5 in the second horizontal direction DR2 of the first plurality of upper nanosheets UNW31 and a width W1 in the second horizontal direction DR2 of the first plurality of lower nanosheets BNW1. Also, a width in the second horizontal direction DR2 of a second separation layer 312 may be equal to each of the width W6 in the second horizontal direction DR2 of the second plurality of upper nanosheets UNW32 and a width W3 in the second horizontal direction DR2 of the second plurality of lower nanosheets BNW2.

For example, both sidewalls in the second horizontal direction DR2 of the first plurality of lower nanosheets BNW1, both sidewalls in the second horizontal direction DR2 of the first separation layer 311, and both sidewalls in the second horizontal direction of the first plurality of upper nanosheets UNW31 may be aligned in the vertical direction DR3. In addition, both sidewalls in the second horizontal direction DR2 of the second plurality of lower nanosheets BNW2, both sidewalls in the second horizontal direction DR2 of the second separation layer 312, and both sidewalls in the second horizontal direction DR2 of the second plurality of upper nanosheets UNW32 may be aligned in the vertical direction DR3.

A first sidewall in the second horizontal direction DR2 of each of the first plurality of upper nanosheets UNW31 and a first sidewall in the second horizontal direction DR2 of each of the second plurality of upper nanosheets UNW32 may be aligned in the first horizontal direction DR1. The second sidewall in the second horizontal direction DR2 of each of the first plurality of upper nanosheets UNW31 and the second sidewall in the second horizontal direction DR2 of each of the second plurality of upper nanosheets UNW32 may not be aligned in the first horizontal direction DR1.

A semiconductor device according to some other embodiments of the present disclosure will be described hereinafter with reference to FIGS. 34 and 35 A description will be given focusing on differences from the semiconductor device shown in FIGS. 1 to 4.

Figure 34:
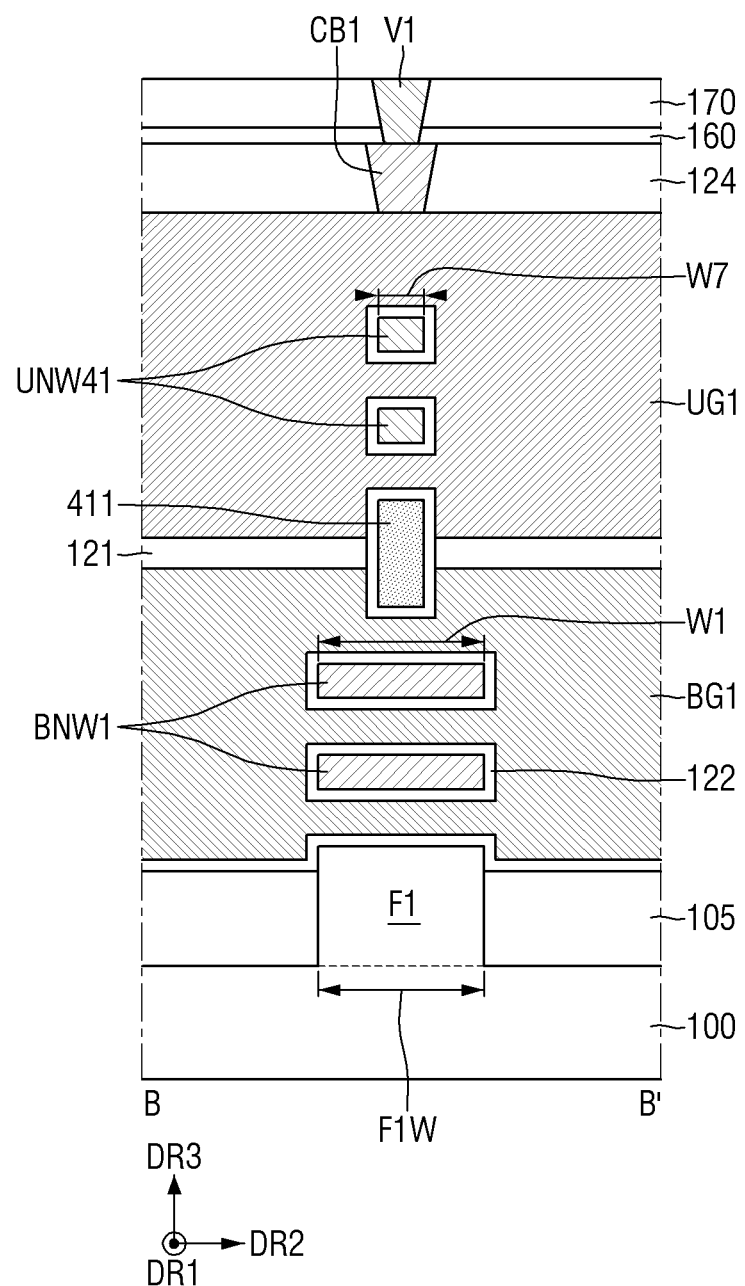
FIGS. 34 and 35 are cross-sectional views of a semiconductor device according to some other embodiments of the present disclosure.
Figure 35:
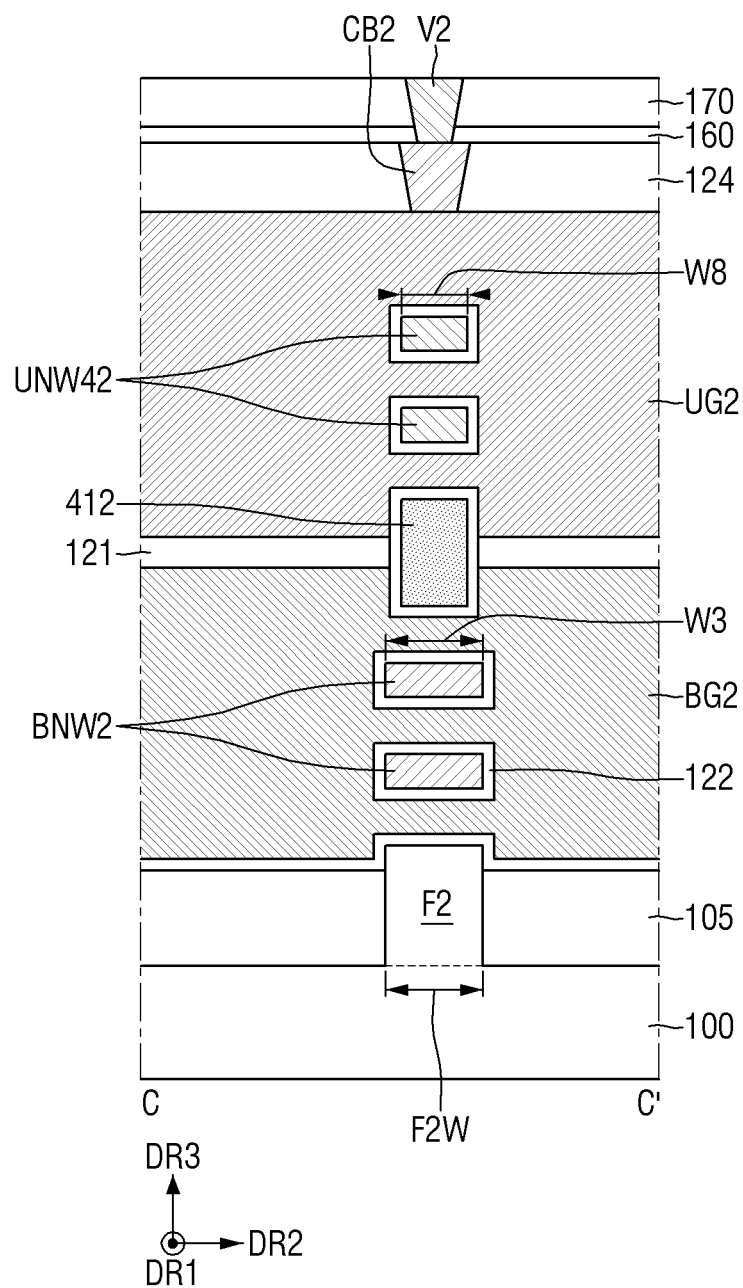

FIGS. 34 and 35 are cross-sectional views of a semiconductor device according to some other embodiments of the present disclosure.

Referring to FIGS. 34 and 35, in a semiconductor device according to some other embodiments of the present disclosure, a width W7 in the second horizontal direction DR2 of a first plurality of upper nanosheets UNW41 may be smaller than a width W8 in the second horizontal direction DR2 of a second plurality of upper nanosheets UNW42. In addition, the width W7 in the second horizontal direction DR2 of the first plurality of upper nanosheets UNW41 may be smaller than a width W1 in the second horizontal direction DR2 of a first plurality of lower nanosheets BNW1. The width W8 in the second horizontal direction DR2 of the second plurality of upper nanosheets UNW42 may be smaller than a width W3 in the second horizontal direction DR2 of the second plurality of lower nanosheets BNW2.

A width in the second horizontal direction DR2 of a first separation layer 411 may be equal to the width W7 in the second horizontal direction DR2 of the first plurality of upper nanosheets UNW41. Also, a width in the second horizontal direction of a second separation layer 412 may be equal to the width W8 in the second horizontal direction DR2 of the second plurality of upper nanosheets UNW42.

A semiconductor device according to some other embodiments of the present disclosure will be described hereinafter with reference to FIGS. 36 and 37. A description will be given focusing on differences from the semiconductor device shown in FIGS. 1 to 4.

Figure 36:
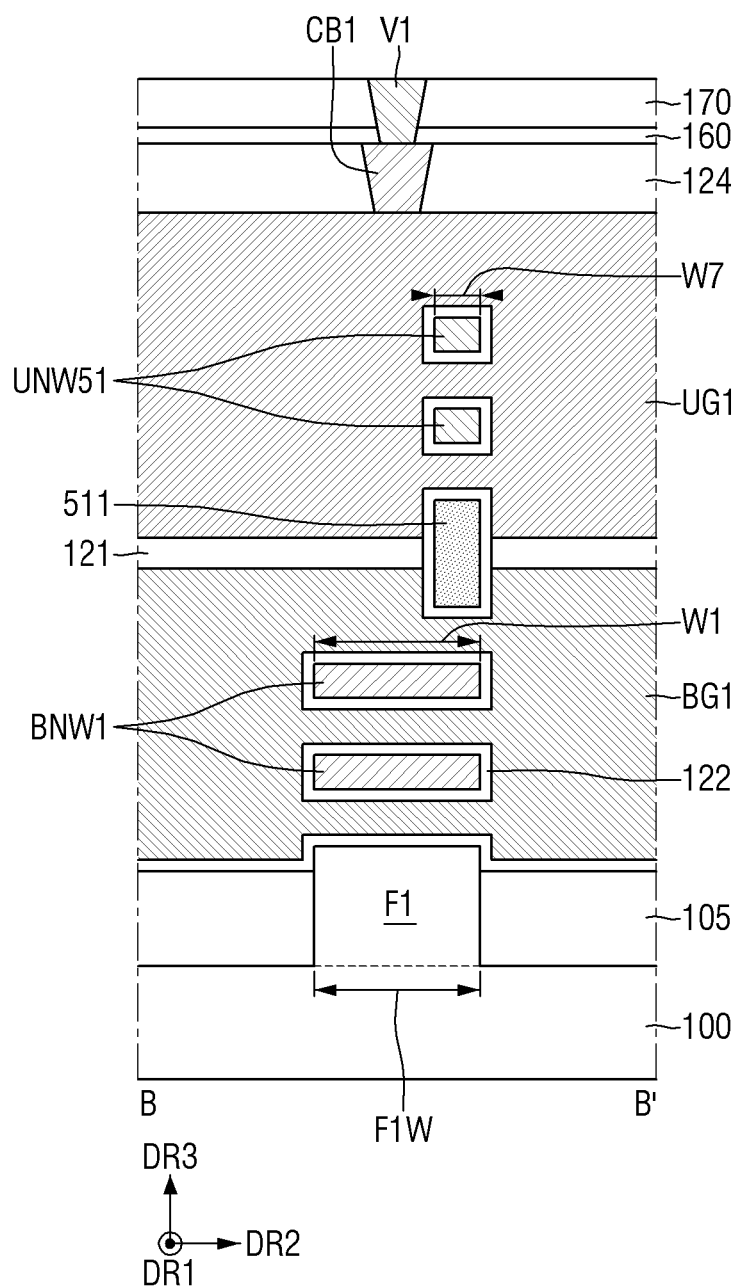
FIGS. 36 and 37 are cross-sectional views of a semiconductor device according to some other embodiments of the present disclosure.
Figure 37:
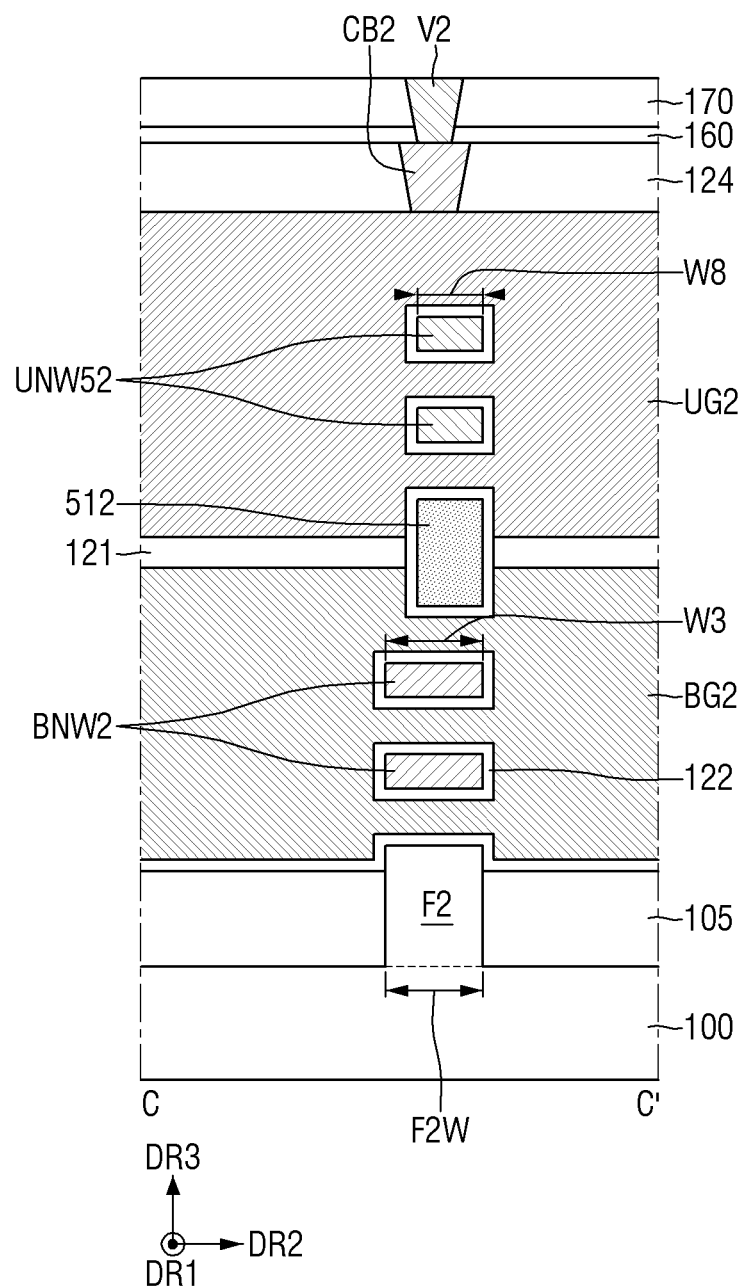

FIGS. 36 and 37 are cross-sectional views of a semiconductor device according to some other embodiments of the present disclosure.

Referring to FIGS. 36 and 37, in a semiconductor device according to some other embodiments of the present disclosure, a width W7 in the second horizontal direction DR2 of a first plurality of upper nanosheets UNW51 may be smaller than a width W8 in the second horizontal direction DR2 of a second plurality of upper nanosheets UNW52. In addition, the width W7 in the second horizontal direction DR2 of the first plurality of upper nanosheets UNW51 may be smaller than a width W1 in the second horizontal direction DR2 of a first plurality of lower nanosheets BNW1. The width W8 in the second horizontal direction DR2 of the second plurality of upper nanosheets UNW52 may be smaller than a width W3 in the second horizontal direction DR2 of the second plurality of lower nanosheets BNW2.

A width in the second horizontal direction DR2 of a first separation layer 511 may be equal to the width W7 in the second horizontal direction DR2 of the first plurality of upper nanosheets UNW51. Also, a width in the second horizontal direction of a second separation layer 512 may be equal to the width W8 in the second horizontal direction DR2 of the second plurality of upper nanosheets UNW52.

A first sidewall in the second horizontal direction DR2 of each of the first plurality of lower nanosheets BNW1, a first sidewall in the second horizontal direction DR2 of the first separation layer 511, and a first sidewall in the second horizontal direction DR2 of each of the first plurality of upper nanosheets UNW51 may be aligned in the vertical direction DR3. A first sidewall in the second horizontal direction DR2 of each of the second plurality of lower nanosheets BNW2, a first sidewall in the second horizontal direction DR2 of the second separation layer 512, and a first sidewall in the second horizontal direction DR2 of each of the second plurality of upper nanosheets UNW52 may be aligned in the vertical direction DR3.

A first sidewall in the second horizontal direction DR2 of each of the first plurality of upper nanosheets UNW51 and a first sidewall in the second horizontal direction DR2 of each of the second plurality of upper nanosheets UNW52 may be aligned in the first horizontal direction DR1. The second sidewall in the second horizontal direction DR2 of each of the first plurality of upper nanosheets UNW51 and the second sidewall in the second horizontal direction DR2 of each of the second plurality of upper nanosheets UNW52 may not be aligned in the first horizontal direction DR1.

A semiconductor device according to some other embodiments of the present disclosure will be described hereinafter with reference to FIGS. 38 to 40. A description will be given focusing on differences from the semiconductor device shown in FIGS. 1 to 4.

Figure 38:
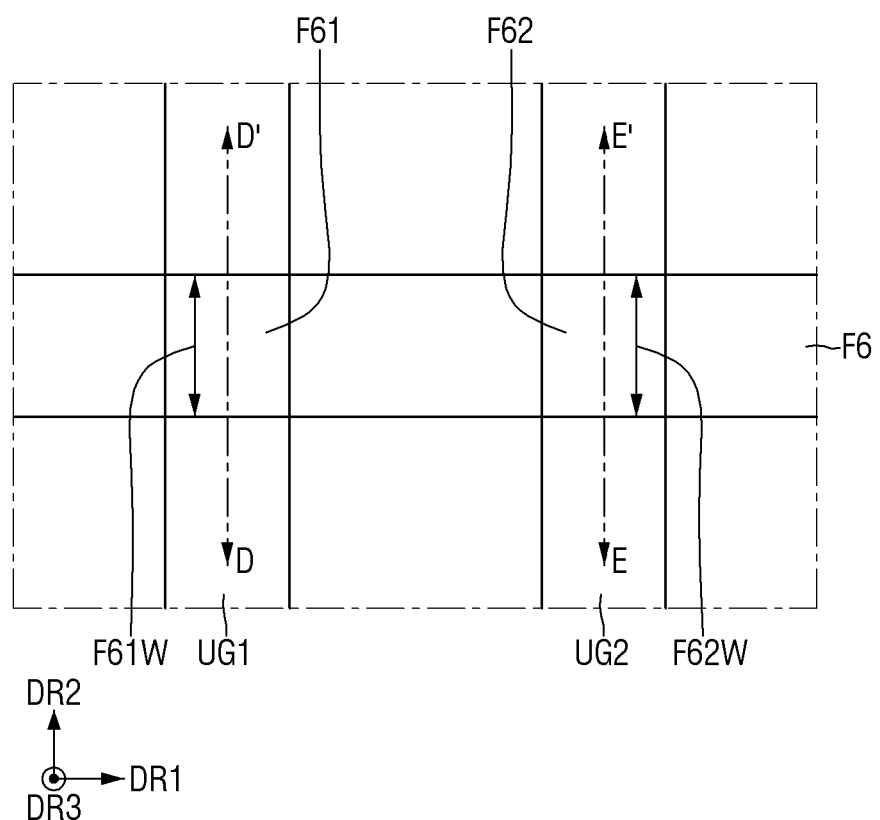
FIG. 38 is a layout view of a semiconductor device according to some other embodiments of the present disclosure.

FIG. 38 is a layout view of a semiconductor device according to some other embodiments of the present disclosure. FIGS. 39 and 40 are cross-sectional views of a semiconductor device according to some other embodiments of the present disclosure.

Figure 39:
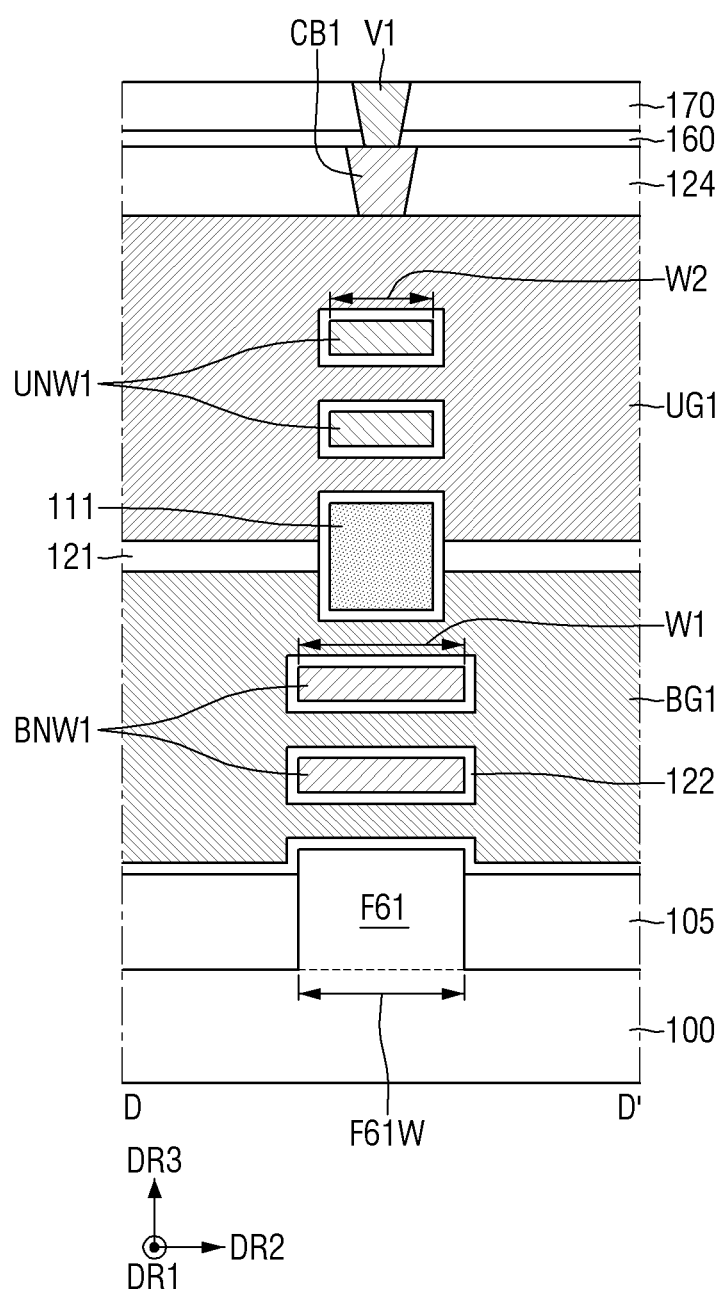
FIGS. 39 and 40 are cross-sectional views of a semiconductor device according to some other embodiments of the present disclosure.
Figure 40:
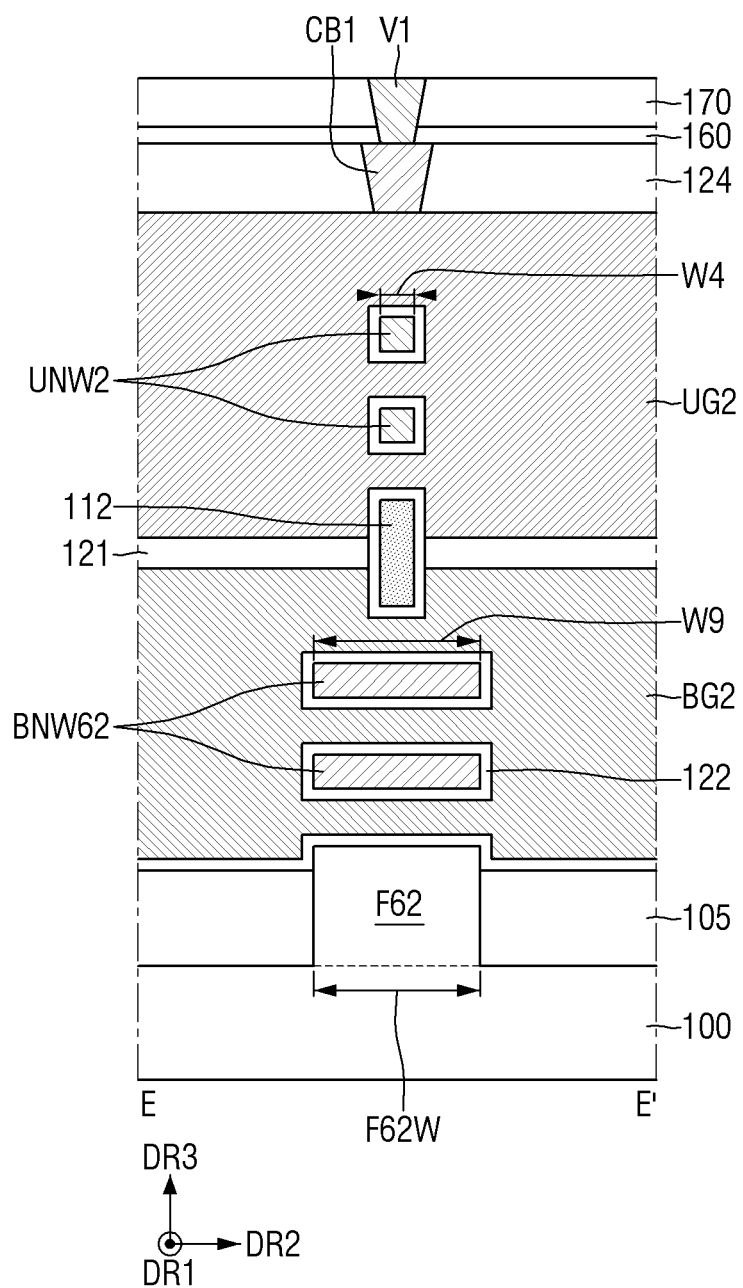

Referring to FIGS. 38 to 40, in a semiconductor device according to some other embodiments of the present disclosure, a width F61W in the second horizontal direction DR2 of a first portion F61 of an active pattern F6 may be equal to a width F62W in the second horizontal direction DR2 of a second portion F62 of the active pattern F6. Here, the first portion F61 of the active pattern F6 may be defined as a part of the active pattern F6 overlapping a first upper gate electrode UG1 in the vertical direction DR3. In addition, the second portion F62 of the active pattern F6 may be defined as another portion of the active pattern F6 overlapping a second upper gate electrode UG2 in the vertical direction DR3.

A width W1 in the second horizontal direction DR2 of a first plurality of lower nanosheets BNW1 may be equal to a width W9 in the second horizontal direction DR2 of a second plurality of lower nanosheets BNW62. A width W2 in the second horizontal direction DR2 of a first plurality of upper nanosheets UNW1 may be smaller than the width W1 in the second horizontal direction DR2 of the first plurality of lower nanosheets BNW1. A width W4 in the second horizontal direction DR2 of a second plurality of upper nanosheets UNW2 may be smaller than a width W9 in the second horizontal direction DR2 of the second plurality of lower nanosheets BNW62. The width W2 in the second horizontal direction DR2 of the first plurality of upper nanosheets UNW1 may be greater than a width W4 in the second horizontal direction DR2 of the second plurality of upper nanosheets UNW2.

A semiconductor device according to some other embodiments of the present disclosure will be described hereinafter with reference to FIGS. 38, 41, and 42. A description will be given focusing on differences from the semiconductor device shown in FIGS. 1 to 4.

Figure 41:
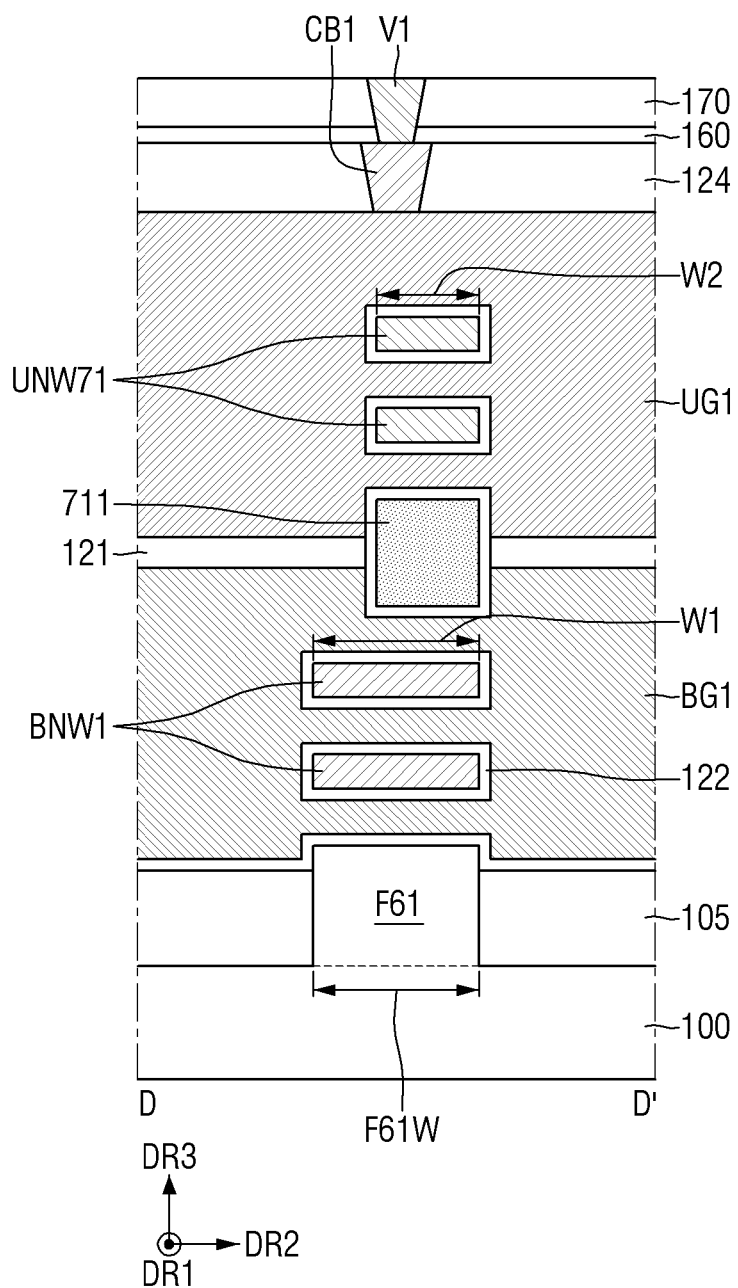
FIGS. 41 and 42 are cross-sectional views of a semiconductor device according to some other embodiments of the present disclosure.
Figure 42:
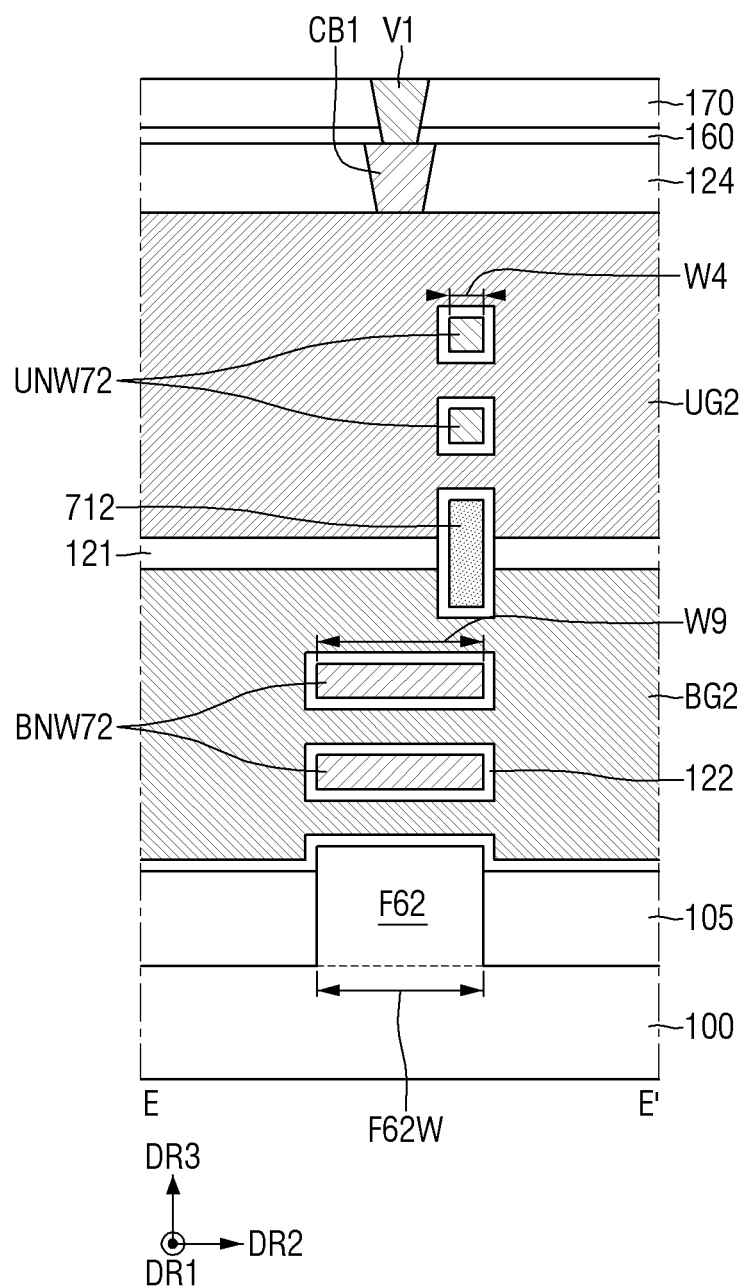

FIGS. 41 and 42 are cross-sectional views of a semiconductor device according to some other embodiments of the present disclosure.

Referring to FIGS. 38, 41, and 42, in a semiconductor device according to some other embodiments of the present disclosure, the width F61W in the second horizontal direction DR2 of the first portion F61 of the active pattern F6 may be equal to the width F62W in the second horizontal direction DR2 of the second portion F62 of the active pattern F6.

The width W1 in the second horizontal direction DR2 of a first plurality of lower nanosheets BNW1 may be equal to a width W9 in the second horizontal direction DR2 of a second plurality of lower nanosheets BNW72. A width W2 in the second horizontal direction DR2 of a first plurality of upper nanosheets UNW71 may be smaller than the width W1 in the second horizontal direction DR2 of the first plurality of lower nanosheets BNW1. A width W4 in the second horizontal direction DR2 of the second plurality of upper nanosheets UNW72 may be smaller than a width W9 in the second horizontal direction DR2 of the second plurality of lower nanosheets BNW72. The width W2 in the second horizontal direction DR2 of the first plurality of upper nanosheets UNW71 may be greater than the width W4 in the second horizontal direction DR2 of the second plurality of upper nanosheets UNW72.

A first sidewall in the second horizontal direction DR2 of each of the first plurality of lower nanosheets BNW1, a first sidewall in the second horizontal direction DR2 of a first separation layer 711, and a first sidewall in the second horizontal direction DR2 of each of the first plurality of upper nanosheets UNW71 may be aligned in the vertical direction DR3. Also, a first sidewall in the second horizontal direction DR2 of each of the second plurality of lower nanosheets BNW72, a first sidewall in the second horizontal direction DR2 of a second separation layer 712, and a first sidewall in the second horizontal direction DR2 of each of the second plurality of upper nanosheets UNW72 may be aligned in the vertical direction DR3.

A first sidewall in the second horizontal direction DR2 of each of the first plurality of upper nanosheets UNW71 and a first sidewall in the second horizontal direction DR2 of each of the second plurality of upper nanosheets UNW72 may be aligned in the first horizontal direction DR1. The second sidewall in the second horizontal direction DR2 of each of the first plurality of upper nanosheets UNW71 and the second sidewall in the second horizontal direction DR2 of each of the second plurality of upper nanosheets UNW72 may not be aligned in the first horizontal direction DR1.

A semiconductor device according to some other embodiments of the present disclosure will be described hereinafter with reference to FIGS. 38, 42, and 43. A description will be given focusing on differences from the semiconductor device shown in FIGS. 38, 41, and 42.

Figure 43:
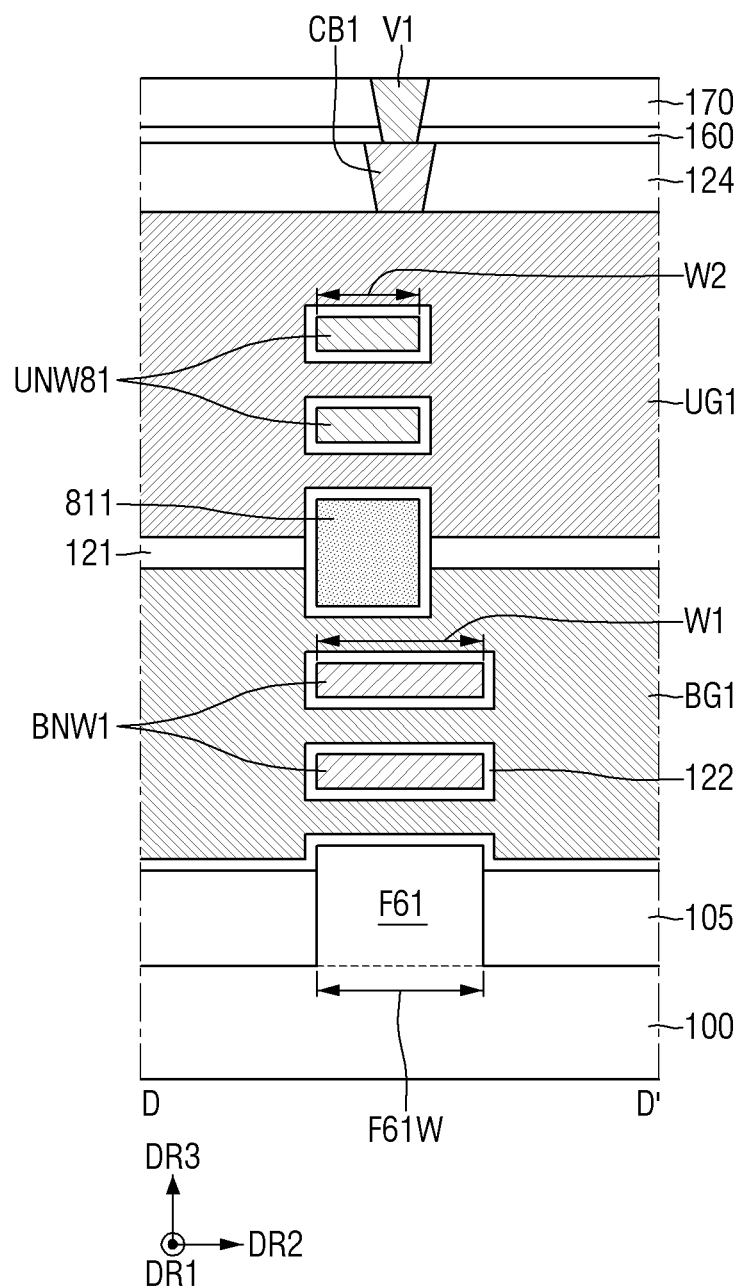
FIG. 43 is a cross-sectional view of a semiconductor device according to some other embodiments of the present disclosure.

FIG. 43 is a cross-sectional view of a semiconductor device according to some other embodiments of the present disclosure.

Referring to FIGS. 38, 42, and 43, in a semiconductor device according to some other embodiments of the present disclosure, a first sidewall in the second horizontal direction DR2 of the second portion F62 of the active pattern F6, a first sidewall in the second horizontal direction DR2 of each of the second plurality of lower nanosheets BNW72, a first sidewall in the second horizontal direction DR2 of the second separation layer 712, and a first sidewall in the second horizontal direction DR2 of each of the second plurality of upper nanosheets UNW72 may be aligned in the vertical direction DR3.

In addition, the second sidewall in the second horizontal direction DR2 of the first portion F61 of the active pattern F6, the second sidewall in the second horizontal direction DR2 of each of the first plurality of lower nanosheets BNW1, the second sidewall in the second horizontal direction DR2 of a first separation layer 811, and the second sidewall in the second horizontal direction DR2 of each of a first plurality of upper nanosheets UNW81 may be aligned in the vertical direction DR3. Here, the second sidewall of the active pattern F6 may be defined as a sidewall facing the first sidewall of the active pattern F6 in the second horizontal direction DR2.

A first sidewall in the second horizontal direction DR2 of each of the first plurality of upper nanosheets UNW81 and a first sidewall in the second horizontal direction DR2 of each of the second plurality of upper nanosheets UNW72 may not be aligned in the first horizontal direction DR1. The second sidewall in the second horizontal direction DR2 of each of the first plurality of upper nanosheets UNW81 and the second sidewall in the second horizontal direction DR2 of each of the second plurality of upper nanosheets UNW72 may not be aligned in the first horizontal direction DR1. For example, the first sidewall in the second horizontal direction DR2 of each of the first plurality of upper nanosheets UNW81 and the second sidewall in the second horizontal direction DR2 of each of the second plurality of upper nanosheets UNW72 may be aligned in the first horizontal direction DR1.

A semiconductor device according to some other embodiments of the present disclosure will be described hereinafter with reference to FIGS. 38, 42, and 44. A description will be given focusing on differences from the semiconductor device shown in FIGS. 38, 41, and 42.

Figure 44:
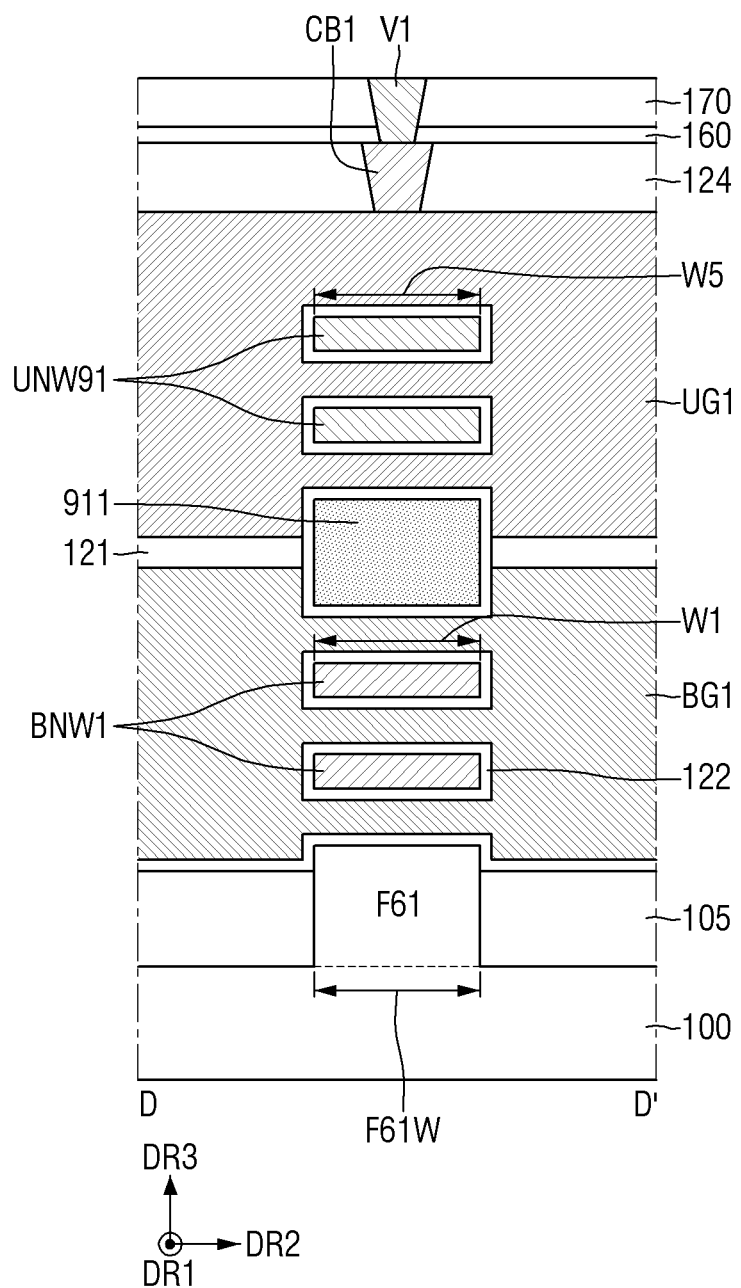
FIG. 44 is a cross-sectional view of a semiconductor device according to some other embodiments of the present disclosure.

FIG. 44 is a cross-sectional view of a semiconductor device according to some other embodiments of the present disclosure.

Referring to FIGS. 38, 42, and 44, in a semiconductor device according to some other embodiments of the present disclosure, a width W5 in the second horizontal direction DR2 of a first plurality of upper nanosheets UNW91 may be equal to the width W1 in the second horizontal direction DR2 of the first plurality of lower nanosheets BNW1.

A first sidewall in the second horizontal direction DR2 of the first portion F61 of the active pattern F6, a first sidewall in the second horizontal direction DR2 of each of the first plurality of lower nanosheets BNW1, a first sidewall in the second horizontal direction DR2 of a first separation layer 911, and a first sidewall in the second horizontal direction DR2 of each of a first plurality of upper nanosheets UNW91 may be aligned in the vertical direction DR3. The second sidewall in the second horizontal direction DR2 of the first portion F61 of the active pattern F6, the second sidewall in the second horizontal direction DR2 of each of the first plurality of lower nanosheets BNW1, the second sidewall in the second horizontal direction DR2 of the first separation layer 911, and the second sidewall in the second horizontal direction DR2 of each of the first plurality of upper nanosheets UNW91 may be aligned in the vertical direction DR3.

In addition, a first sidewall in the second horizontal direction DR2 of the second portion F62 of the active pattern F6, a first sidewall in the second horizontal direction DR2 of each of the second plurality of lower nanosheets BNW72, a first sidewall in the second horizontal direction DR2 of the second separation layer 712, and a first sidewall in the second horizontal direction DR2 of each of a second plurality of upper nanosheets UNW92 may be aligned in the vertical direction DR3.

A first sidewall in the second horizontal direction DR2 of each of the first plurality of upper nanosheets UNW91 and a first sidewall in the second horizontal direction DR2 of each of the second plurality of upper nanosheets UNW72 may be aligned in the first horizontal direction DR1. The second sidewall in the second horizontal direction DR2 of each of the first plurality of upper nanosheets UNW91 and the second sidewall in the second horizontal direction DR2 of each of the second plurality of upper nanosheets UNW72 may not be aligned in the first horizontal direction DR1.

For example, a central line which divides the first plurality of lower nanosheets BNW1 in the second horizontal direction DR2, a central line which divides the first separation layer 911 in the second horizontal direction DR2, and a central line which divides the first plurality of upper nanosheets UNW91 in the second horizontal direction DR2 may each be aligned in the vertical direction DR3. For example, a central line which divides the second plurality of lower nanosheets BNW72 in the second horizontal direction DR2 may not be aligned in the vertical direction DR3 with each of a central line which divides the second separation layer 712 in the second horizontal direction DR2 and a central line which divides the second plurality of upper nanosheets UNW72 in the second horizontal direction DR2.

A semiconductor device according to some other embodiments of the present disclosure will be described hereinafter with reference to FIGS. 1, 45, and 46. A description will be given focusing on differences from the semiconductor device shown in FIGS. 1 to 3.

Figure 45:
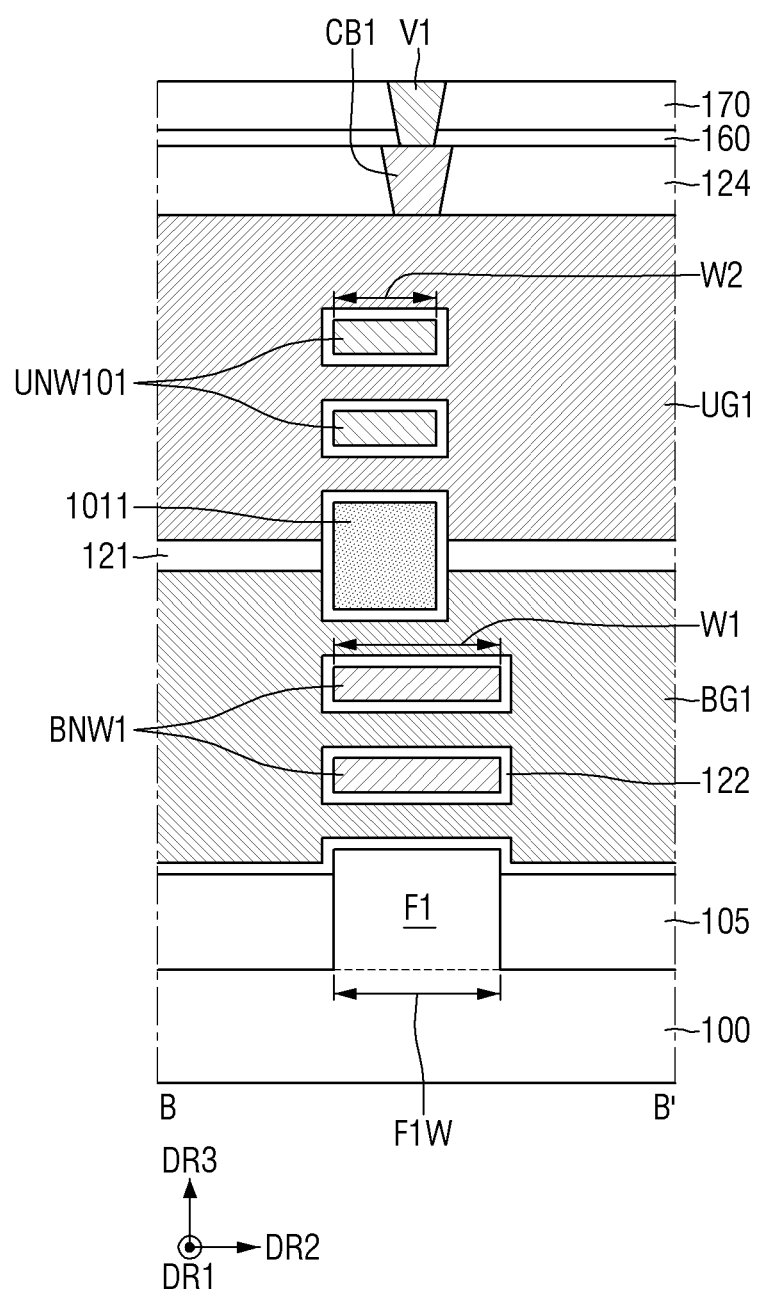
FIGS. 45 and 46 are cross-sectional views of a semiconductor device according to some other embodiments of the present disclosure.
Figure 46:
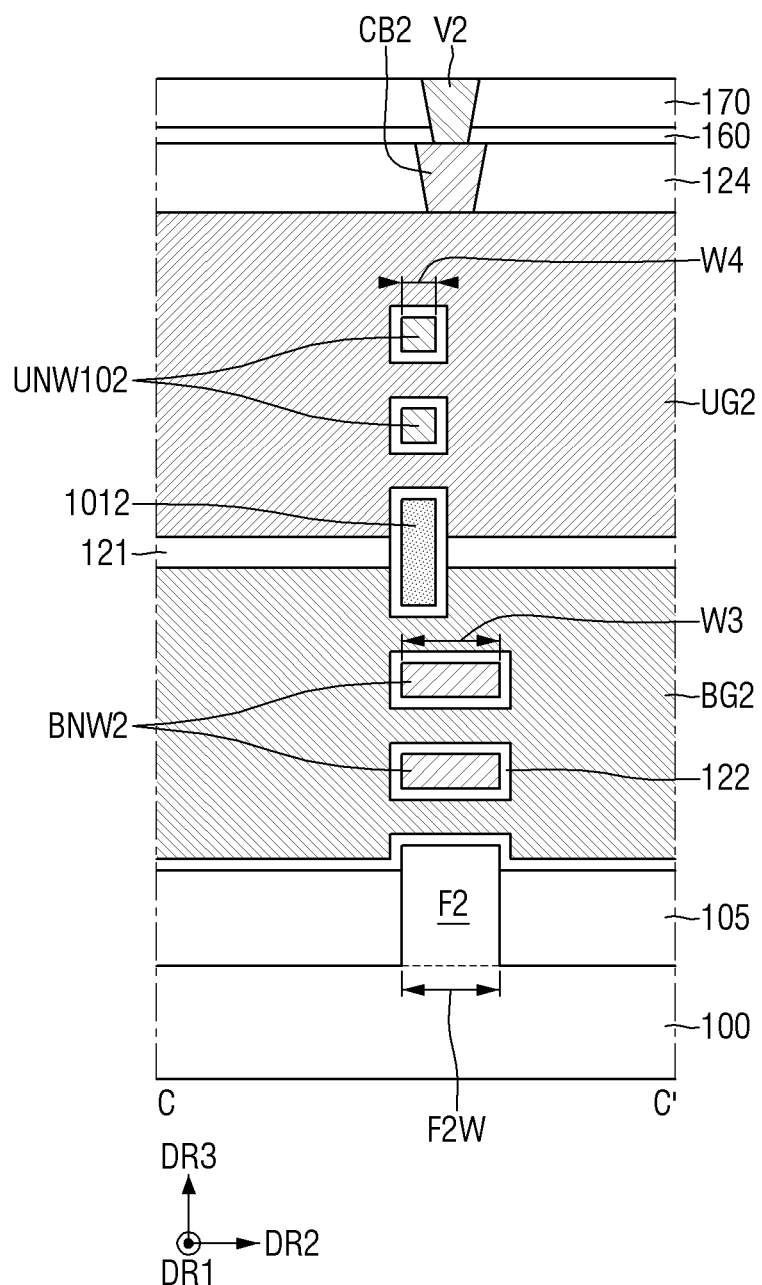

FIGS. 45 and 46 are cross-sectional views of a semiconductor device according to some other embodiments of the present disclosure.

Referring to FIGS. 1, 45, and 46, in a semiconductor device according to some other embodiments of the present disclosure, a second sidewall in the second horizontal direction DR2 of the first portion F1 of the active pattern F, a second sidewall in the second horizontal direction DR2 of each of the first plurality of lower nanosheets BNW1, a second sidewall in the second horizontal direction DR2 of a first separation layer 1011, and a second sidewall in the second horizontal direction DR2 of each of a first plurality of upper nanosheets UNW101 may be aligned in the vertical direction DR3.

In addition, a second sidewall in the second horizontal direction DR2 of the second portion F2 of the active pattern F, a second sidewall in the second horizontal direction DR2 of each of the second plurality of lower nanosheets BNW2, a second sidewall in the second horizontal direction DR2 of a second separation layer 1012, and a second sidewall in the second horizontal direction DR2 of each of a second plurality of upper nanosheets UNW102 may be aligned in the vertical direction DR3.

A first sidewall in the second horizontal direction DR2 of each of the first plurality of upper nanosheets UNW101 and a first sidewall in the second horizontal direction DR2 of each of the second plurality of upper nanosheets UNW102 may be aligned in the first horizontal direction DR1. The second sidewall in the second horizontal direction DR2 of each of the first plurality of upper nanosheets UNW101 and the second sidewall in the second horizontal direction DR2 of each of the second plurality of upper nanosheets UNW102 may not be aligned in the first horizontal direction DR1.

A semiconductor device according to some other embodiments of the present disclosure will be described hereinafter with reference to FIGS. 1, 45, and 47. A description will be given focusing on differences from the semiconductor device shown in FIGS. 1 to 3.

Figure 47:
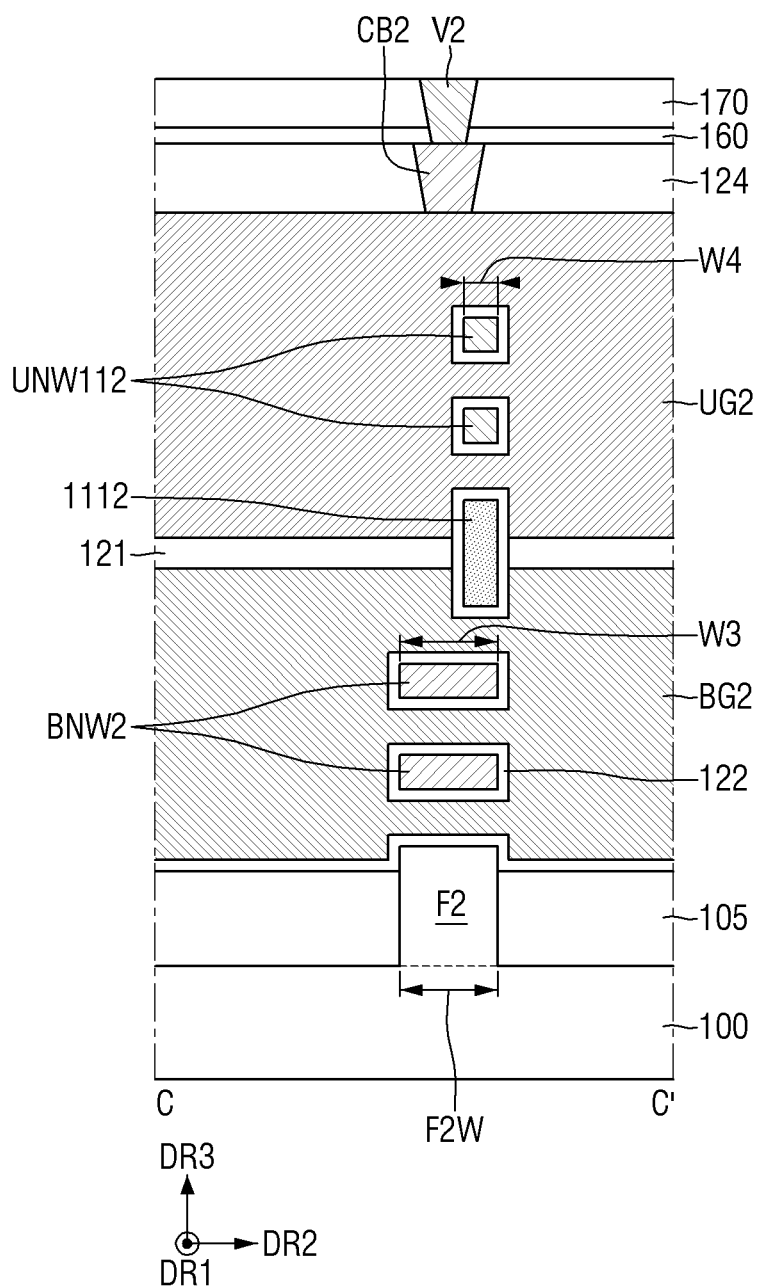
FIG. 47 is a cross-sectional view of a semiconductor device according to some other embodiments of the present disclosure.

FIG. 47 is a cross-sectional view of a semiconductor device according to some other embodiments of the present disclosure.

Referring to FIGS. 1, 45, and 47, in a semiconductor device according to some other embodiments of the present disclosure, a second sidewall in the second horizontal direction DR2 of the first portion F1 of the active pattern F, a second sidewall in the second horizontal direction DR2 of each of the first plurality of lower nanosheets BNW1, a second sidewall in the second horizontal direction DR2 of the first separation layer 1011, and a second sidewall in the second horizontal direction DR2 of each of the first plurality of upper nanosheets UNW101 may be aligned in the vertical direction DR3.

In addition, a first sidewall in the second horizontal direction DR2 of the second portion F2 of the active pattern F, a first sidewall in the second horizontal direction DR2 of each of the second plurality of lower nanosheets BNW2, a first sidewall in the second horizontal direction DR2 of a second separation layer 1112, and a first sidewall in the second horizontal direction DR2 of each of a second plurality of upper nanosheets UNW112 may be aligned in the vertical direction DR3. For example, a first sidewall in the second horizontal direction DR2 of each of the first plurality of upper nanosheets UNW101 and a second sidewall in the second horizontal direction DR2 of each of the second plurality of upper nanosheets UNW112 may be aligned in the first horizontal direction DR1.

While the present disclosure has been particularly shown and described with reference to example embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the present disclosure.

What is claimed:

1. A semiconductor device comprising:
   a substrate extending a first direction and a second direction perpendicular to the first direction;
   an active pattern extending in the first direction on the substrate, the active pattern protrudes from the substrate in a third direction perpendicular to the first direction and the second direction;
   a first plurality of lower nanosheets stacked apart from each other in the third direction on the active pattern;
   a second plurality of lower nanosheets stacked apart from each other in the third direction on the active pattern, the second plurality of lower nanosheets are spaced apart from the first plurality of lower nanosheets in the first direction;
   a first plurality of upper nanosheets stacked apart from each other in the third direction on the first plurality of lower nanosheets, the first plurality of upper nanosheets are spaced apart from the first plurality of lower nanosheets in the third direction;
   a second plurality of upper nanosheets stacked apart from each other in the third direction on the second plurality of lower nanosheets, the second plurality of upper nanosheets are spaced apart from the second plurality of lower nanosheets in the third direction;
   a first upper gate electrode extending in the second direction on the active pattern, the first upper gate electrode surrounds the first plurality of upper nanosheets; and
   a second upper gate electrode extending in the second direction on the active pattern, the second upper gate electrode is spaced apart from the first upper gate electrode in the first direction, the second upper gate electrode surrounds the second plurality of upper nanosheets,
   wherein a width in the second direction of the first plurality of upper nanosheets is different from a width in the second direction of the second plurality of upper nanosheets.

2. The semiconductor device of claim 1, further comprising:
   a first separation layer disposed between the first plurality of lower nanosheets and the first plurality of upper nanosheets; and
   a second separation layer disposed between the second plurality of lower nanosheets and the second plurality of upper nanosheets, the second separation layer is spaced apart from the first separation layer in the first direction,
   wherein a width in the second direction of the first separation layer is different from a width in the second direction of the second separation layer.

3. The semiconductor device of claim 1, further comprising:
   a first lower gate electrode disposed under the first upper gate electrode, the first lower gate electrode surrounds the first plurality of lower nanosheets;
   a second lower gate electrode disposed under the second upper gate electrode, the second lower gate electrode surrounds the second plurality of lower nanosheets; and
   a gate separation layer disposed between the first lower gate electrode and the first upper gate electrode and between the second lower gate electrode and the second upper gate electrode.

4. The semiconductor device of claim 1, wherein the active pattern comprises a first portion disposed under the first plurality of lower nanosheets and a second portion disposed under the second plurality of lower nanosheets, and
   a width in the second direction of the first portion of the active pattern is different from a width in the second direction of the second portion of the active pattern.

5. The semiconductor device of claim 4, wherein the active pattern further comprises a third portion connecting the first portion of the active pattern and the second portion of the active pattern, and
   a width in the second direction of the third portion of the active pattern becomes smaller toward the second portion of the active pattern.

6. The semiconductor device of claim 1, wherein a width in the second direction of the first plurality of lower nanosheets is greater than a width in the second direction of the second plurality of lower nanosheets.

7. The semiconductor device of claim 6, wherein the width in the second direction of the first plurality of upper nanosheets is greater than the width in the second direction of the second plurality of upper nanosheets.

8. The semiconductor device of claim 6, wherein the width in the second direction of the first plurality of upper nanosheets is smaller than the width in the second direction of the second plurality of upper nanosheets.

9. The semiconductor device of claim 1, wherein a width in the second direction of the first plurality of lower nanosheets is equal to a width in the second direction of the second plurality of lower nanosheets.

10. The semiconductor device of claim 1, wherein a width in the second direction of the first plurality of lower nanosheets is equal to the width in the second direction of the first plurality of upper nanosheets, and
 a width in the second direction of the second plurality of lower nanosheets is equal to the width in the second direction of the second plurality of upper nanosheets.

11. The semiconductor device of claim 1, wherein a first sidewall in the second direction of each of the first plurality of lower nanosheets are aligned in the third direction with a first sidewall in the second direction of each of the first plurality of upper nanosheets, and
 a first sidewall in the second direction of each of the second plurality of lower nanosheets are aligned in the third direction with a first sidewall in the second direction of each of the second plurality of upper nanosheets.

12. A semiconductor device comprising:
 a substrate extending a first direction and a second direction perpendicular to the first direction;
 an active pattern extending in the first direction on the substrate, the active pattern protrudes from the substrate in a third direction perpendicular to the first direction and the second direction;
 a first plurality of lower nanosheets stacked apart from each other in the third direction on the active pattern;
 a second plurality of lower nanosheets stacked apart from each other in the third direction on the active pattern, the second plurality of lower nanosheets are spaced apart from the first plurality of lower nanosheets in the first direction;
 a first plurality of upper nanosheets stacked apart from each other in the third direction on the first plurality of lower nanosheets, the first plurality of upper nanosheets are spaced apart from the first plurality of lower nanosheets in the third direction; and
 a second plurality of upper nanosheets stacked apart from each other in the third direction on the second plurality of lower nanosheets, the second plurality of upper nanosheets are spaced apart from the second plurality of lower nanosheets in the third direction,
 wherein a width of the first plurality of lower nanosheets in the second direction is different from a width in the second direction of the second plurality of lower nanosheets, and
 a width in the second direction of the first plurality of upper nanosheets is different from a width in the second direction of the second plurality of upper nanosheets.

13. The semiconductor device of claim 12, further comprising:
 a lower gate electrode extending in the second direction on the active pattern, the lower gate electrode surrounds the first plurality of lower nanosheets;
 an upper gate electrode extending in the second direction on the lower gate electrode, the upper gate electrode surrounds the first plurality of upper nanosheets; and
 a gate separation layer separating the lower gate electrode and the upper gate electrode from each other.

14. The semiconductor device of claim 12, wherein the active pattern comprises a first portion disposed under the first plurality of lower nanosheets and a second portion disposed under the second plurality of lower nanosheets, and
 a width in the second direction of the first portion of the active pattern is different from a width in the second direction of the second portion of the active pattern.

15. The semiconductor device of claim 12, wherein the width in the second direction of the first plurality of lower nanosheets is greater than the width in the second direction of the second plurality of lower nanosheets, and
 the width in the second direction of the first plurality of upper nanosheets is greater than the width in the second direction of the second plurality of upper nanosheets.

16. The semiconductor device of claim 12, wherein the width in the second direction of the first plurality of lower nanosheets is greater than the width in the second direction of the second plurality of lower nanosheets, and
 the width in the second direction of the first plurality of upper nanosheets is smaller than the width in the second direction of the second plurality of upper nanosheets.

17. The semiconductor device of claim 12, wherein a first sidewall in the second direction of each of the first plurality of lower nanosheets are aligned in the third direction with a first sidewall in the second direction of each of the first plurality of upper nanosheets, and
 a first sidewall in the second direction of each of the second plurality of lower nanosheets are aligned in the third direction with a first sidewall in the second direction of each of the second plurality of upper nanosheets.

18. A semiconductor device comprising:
 a substrate extending a first direction and a second direction perpendicular to the first direction;
 an active pattern extending in the first direction on the substrate, the active pattern protrudes from the substrate in a third direction perpendicular to the first direction and the second direction;
 a first plurality of lower nanosheets stacked apart from each other in the third direction on the active pattern;
 a second plurality of lower nanosheets stacked apart from each other in the third direction on the active pattern, the second plurality of lower nanosheets are spaced apart from the first plurality of lower nanosheets in the first direction;
 a first plurality of upper nanosheets stacked apart from each other in the third direction on the first plurality of lower nanosheets, the first plurality of upper nanosheets are spaced apart from the first plurality of lower nanosheets in the third direction; and
 a second plurality of upper nanosheets stacked apart from each other in the third direction on the second plurality of lower nanosheets, the second plurality of upper nanosheets are spaced apart from the second plurality of lower nanosheets in the third direction,
 wherein a width of the first plurality of upper nanosheets in the second direction different is different from a width in the second direction of the second plurality of upper nanosheets,
 a first sidewall in the second direction of each of the first plurality of lower nanosheets are aligned in the third direction with a first sidewall in the second direction of each of the first plurality of upper nanosheets, and
 a first sidewall in the second direction of each of the second plurality of lower nanosheets are aligned in the third direction with a first sidewall in the second direction of each of the second plurality of upper nanosheets.

19. The semiconductor device of claim 18, further comprising:
a first separation layer disposed between the first plurality of lower nanosheets and the first plurality of upper nanosheets; and
a second separation layer disposed between the second plurality of lower nanosheets and the second plurality of upper nanosheets, the second separation layer is spaced apart from the first separation layer in the first direction,
wherein a width in the second direction of the first separation layer is different from a width in the second direction of the second separation layer.

20. The semiconductor device of claim 18, wherein a width in the second direction of the first plurality of lower nanosheets is different from a width in the second direction of the second plurality of lower nanosheets.

* * * * *